US008947317B2

(12) United States Patent
Ueda et al.

(10) Patent No.: US 8,947,317 B2
(45) Date of Patent: Feb. 3, 2015

(54) MICROWAVE RESONATOR CONFIGURED BY COMPOSITE RIGHT/LEFT-HANDED META-MATERIAL AND ANTENNA APPARATUS PROVIDED WITH THE MICROWAVE RESONATOR

(75) Inventors: Tetsuya Ueda, Kyoto (JP); Gouki Haida, Kyoto (JP); Shintaro Yamamoto, Kyoto (JP)

(73) Assignee: National University Corporation Kyoto Institute of Technology, Kyoto (JP)

( * ) Notice: Subject to any disclaimer, the term of this patent is extended or adjusted under 35 U.S.C. 154(b) by 192 days.

(21) Appl. No.: 13/812,300

(22) PCT Filed: Jul. 28, 2011

(86) PCT No.: PCT/JP2011/067284
§ 371 (c)(1),
(2), (4) Date: Jan. 25, 2013

(87) PCT Pub. No.: WO2012/014984
PCT Pub. Date: Feb. 2, 2012

(65) Prior Publication Data
US 2013/0120217 A1 May 16, 2013

(30) Foreign Application Priority Data
Jul. 28, 2010 (JP) .................. 2010-168842

(51) Int. Cl.
*H01Q 1/50* (2006.01)
*H03H 7/01* (2006.01)
(Continued)

(52) U.S. Cl.
CPC ............ *H03H 7/0138* (2013.01); *H01P 1/203* (2013.01); *H01P 7/082* (2013.01); *H01Q 15/0086* (2013.01); *H03H 7/0115* (2013.01)
USPC .............................. 343/860; 343/731; 333/32

(58) Field of Classification Search
USPC .............. 343/731, 860; 333/26, 32, 219, 236; 455/339
See application file for complete search history.

(56) References Cited

U.S. PATENT DOCUMENTS 7,012,484 B2 * 3/2006 Chang et al. .................. 333/175
7,330,090 B2    2/2008 Itoh et al.
(Continued)

FOREIGN PATENT DOCUMENTS

JP   2006-222971    8/2006
JP   2007-235431    9/2007
(Continued)

OTHER PUBLICATIONS

International Preliminary Report on Patentability issued Mar. 7, 2013 in International (PCT) Application No. PCT/JP2011/067284.
(Continued)

*Primary Examiner* — Tan Ho
(74) *Attorney, Agent, or Firm* — Wenderoth, Lind & Ponack, LLP

(57) ABSTRACT

A reflective impedance element is connected to a port of a composite right/left-handed transmission line, and operates at a predetermined operating frequency so that an impedance when the reflective impedance element is seen from the port becomes a pure imaginary number jB. A reflective impedance component is connected to a port of the composite right/left-handed transmission line, and operates at the predetermined operating frequency so that an impedance when the reflective impedance element is seen from the port becomes −jB.

13 Claims, 45 Drawing Sheets

(51) Int. Cl.
*H01P 1/203* (2006.01)
*H01P 7/08* (2006.01)
*H01Q 15/00* (2006.01)

(56) References Cited

U.S. PATENT DOCUMENTS

| | | | |
|---|---|---|---|
| 7,391,288 | B1 | 6/2008 | Itoh et al. |
| 8,115,574 | B2 * | 2/2012 | Adkins .................. 333/207 |
| 8,487,713 | B2 * | 7/2013 | Fukuda et al. ................ 333/32 |
| 2006/0066422 | A1 | 3/2006 | Itoh et al. |
| 2006/0178114 | A1 | 8/2006 | Fischer |
| 2009/0295496 | A1 * | 12/2009 | Lee et al. ................. 333/26 |
| 2010/0060388 | A1 | 3/2010 | Ueda |
| 2011/0304521 | A1 * | 12/2011 | Ando et al. ................. 343/893 |
| 2013/0120217 | A1 * | 5/2013 | Ueda et al. ................. 343/860 |

FOREIGN PATENT DOCUMENTS

| | | |
|---|---|---|
| WO | 2008/111460 | 9/2008 |
| WO | 2011/024575 | 3/2011 |

OTHER PUBLICATIONS

International Search Report issued Nov. 1, 2011 in International (PCT) Application No. PCT/JP2011/067284.

Atsushi Sanada et al., "Novel Zeroth-Order Resonance in Composite Right/Left-Handed Transmission Line Resonators", in Proceedings of Asia-Pacific Microwave Conference 2003, pp. 1588-1591, Nov. 2003.

Anthony Lai et al., "Infinite Wavelength Resonant Antennas With Monopolar Radiation Pattern Based on Periodic Structures", IEEE Transactions on Antennas and Propagations, vol. 55, No. 3, pp. 868-876, Mar. 2007.

Jae-Gon Lee et al., "Zeroth Order Resonance Loop Antenna", IEEE Transactions on Antennas and Propagation, vol. 55, No. 3, pp. 994-997, Mar. 2007.

A. Rennings et al., "MIM CRLH Series Mode Zeroth Order Resonant Antenna (ZORA) implemented in LTCC Technology", in Proceedings of Asia-Pacific Microwave Conference 2007, pp. 191-194, Dec. 2007.

Christoph Caloz et al., "CRLH Meta-Material Leaky-Wave and Resonant Antennas", IEEE Antennas and Propagation Magazine, vol. 50, No. 5, pp. 25-39, Oct. 2008.

Tatsuhito Yoshida et al., "Radiation Characteristics of Zeroth-Order Resonators Composed of 2-D Dielectric-Based Composite Right/Left Handed Metamaterial Structures", in Proceedings of 39th European Microwave Conference 2009, pp. 205-208, Sep. 2009.

Anthony Lai et al., "A Novel N-Port Series Divider Using Infinite Wavelength Phenomena", Microwave Symposium Digest, 2005 IEEE MTT-S International, Jun. 2005.

* cited by examiner

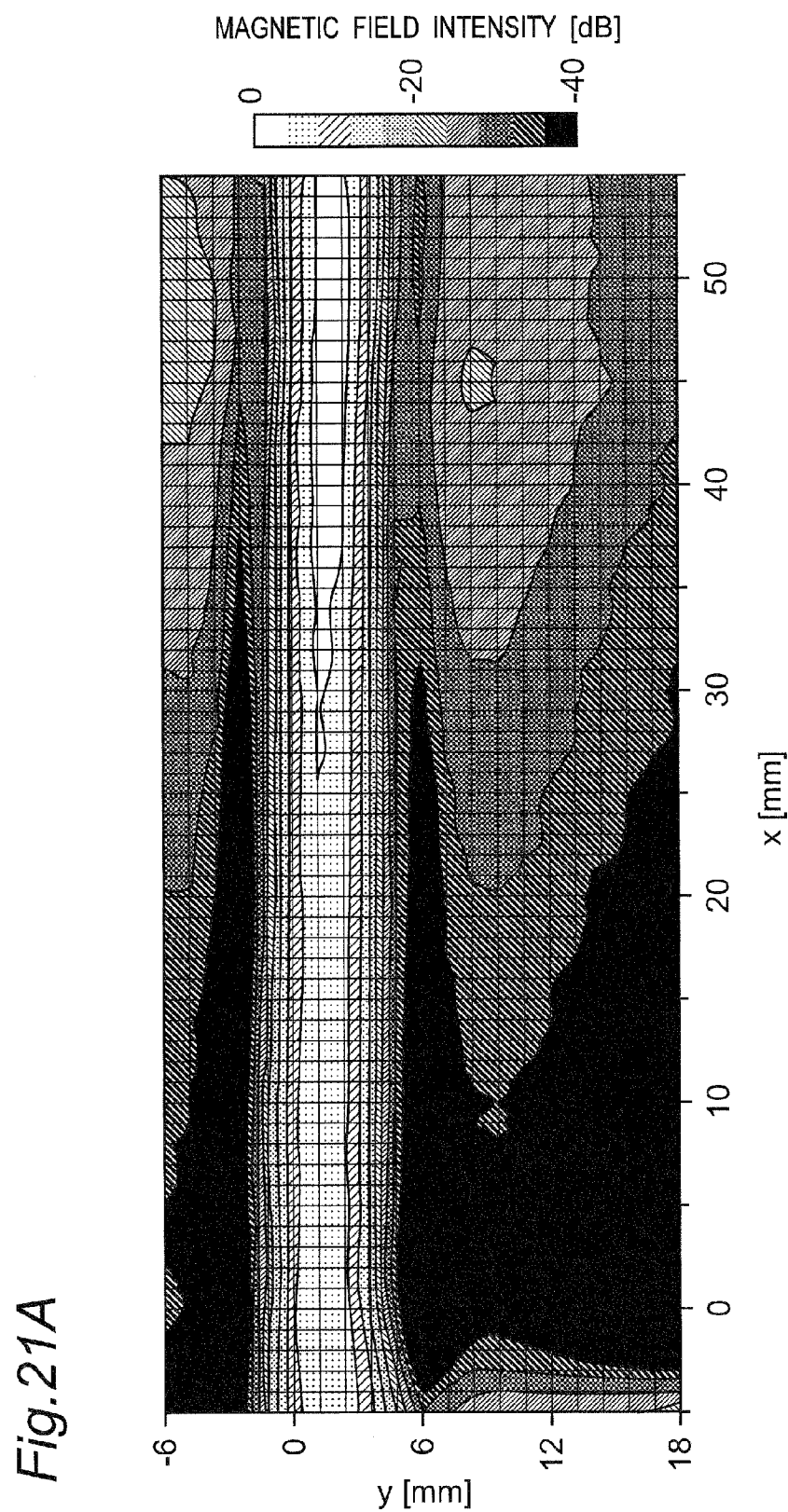

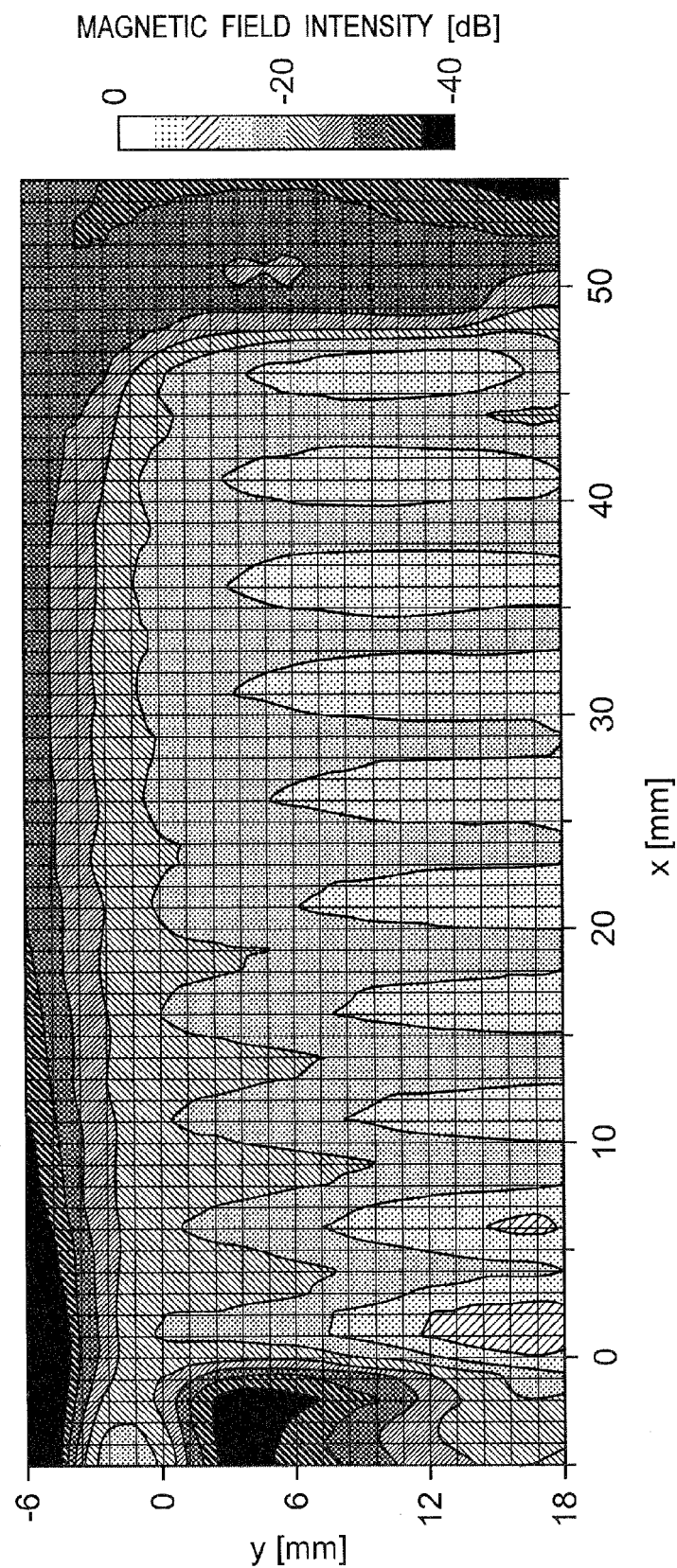

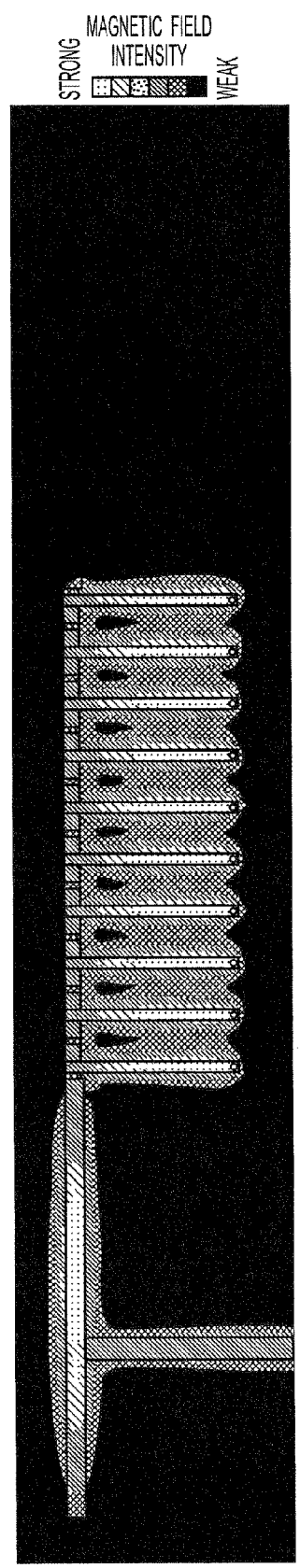

MICROWAVE RESONATOR CONFIGURED BY COMPOSITE RIGHT/LEFT-HANDED META-MATERIAL AND ANTENNA APPARATUS PROVIDED WITH THE MICROWAVE RESONATOR

TECHNICAL FIELD

The present invention relates to a meta-material (artificial structure apparatus) having a function to permit or inhibit the propagation of electromagnetic waves, and relates to a microwave resonator configured to include a composite right/left-handed meta-material whose effective permittivity assumes any one of positive, negative and zero values and whose effective permeability assumes any one of positive, negative and zero values on the other hand, an antenna apparatus with use of the microwave resonator, and a band-pass filter apparatus and a band-stop filter apparatus with use of the microwave resonator. It is noted in the present specification that the microwaves mean, for example, microwaves in the frequency bands of not lower than the UHF (Ultra High Frequency) band, millimeter waves, quasi-millimeter waves, and terahertz waves.

BACKGROUND ART

The meta-material is an artificial structure that behaves unlike materials in the natural world with respect to electromagnetic waves including light, and is sometimes referred to as a material having a negative refractive index.

Conventionally, a microwave resonator configured to include a composite right/left-handed meta-material using the meta-material has been proposed. In this case, the "right-handed system" indicates a propagation state of electromagnetic waves having such a directional relation that the electric field vector, the magnetic field vector, and the wave number vector of electromagnetic waves constitute a right-handed system, and indicates such a propagation state of forward waves that the direction of the transmission power of electromagnetic waves (direction of group velocity) and the direction of the phase plane (direction of phase velocity) are directed to the same direction. This state is possible in a medium and a structure body of which the effective permittivity and permeability both have positive values. In addition, the "left-handed system" indicates a propagation state of electromagnetic waves having such a directional relation that the electric field vector, the magnetic field vector, and the wave number vector of electromagnetic waves constitute a left-handed system, and indicates such a propagation state of backward waves that the direction of the transmission power of electromagnetic waves and the direction of the phase plane are directed to opposite directions to each other. This state is possible in a medium and a structure body of which the effective permittivity and permeability both have negative values.

There are proposed several methods for constituting meta-materials, and the two of a resonant type meta-material and a transmission line (non-resonant) type meta-material can be enumerated as representative examples. The former resonant type meta-material is configured to include a combination of magnetic and electric resonators that respond to the magnetic field and electric field components of external electromagnetic fields as represented by a combination of a split ring resonator and thin lines configured to include metal strips. In this structure, the effective permittivity or permeability exhibits an anti-resonance characteristic, and therefore, a loss exerts a very large influence in the vicinity of the resonance frequency. On the other hand, in the latter transmission line type meta-material, the structure body is configured by using the fact that the general propagation style of electromagnetic waves can be described by a transmission line model. The conventional one-dimensional right-handed meta-material structure that permits forward wave propagation has such a ladder type structure that an inductive element is inserted in its series branch and a capacitive element is inserted in its parallel branch (hereinafter also referred to as a shunt branch), in contrast to which the one-dimensional left-handed meta-material structure has such a structure that its capacitive element is inserted in the series branch and its inductive element is inserted in the parallel branch in order to make the effective permittivity and permeability values negative. Many of the transmission line type meta-materials, which do not exhibit the anti-resonance characteristics in the effective permittivity and permeability, therefore has such a feature that it has a loss lower than that of the aforementioned resonant type. Since the transmission line type meta-material operates as a right-handed meta-material, and a left-handed meta-material, a single negative meta-material in which either one of permittivity or permeability becomes negative and the other becomes positive, or a meta-material in which the effective permittivity or permeability is zero depending on the operating frequency band, it is called a composite right/left-handed meta-material.

In general, the effective permittivity and permeability of the composite right/left-handed meta-material assume a value of zero at different frequencies. In the above case, in a band between adjacent frequency at which the permittivity is zero and the frequency at which the permeability is zero, either one of permittivity and permeability assumes a negative value, and the other assumes a positive value. In this case, the propagation conditions of electromagnetic waves are not satisfied, and a forbidden band is formed. The meta-material operates as a left-handed meta-material since permittivity and permeability are both negative in a band on the lower side of this forbidden band or operates as a right-handed meta-material since they have positive values in a band on the upper side. When the frequencies at which the permittivity and permeability become zero coincide with each other, no forbidden band (band-gap) is formed, and the left-handed transmission band and the right-handed transmission band are continuously connected together. Such a meta-material is called the balanced composite right/left-handed meta-material, and the opposite type is called the unbalanced composite right/left-handed meta-material. In the balanced composite right/left-handed meta-material, not only the forbidden band is not generated but also the group velocity does not become zero even at a frequency at which the phase constant is zero, providing such a feature that transfer of power can be efficiently performed.

A first report concerning a zeroth-order resonator was provided in the Patent Documents 1 and 2 and the Non-Patent Document 1. This is configured by providing open or short-circuited ends at both the terminals of a composite right/left-handed transmission line of a finite length configured to include a plurality of unit cells. The resonator has such enumerable features that:

(i) the resonator resonates at a resonance frequency determined only by the structural parameters of the unit cells regardless of the line length; and (ii) the amplitude and the phase of the electromagnetic field distribution in the resonator become uniform at the time of resonance.

The resonance frequency of the zeroth-order resonator corresponds to a frequency at which the phase constant is zero (effective permittivity is zero or effective permeability is zero) in a dispersion diagram (relation between operating frequency and propagation constant (hereinafter, also referred to as a phase constant)) that provides the propagation characteristics of the composite right/left-handed transmission line.

Such a resonance condition that the resonance frequency is not related to the line length can be obtained in either case where both the terminals of the composite right/left-handed transmission line are open terminals or short-circuited terminals. When both the terminals are open terminals, resonance occurs at a frequency corresponding to zero effective permittivity of the line that constitutes the zeroth-order resonator. When both the terminals are short-circuited, resonance occurs at a frequency corresponding to zero effective permeability. Therefore, it has been the designing method of the conventional resonator that the operating frequency of the zeroth-order resonator is varied depending on when both the terminals are made to be open or short-circuited in the case where the unbalanced composite right/left-handed transmission line is used.

Since the amplitude and the phase become uniform in the electromagnetic field distribution inside the zeroth-order resonator, it is possible to constitute an antenna of a sharp directivity and a high gain by applying a composite right/left-handed transmission line configured to include a large number of unit cells to an antenna. In addition, several reports of applications of zeroth-order resonators to antenna elements have already been provided (See, for example, the Non-Patent Documents 2 and 3).

However, in the zeroth-order resonator configured by employing an unbalanced composite right/left-handed transmission line whose frequency at which the effective permittivity is zero and frequency at which the effective permeability is zero are varied, the group velocity also disadvantageously becomes zero by its nature at the frequency at which the phase constant is zero on the dispersion curve that represents the propagation characteristics of the line. Accordingly, there has been such a problem that, when the number of unit cells that constitute the resonator is increased (resonator is increased in size), no resonance operation can be obtained because the signal cannot be propagated along the resonator. In practice, many of the zeroth-order resonators with use of the unbalanced composite right/left-handed transmission line proposed up to now are configured to include a comparatively smaller number of unit cells, and they are not suitable for an increase in the size of the antenna. For the above reasons, it is required to constitute a line of which the group velocity is not zero even when the phase constant is zero, and it is required to employ a balanced composite right/left-handed transmission line.

There has already been such a report that attempts to design a directional antenna and improve the gain by employing the resonator as an antenna element with the zeroth-order resonator size increased (See, for example, the Non-Patent Documents 4, 5 and 6). According to the reports of the Non-Patent Documents 4 and 5, a one-dimensional zeroth-order resonator configured to include such a composite right/left-handed transmission line that capacitors are periodically inserted in the series branch of the micro-strip line and short-circuit stubs are periodically inserted as inductive elements in the parallel branch is adopted in each case. In addition, regarding improvements in the directivity and the radiation gain of the antenna having a large number of unit cells, only numerical calculation results have been reported. On the other hand, the Non-Patent Document 6 describes an application of a two-dimensional zeroth-order resonator configured to include a composite right/left-handed meta-material structure configured to include a combination of a dielectric resonator and parallel plate lines as a directional antenna element.

Further, a filter, a power distributor, an oscillator and so on can be enumerated as applications other than the antenna, and several report examples are provided (See, for example, the Non-Patent Document 7).

CITATION LIST

Patent Document

Patent Document 1: Specification of U.S. Pat. No. 7,391,288
Patent Document 2: Specification of U.S. Pat. No. 7,330,090

Non-Patent Document

Non-Patent Document 1: A. Sanada et al., "Novel zeroth-order resonance in composite right/left-handed transmission line resonators", in Proceedings of Asia-Pacific Microwave Conference 2003, pp. 1588-1591, November 2003.
Non-Patent Document 2: A. Lai et al., "Infinite wavelength resonant antennas with mono-polar radiation pattern based on periodic structures", IEEE Transactions on Antennas and Propagations, Vol. 55, No. 3, pp. 868-876, March 2007.
Non-Patent Document 3: J.-G. Lee et al., "Zeroth order resonance loop antenna", IEEE Transactions on Antennas and Propagation, Vol. 55, No. 3, pp. 994-997, March 2007.
Non-Patent Document 4: A. Rennings et al., "MIM CRLH series mode zeroth order resonant antenna (ZORA) implemented in LTCC technology", in Proceedings of Asia-Pacific Microwave Conference 2007, pp. 191-194, December 2007.
Non-Patent Document 5: C. Caloz et al., "CRLH meta-material leaky-wave and resonant antennas", IEEE Antennas and Propagation Magazine, Vol. 50, No. 5, pp. 25-39, October 2008.
Non-Patent Document 6: T. Yoshida et al., "Radiation characteristics of zeroth-order resonators composed of 2-D dielectric-based composite right/left handed meta-material structures", in Proceedings of 39th European Microwave Conference 2009, pp. 205-208, September 2009.
Non-Patent Document 7: A. Lai et al., "A novel N-port series divider using infinite wavelength phenomena", Microwave Symposium Digest, 2005 IEEE MTT-S International, June 2005.

SUMMARY OF INVENTION

Technical Problem

The prior art zeroth-order resonator corresponded to either one of series resonance in the series branch by short-circuiting both the terminals of a finite light transmission line that constitutes the zeroth-order resonator or parallel resonance in the parallel branch by opening both the terminals. Therefore, a zeroth-order resonator in a double resonance state in which the series resonance and the parallel resonance coexist has not yet been reported so far.

An object of the present invention is to solve the aforementioned problems and provide a microwave resonator capable of actualizing a zeroth-order resonator in a double resonance state in which the series resonance and the parallel resonance coexist, as well as an antenna apparatus, a band-pass filter apparatus and a band-stop filter apparatus with use of the microwave resonator.

Solution to Problem

According to the first aspect of the present invention, there is provided a microwave resonator including a microwave transmission line configured by cascade-connecting at least one unit cell between first and second ports. The unit cell includes a series branch circuit equivalently including a capacitive element, a parallel branch circuit equivalently including an inductive element, and at least one transmission line part. Each unit cell of the microwave transmission line has such a circuit configuration that the microwave transmission line has a predetermined phase constant in a dispersion curve that indicates a relation between an operating frequency of a microwave signal inputted to the microwave transmission line and a phase constant of the microwave transmission line. The microwave transmission line includes a first port and a second port. The microwave resonator includes first and second reflective impedance circuits. The first reflective impedance circuit is connected to the first port of the microwave transmission line, and is configured to operate so that an impedance when the first reflective impedance circuit is seen from the first port becomes a first impedance at a predetermined operating frequency. The second reflective impedance circuit is connected to the second port of the microwave transmission line, and is configured to operate so that an impedance when the second reflective impedance circuit is seen from the second port becomes a second impedance at the predetermined operating frequency. An imaginary part of the first impedance and an imaginary part of the second impedance have signs different from each other, and a magnitude of the imaginary part of the first impedance and a magnitude of the imaginary part of the second impedance are substantially equal to each other.

In the above-mentioned microwave resonator, the first impedance is a predetermined pure imaginary number, and the second impedance is a pure imaginary number conjugate with the first impedance.

In addition, in the microwave transmission line, the capacitive element is a microwave element whose effective permeability in an electromagnetic wave mode of propagation in the transmission line is negative, and the inductive element is a microwave element whose effective permittivity in the electromagnetic wave mode of propagation in the transmission line is negative.

Further, in the microwave transmission line, the microwave transmission line includes a dielectric substrate having a grounding conductor on its reverse face; a micro-strip line formed on the dielectric substrate; a plurality of capacitors configured to connect mutually adjacent line parts obtained by separating the micro-strip line into a plurality of the line parts; and a plurality of inductive stub conductors configured to connect the line parts to the grounding conductor.

According to the second aspect of the present invention, there is provided an antenna apparatus including the microwave resonator. The antenna apparatus further includes a feeding circuit connected to one of the first reflective impedance circuit and the second reflective impedance circuit, the feeding circuit configured to output a microwave signal received by the microwave resonator.

In the above-mentioned antenna apparatus, the first reflective impedance circuit includes first impedance changing means that changes the first impedance, and the second reflective impedance circuit includes second impedance changing means that changes the second impedance. The antenna apparatus further includes control means configured to control each of the first and second impedance changing means to change a polarization direction of the microwave signal received by the microwave resonator.

In addition, the antenna apparatus further includes received power detecting means configured to detect a received power of the microwave signal outputted from the feeding circuit. The control means changes the polarization direction of the microwave signal received by the microwave resonator so that the received power is maximized on the basis of the detected received power.

Further, in the antenna apparatus, the first and second impedances discretely change.

Still further, in the antenna apparatus, the first and second impedances continuously change.

Still further, in the antenna apparatus, each of the first and second reflective impedance circuits includes a varactor diode and an inductor.

In addition, in the antenna apparatus, each of the first and second reflective impedance circuits includes a phase shifter and a transmission line.

According to the third aspect of the present invention, there is provided a band-pass filter apparatus including the microwave resonator. The microwave transmission line is an unbalanced microwave transmission line. The first reflective impedance circuit includes first impedance changing means that changes the first impedance, and the second reflective impedance circuit includes second impedance changing means that changes the second impedance. The band-pass filter apparatus further includes control means configured to control each of the first and second impedance changing means to change a band-pass frequency of the band-pass filter apparatus.

According to the fourth aspect of the present invention, there is provided a band-stop filter apparatus including the microwave resonator. The microwave transmission line is an unbalanced microwave transmission line. The first reflective impedance circuit includes first impedance changing means that changes the first impedance, and the second reflective impedance circuit includes second impedance changing means that changes the second impedance. The band-stop filter apparatus further includes control means configured to control each of the first and second impedance changing means to change a band-stop frequency of the band-stop filter apparatus.

Advantageous Effects of Invention

According to the microwave resonator of the present invention, the first reflective impedance circuit that is connected to the first port of the microwave transmission line and operates in a manner that the impedance when the first reflective impedance circuit is seen from the first port becomes the first impedance at the predetermined operating frequency, and the second reflective impedance circuit that is connected to the second port of the microwave transmission line and operates in a manner that the impedance when the second reflective impedance circuit is seen from the second port becomes the second impedance at the operating frequency are provided. The imaginary part of the first impedance and imaginary part of the second impedance have signs different from each other, and the magnitude of the imaginary part of the first impedance and the magnitude of the imaginary part of the second impedance are substantially equal to each other. Therefore, the zeroth-order resonator in the double resonance state in which the series resonance and the parallel resonance coexist between the state in which only the series resonance of the series branch of the unit cells that constitute the microwave transmission line is dominant and the state in which only the parallel resonance of the parallel branch is dominant can be actualized.

In addition, according to the antenna apparatus of the present invention, the microwave resonator of the present invention and the feeding circuit that is connected to the first reflective impedance circuit or the second reflective impedance circuit, and outputs the microwave signal received by the microwave resonator are provided. Therefore, the polarization direction of the microwave signal to be received can be set in an arbitrary direction between the direction parallel to the series branch and the direction parallel to the parallel branch of the unit cells that constitute the microwave transmission line.

Further, according to an antenna apparatus of the present invention, the first reflective impedance circuit has the first impedance changing means that changes the first impedance, and the second reflective impedance circuit has the second impedance changing means that changes the second impedance. The antenna apparatus further includes the control means for controlling the first and second impedance changing means to change the polarization direction of the microwave signal received by the microwave resonator. Therefore, the polarization direction can be changed so that, for example, the received power of the received microwave signal becomes maximized.

Still further, the band-pass filter apparatus of the present invention includes the microwave resonator of the present invention. The first reflective impedance circuit has the first impedance changing means that changes the first impedance, and the second reflective impedance circuit has the second impedance changing means that changes the second impedance. The band-pass filter apparatus further includes the control means for controlling the first and second impedance changing means to change the band-pass frequency of the band-pass filter apparatus. Therefore, the band-pass filter apparatus having an arbitrary band-pass filter frequency between the series resonance frequency and the parallel resonance frequency can be actualized.

In addition, the band-stop filter apparatus of the present invention has the microwave resonator of the present invention. The first reflective impedance circuit has the first impedance changing means that changes the first impedance, and the second reflective impedance circuit has the second impedance changing means that changes the second impedance. The band-stop filter apparatus further includes the control means for controlling the first and second impedance changing means to change the band-stop frequency of the band-stop filter apparatus. Therefore, the band-stop filter apparatus having an arbitrary band-stop filter frequency between the series resonance frequency and the parallel resonance frequency can be actualized.

BRIEF DESCRIPTION OF DRAWINGS

FIG. 21A is a plan view showing a near magnetic field intensity distribution (experimental measurement value) of the zeroth-order resonator of FIG. 11 when the reactance B of the reflective impedance element 151R is set to zero with use of the reciprocal balanced composite right/left-handed transmission line 100;

FIG. 21C is a plan view showing a near magnetic field intensity distribution (experimental measurement value) of the zeroth-order resonator of FIG. 11 when the reactance B of the reflective impedance element 151R is set to +∞ with use of the reciprocal balanced composite right/left-handed transmission line 100;

FIG. 26C is a plan view showing a magnetic field intensity distribution (simulation calculation value) of the zeroth-order resonator of FIG. 11 when the reactance B of the reflective impedance element 151R is set to +∞ with use of the reciprocal unbalanced composite right/left-handed transmission line 100;

DESCRIPTION OF EMBODIMENTS

Figure 1:
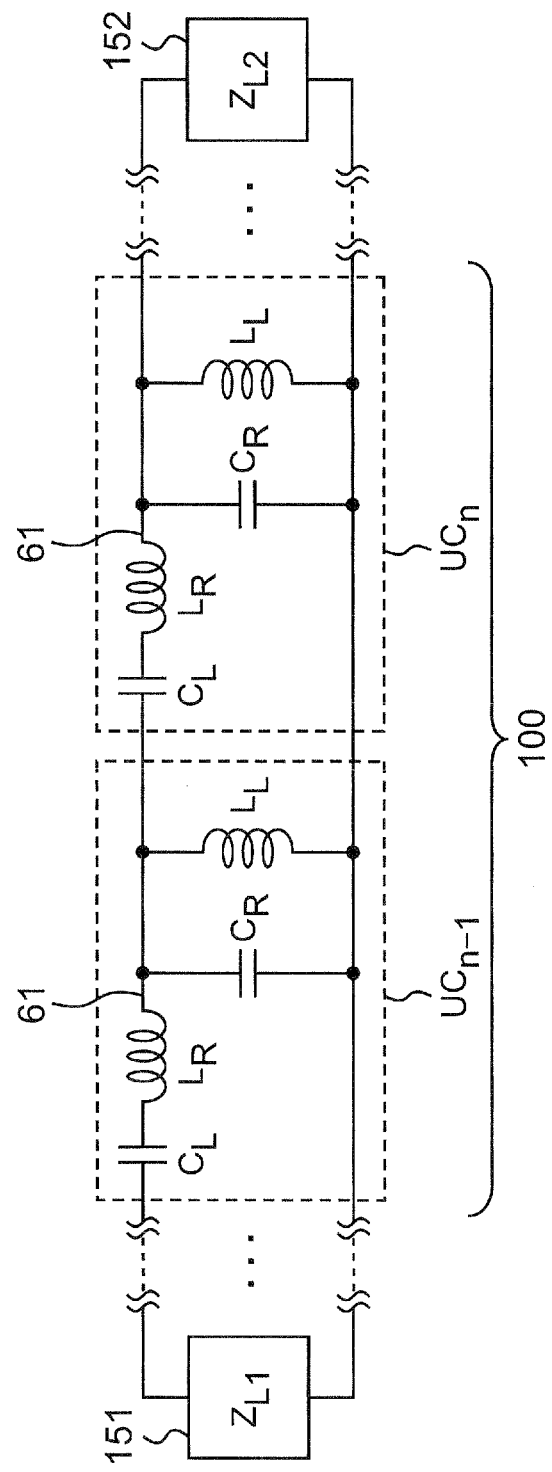
FIG. 1 is a circuit diagram showing an equivalent circuit model of a prior art transmission line type microwave resonator with use of a basic composite right/left-handed transmission line 100.

Preferred embodiments of the present invention will be described hereinafter with reference to the drawings. In the preferred embodiments, components similar to each other are denoted by the same reference numerals.

In addition, in the present specification, mathematical numbers inserted between square brackets in which mathematical expressions are inputted in image form, and mathematical expression numbers inserted between round brackets in which mathematical expressions are inputted in symbolic form are used in mixture. In addition, it is defined that mathematical expression numbers are used given to the tail parts of seriated mathematical expressions in the form of "Expression (1)" (there are some mathematical expressions to which no mathematical expression numbers are attached) in the present specification.

1. Basic Configuration of Composite Right/Left-Handed Transmission Line 100

Figure 2:
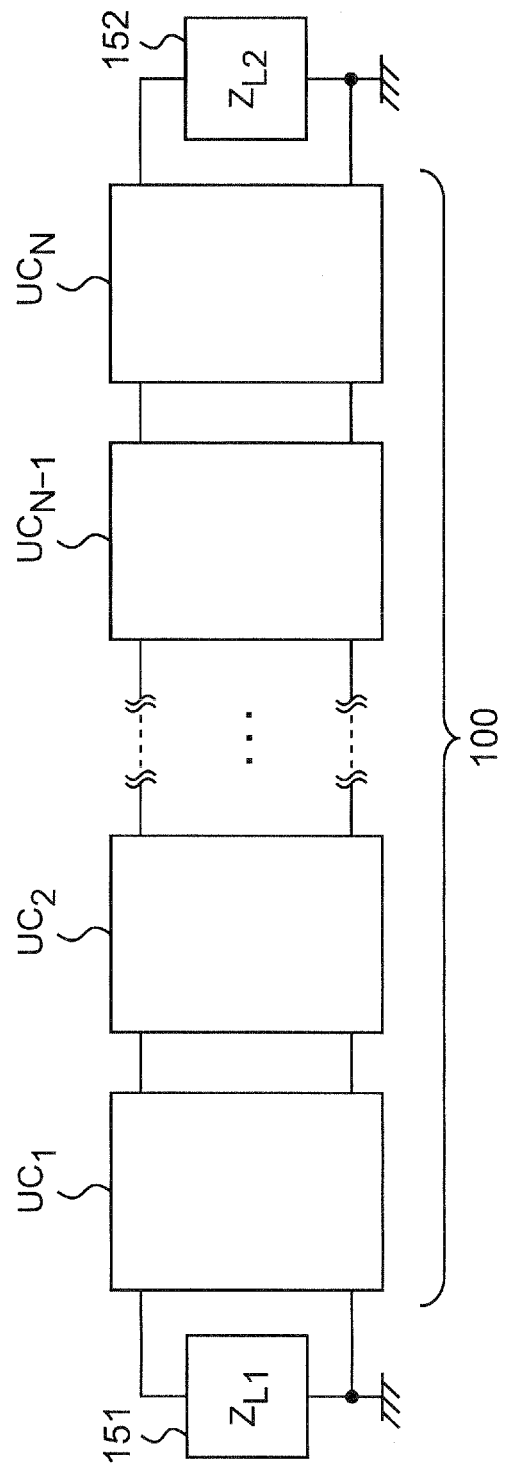
FIG. 2 is a circuit diagram showing an equivalent circuit model of a prior art transmission line type microwave resonator, in which a unit cell $UC_n$ (n=1, 2, . . . , N) is indicated simplified.

The basic configuration of the composite right/left-handed transmission line 100 employed in a transmission line type microwave resonator according to an embodiment of the present invention is first described with reference to FIGS. 1 to 6. FIG. 1 is a circuit diagram showing an equivalent circuit model of the prior art transmission line type microwave resonator with use of a basic composite right/left-handed transmission line 100, and FIG. 2 is a circuit diagram showing an equivalent circuit model of the prior art transmission line type microwave resonator, in which the unit cell $UC_n$ (n= 1, 2, . . . , N) is indicated simplified. The transmission line type microwave resonator of FIG. 1 is configured to include a composite right/left-handed transmission line 100 having a finite length, and terminal loads 151 and 152 connected to the respective terminals of the composite right/left-handed transmission line 100 so as to reflect a transmission signal. Further, the configuration of the composite right/left-handed transmission line 100 is such a ladder type transmission line structure that a plurality N of unit cells $UC_1, UC_2, . . . , UC_n$, each of which has a size sufficiently smaller than the wavelength of the transmission signal, are cascade-connected. In this case, the unit cell $UC_n$ is a minute component of two-terminal pair network as shown in FIGS. 1 and 2.

Further, as shown in FIG. 1, the unit cell $UC_n$ has such a configuration that a series resonator circuit having a capacitive element having a capacitance $C_L$ and an inductive element having an inductance $L_R$ is equivalently inserted in the series branch of a transmission line part 61 that constitutes the composite right/left-handed transmission line 100, and a parallel resonator circuit that has a capacitive element having a capacitance $C_R$ and an inductive element having an inductance $L_L$ is equivalently inserted in the parallel branch. In this case, the inductive element having the inductance $L_R$ and the capacitive element having the capacitance $C_R$ correspond to the inductive element of the series branch and the capacitive element of the parallel branch, respectively, which are innately owned by or inserted in the right-handed transmission line. On the other hand, the capacitive element having the capacitance $C_L$ corresponds to the capacitive element (microwave element) inserted in the series branch so that the effective permeability of an electromagnetic wave mode of propagation in the composite right/left-handed transmission line 100 becomes negative, and the inductive element having the inductance $L_L$ corresponds to the inductive element (microwave element) inserted in the parallel branch so that the effective permittivity of the electromagnetic wave mode of propagation in the composite right/left-handed transmission line 100 becomes negative.

It is noted that the objective circuits or apparatuses as the aforementioned ladder type transmission line structure include not only printed circuit boards, waveguides and dielectric lines, such as strip lines, micro-strip lines, slot lines, coplanar lines, and parallel plate lines, which are used for microwaves, millimeter waves, quasi-millimeter waves and terahertz waves but also all of the structures that support waveguide modes or decay modes including plasmon, polariton, magnon and the like, or combinations of them, and free spaces describable as equivalent circuits.

In addition, the capacitive element having the capacitance $C_L$ may not be only capacitors often used in electric circuits, distributed constant type capacitive elements used in microwave and millimeter-wave circuits and the like but also circuits or circuit elements such that the effective permeability of the electromagnetic wave mode of propagation in the transmission line has a negative value in equivalence. As concrete examples indicating the negative effective permeability, all of microwave circuits that operate in a guided wave mode or a decay mode having the negative effective permeability, such as a split ring resonator made of metal, a spatial arrangement that includes at least one magnetic resonator of a spiral structure, a spatial arrangement of a dielectric resonator in a magnetic resonance state or an edge mode of propagation along a ferrite substrate micro-strip line, can be employed since they are described as lines in which the circuit of the series branch operates dominantly as a capacitive element. Further, the capacitive element having the capacitance $C_L$ may be a series connection or a parallel connection of a capacitive element and an inductive element or a combination of them other than those mentioned above. The elements or circuit of the part to be inserted may exhibit a capacitive property as a whole.

Further, as the inductive element having the inductance $L_L$, not only lumped constant type elements such as coils used in electric circuits, distributed constant type inductive elements such as short-circuit stubs used in the microwave and millimeter-wave circuits and the like but also circuits or elements such that the effective permittivity of the electromagnetic wave mode of propagation in the transmission line has a negative value can be employed. In concrete, all of the microwave circuits that operate in the guided wave mode or the decay mode having a negative effective permittivity, such as a spatial arrangement that includes at least one electric resonator of a metal thin wire and a metal sphere or a spatial arrangement of a dielectric resonator in an electric resonance state unlimited to metals or waveguides and parallel plate lines in which the TE mode is in the blocking region, can be employed since they are described as transmission lines in which the parallel branch dominantly operates as an inductive element as an equivalent circuit. In addition, the inductive element having the inductance $L_L$ may be a series connection or a parallel connection of a capacitive element and an inductive element or a combination of them other than those mentioned above. A circuit or elements may be adopted in which the part to be inserted exhibits an inductive property as a whole.

Figure 3:
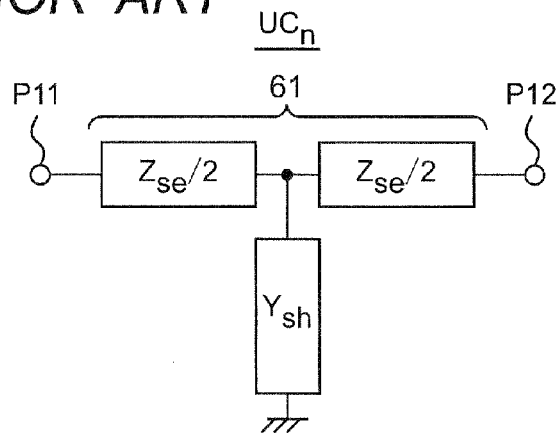
FIG. 3 is a circuit diagram showing one example of the unit cell $UC_n$ of FIG. 1 having a symmetrical T-type structure.
Figure 4:
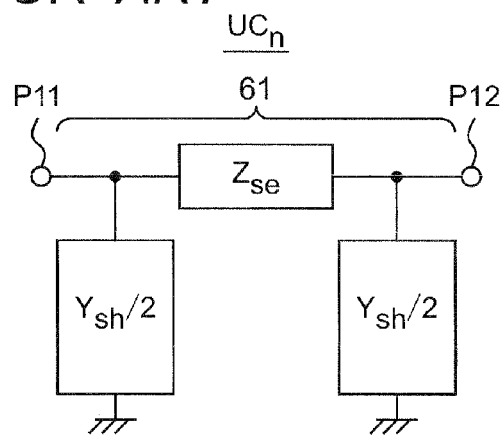
FIG. 4 is a circuit diagram showing one example of the unit cell $UC_n$ of FIG. 1 having a symmetrical π structure.

FIG. 3 is a circuit diagram showing one example of the unit cell $UC_n$ of FIG. 1 having a symmetrical T-type structure, and FIG. 4 is circuit diagram showing one example of the unit cell $UC_n$ of FIG. 1 having a symmetrical π structure. Referring to FIGS. 3 and 4, the parameter $Z_{se}$ represents the impedance of the series branch of the transmission line part 61, and the parameter $Y_{sh}$ represents the admittance of the parallel branch. The parameters are expressed by the following expressions, respectively:

$$Z_{se} = j\omega L_R + \frac{1}{j\omega C_L} = j\omega L_R \left\{1 - \left(\frac{\omega_{se}}{\omega}\right)^2\right\}$$ [Mathematical Number 1]

-continued $$Y_{sh} = j\omega C_R + \frac{1}{j\omega L_L} = j\omega C_R \left\{1 - \left(\frac{\omega_{sh}}{\omega}\right)^2\right\}$$ [Mathematical Number 2]

where, $\omega_{se}$ is the series resonance angular frequency of the series branch, and expressed by the following expression:

[Mathematical Number 3]

$$\omega_{se} = 1/\sqrt{L_R C_L} \quad (1a)$$

In addition, $\omega_{sh}$ is the parallel resonance angular frequency of the parallel branch, and expressed by the following expression:

[Mathematical Number 4]

$$\omega_{sh} = 1/\sqrt{L_L C_R} \quad (1b)$$

It is assumed below a case where the line length (i.e., pitch length) p of the unit cell $UC_n$ is sufficiently smaller than the wavelength in principle, and therefore, it is emphasized that essentially similar results are obtained even in the case of T type, π type or L type, while the line length p of the unit cell $UC_n$ with respect to the wavelength does not restrict the basic operation described herein.

In addition, a composite right/left-handed transmission line 100 having such a reciprocal phase characteristic that a phase constant $\beta_+$ in the forward direction and a phase constant $\beta_-$ in the reverse direction are an identical value β is referred to as a reciprocal composite right/left-handed transmission line or a reversible composite right/left-handed transmission line, and a composite right/left-handed transmission line 100 having such an nonreciprocal phase characteristic that the phase constant $\beta_+$ in the forward direction and the phase constant $\beta_-$ in the reverse direction are mutually different is referred to as an nonreciprocal composite right/left-handed transmission line or an irreversible composite right/left-handed transmission line.

Figure 5:
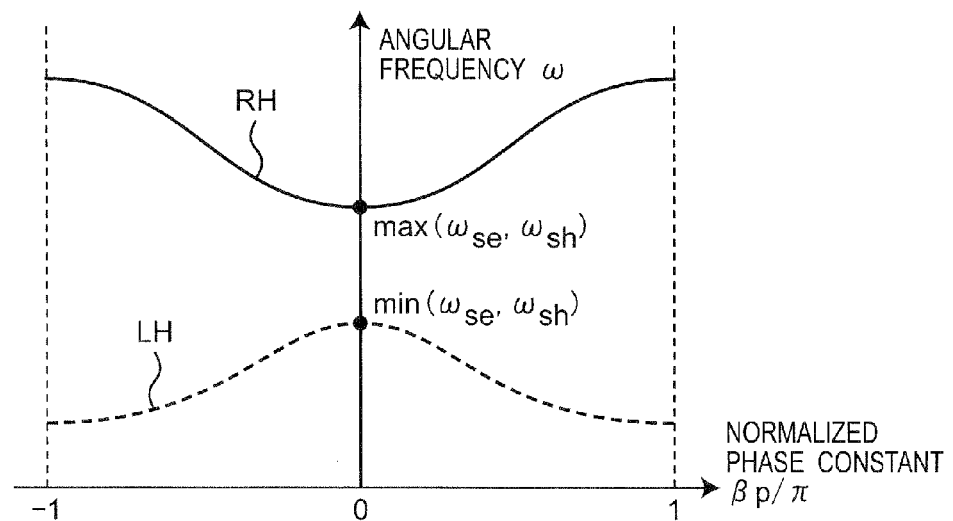
FIG. 5 is a graph showing a dispersion curve (characteristic of angular frequency ω with respect to normalized phase constant βp/π) in an unbalanced state in the prior art reciprocal composite right/left-handed transmission line.
Figure 6:
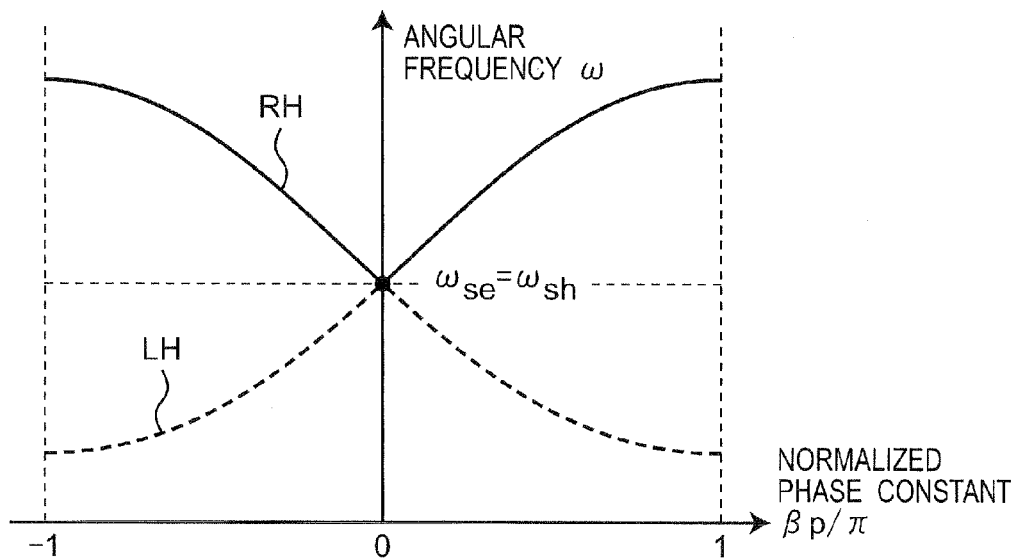
FIG. 6 is a graph showing a dispersion curve (characteristic of angular frequency ω with respect to normalized phase constant βp/π) in a balanced state in the prior art reciprocal composite right/left-handed transmission line.

The propagation characteristics of the composite right/left-handed transmission line 100 having the periodic structure of cascade-connecting a plurality of unit cells $UC_n$ as shown in FIGS. 1 and 2 are obtained as dispersion curves that relates between the operating frequency and the phase constant of the propagating electromagnetic waves. FIG. 5 is a graph showing a dispersion curves (characteristics of angular frequency ω with respect to normalized phase constant βp/π) in the unbalanced state in the prior art reciprocal composite right/left-handed transmission line. FIG. 6 is a graph showing a dispersion curves (characteristics of angular frequency ω with respect to normalized phase constant βp/π) in the balanced state in the prior art reciprocal composite right/left-handed transmission line.

In general, the inclination of the tangent of the dispersion curve:

$$\frac{\partial \omega}{\partial \beta}$$ [Mathematical Number 5]

has a dimension of velocity and represents the direction of the transmission power (pointing vector) of electromagnetic waves, and in contrast to this, the following expression:

$$\omega/\beta$$ [Mathematical Number 6]

represents a phase velocity (in a flowing direction on an equi-phase surface).

In the unbalanced state as shown in FIG. 5, it can be understood that the series resonance angular frequency $\omega_{se}$ and the parallel resonance angular frequency $\omega_{sh}$ are mutually different in the case of the unbalanced state, and the curves are separated into a lower frequency band and an upper frequency band. The lower frequency band has such a state that propagation of backward waves (left-handed mode) is possible so that the direction (direction of group velocity) of the transmission power of electromagnetic waves and the direction of phase velocity become mutually opposite are possible. The upper frequency band has such a state that propagation of forward waves (right-handed mode) is possible so that the direction of group velocity and the direction of phase velocity are directed to an identical direction. In addition, no dispersion curve exists between the bands that represent the right-handed (RH) mode and the left-handed (LH) mode, and there is a forbidden band (band-gap) in which the wave propagation is not permitted.

On the other hand, in the balanced state as shown in FIG. 6, the series resonance angular frequency $\omega_{se}$ and the parallel resonance angular frequency $\omega_{sh}$ coincide with each other, and the right-handed (RH) transmission characteristic and the left-handed (LH) transmission characteristic are continuously connected, and the forbidden band disappears.

The dispersion curves in the case of the unbalanced state in the reciprocal composite right/left-handed transmission line have been described with reference to FIG. 5, in which the dispersion curves in the case of the unbalanced state in the nonreciprocal composite right/left-handed transmission line are obtained by shifting the axis of symmetry (straight line where $\beta=0$) of the dispersion curves of FIG. 5 from the axis of symmetry to the right or left side. In addition, the dispersion curves in the case of the balanced state in the reciprocal composite right/left-handed transmission line have been described with reference to FIG. 6, in which the dispersion curves in the case of the balanced state in the nonreciprocal composite right/left-handed transmission line is obtained by shifting the axis of symmetry (straight line where $\beta=0$) of the dispersion curves of FIG. 6 from the axis of symmetry to the right or left side.

As described above, the composite right/left-handed transmission line 100 is a microwave transmission line having such a configuration that at least one unit cells $UC_1$, $UC_2, \ldots, UC_N$ are cascade-connected. In this case, each unit cell $UC_n$ is configured to include the following:

the capacitive element having the capacitance $C_L$ inserted in the series branch so that the effective permeability in the electromagnetic wave mode of propagation in the composite right/left-handed transmission line 100 becomes negative;

the inductive element having the inductance $L_L$ inserted in the series branch so that the effective permittivity in the electromagnetic wave mode of propagation in the composite right/left-handed transmission line 100 becomes negative; and the transmission line part 61 of an nonreciprocal transmission line part or a reciprocal transmission line part.

In addition, each unit cell $UC_n$ has such a circuit configuration that the composite right/left-handed transmission line 100 has a predetermined phase constant in the dispersion curves that represent the relation between the operating frequency of the microwave signal inputted to the composite right/left-handed transmission line 100 and the phase constant of the composite right/left-handed transmission line 100.

Figure 7:
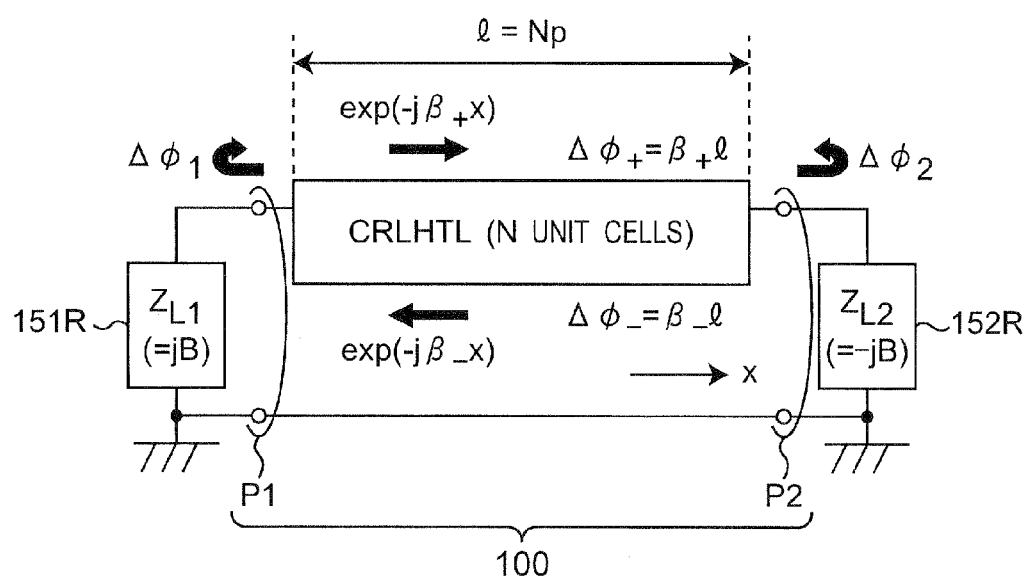
FIG. 7 is a circuit diagram showing an equivalent circuit model of a zeroth-order resonator of a transmission line type microwave resonator according to an embodiment of the present invention.

2. Resonance Conditions of Zeroth-order Resonator of Transmission Line Type Microwave Resonator according to Embodiment of Present Invention having Nonreciprocal Composite Right/Left-Handed Transmission Line Next, the resonance conditions of the zeroth-order resonator of a transmission line type microwave resonator according to an embodiment of the present invention having a reciprocal composite right/left-handed transmission line is described with reference to FIGS. 7 to 10. FIG. 7 is a circuit diagram showing an equivalent circuit model of the zeroth-order resonator of the transmission line type microwave resonator of the embodiment of the present invention. Referring to FIG. 7, the microwave resonator of the present embodiment is configured to include a composite right/left-handed transmission line (CRLHTL) 100 (it is configured to include a plurality N of basic cells $UC_1$, $UC_2, \ldots, UC_N$, and the length of one basic cell is p) of a linear shape of a finite length $l=Np$ having ports P1 and P2; a reflective impedance element 151R connected to the port P1; and a reflective impedance element 152R connected to the port P2. In this case, the reflective impedance element 151R operates so that its impedance seen from the port P1 becomes $Z_{L1}$ at the operating frequency, and the reflective impedance element 152R operates so that its impedance seen from the port P2 becomes $Z_{L2}$ at the operating frequency. The parameters $\beta_+$ and $\Delta\phi_+$ of FIG. 7 represent the phase constant and the phase delay, respectively, of the line relevant to power transmission from the port P1 to the port P2, the parameters $\beta_-$ and $\Delta\phi_-$ represent the phase constant and the phase delay, respectively, of the line relevant to power transmission from the port P2 to the port P1, and x represents the position in the longitudinal direction of the composite right/left-handed transmission line 100. Further, phase shifts attributed to reflections at the ports P1 and P2 are $\Delta\phi_1$ and $\Delta\phi_2$, respectively. In the present case, the resonance conditions are satisfied when the phase relational expression of the following expression holds:

[Mathematical Number 7]

$$\Delta\phi = \Delta\phi_+ + \Delta\phi_- + \Delta\phi_1 + \Delta\phi_2 = 2m\pi \quad (2)$$

where $\Delta\phi_+ = \beta_+ l$, and $\Delta\phi_- l$, and "m" is an integer. In addition, it is assumed that the composite right/left-handed transmission line 100 is a reciprocal transmission line of which the phase constant $\beta_+$ and the phase constant $\beta_-$ are equal to each other. In this case, if both the ports P1 and P2 are open terminals or short-circuited, then the value of $\Delta\phi_1 + \Delta\phi_2$ is $2\pi$ or zero in either case of voltage waves or current waves, and therefore, the Expression (2) is expressed by the following expression:

[Mathematical Number 8]

$$\Delta\phi = \Delta\phi_+ + \Delta\phi_- = 2\beta l = 2m\pi \quad (3)$$

Therefore, the resonance conditions concerning the phase constant $\beta$ of the line are determined by the length l of the composite right/left-handed transmission line 100, and are expressed by the following expression:

[Mathematical Number 9]

$$\beta = m\pi/l \quad (4)$$

Since the phase constant $\beta$ is a function of frequency, it can also be said that the Expression (4) expresses the dependence of the resonance frequency on the line length. When m=1 in the Expression (4), the line length $l=\lambda_g/2$. In this case, the parameter $\lambda_g$ is a guide wavelength. This condition defines the operation of a typical half-wavelength resonator. When m=0 in the Expression (4), the resonance condition is $\mu=0$ to be independent of the line length l. The fact that the phase constant β is zero means an infinite wavelength, when the guide wavelength $\lambda_g$ has a size of +∞, and the signal amplitude and phase become uniform on the composite right/left-handed transmission line 100. As described above, the resonance state in which the resonance frequency does not depend on the size of the resonator is called the zeroth-order resonance, and the resonator that causes zeroth-order resonance is called the zeroth-order resonator (See, for example, the Non-Patent Document 1).

Figure 11:
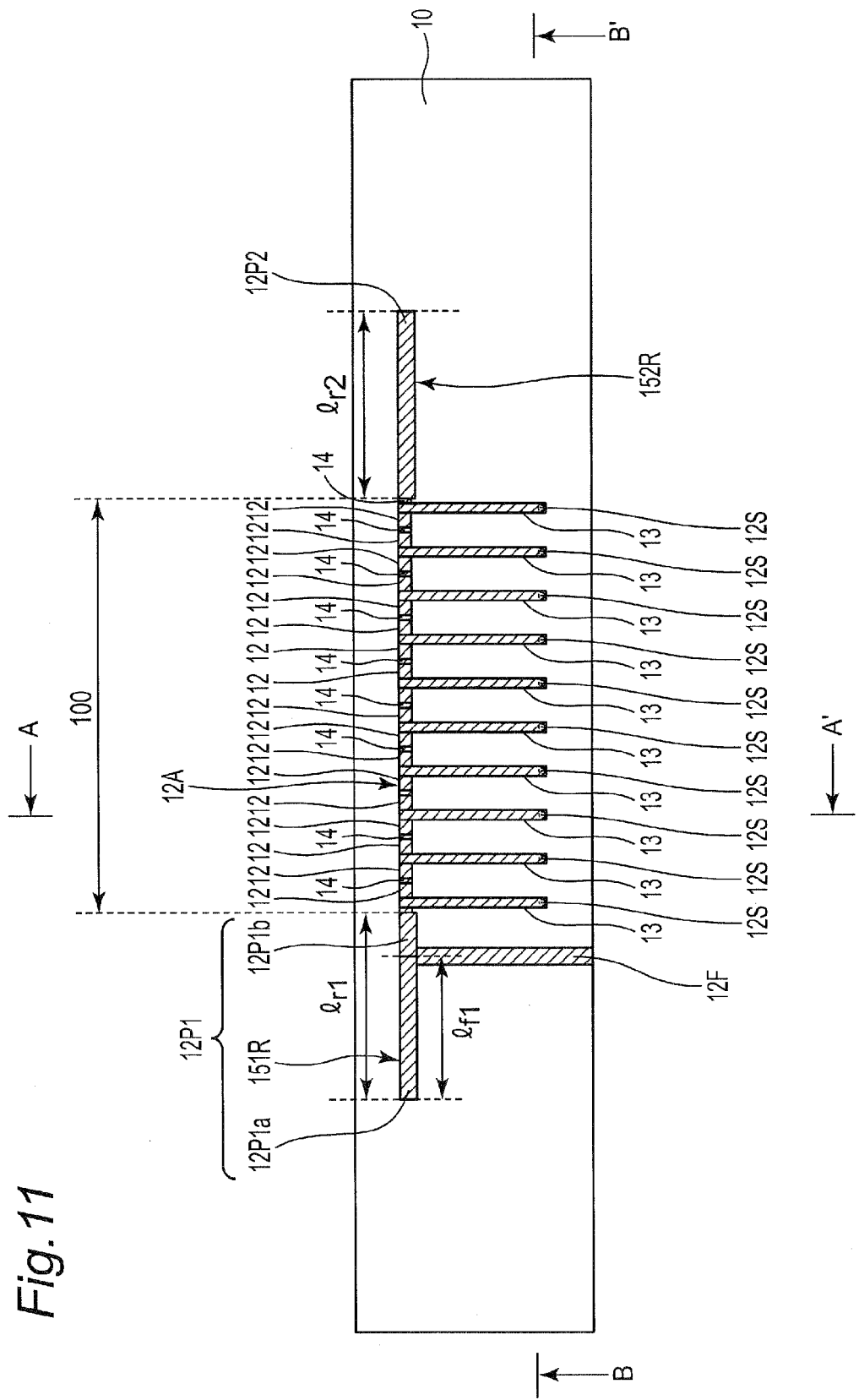
FIG. 11 is a plan view showing a concrete configuration of the zeroth-order resonator of FIG. 7 when a composite right/left-handed transmission line 100 is provided in which the number N of the unit cells constituting the zeroth-order resonator is ten and which is reciprocal.

Referring to FIG. 7, if the ports P1 and P2 are short-circuited and $Z_{L1}=Z_{L2}=0$, then a large current flows from the composite right/left-handed transmission line 100 to the reflective impedance elements 151R and 152R. Therefore, such a series resonance operation that the impedance $Z_{se}$ of the series branch of each unit cell $UC_n$ is zero becomes dominant. At this time, the radiation waves are linearly polarized waves, and the main polarization direction is a direction parallel to the composite right/left-handed transmission line 100. Conversely, if the ports P1 and P2 are open terminals and $Z_{L1}=Z_{L2}=+∞$, then the current becomes zero and the voltage becomes maximized at the connection point of the composite right/left-handed transmission line 100 and the reflective impedance elements 151R and 152R. Therefore, such a parallel resonance operation that the admittance $Y_{sh}$ of the parallel branch is zero becomes dominant. At this time, the main polarization direction of the radiation waves becomes a direction parallel to the parallel branch. Therefore, for example, if a short-circuit stub conductor 13 that constitutes the parallel branch is formed to be perpendicular to the composite right/left-handed transmission line 100 as shown in FIG. 11, then the main polarization direction of the radiation waves becomes a direction perpendicular to the composite right/left-handed transmission line 100 (direction parallel to the Y axis of FIG. 11).

Conventionally, the zeroth-order resonator has been actualized by making both the ports P1 and P2 short-circuited terminals or open terminals as described above. However, in order to obtain the Expression (2), it is enough for the phase condition in terminal reflection to only satisfy the following expression:

[Mathematical Number 10]

$$\Delta\phi_1+\Delta\phi_2=2m_L\pi \quad (5)$$

where $m_L$ is an integer. Further, the resonance conditions to the terminal reflection are required to be not only this phase condition but also substantially total reflection (i.e., the absolute value of reflection coefficient is one). Therefore, according to the Expression (5) and the subsequent explanation, a reflection coefficient $\Gamma_1$ at the port P1 and a reflection coefficient $\Gamma_2$ at the port P2 are expressed by the following expressions:

[Mathematical Number 11]

$$\Gamma_1=\exp(j\Delta\phi_1) \quad (6a)$$

[Mathematical Number 12]

$$\Gamma_2=\exp(j\Delta\phi_2)=\exp(-j\Delta\phi_1) \quad (6a)$$

The phase relation of the Expression (5) can be achieved by inserting a reflective impedance element 151R having an impedance jB of a pure imaginary number at the operating frequency into the port P1, and inserting a reflective impedance element 152R having an impedance -jB conjugate with the impedance jB is at the operating frequency into the port P2.

When the zeroth-order resonator of the embodiment of the present invention is actually produced, the phase relation of the Expression (5) can be substantially achieved if the imaginary part of the impedance Z1 of the reflective impedance element 151R and the imaginary part of the impedance Z2 of the reflective impedance element 152R have signs different from each other, and the magnitude of the imaginary part of the impedance Z1 and the magnitude of the imaginary part of the impedance Z2 are substantially equal to each other. In this case, the real part of the impedance Z1 has a loss of substantially zero, and the real part of the impedance Z2 has a loss of substantially zero. In practice, the Q value of the zeroth-order resonator is required to be several tens or more, and, preferably, equal to or larger than 200.

At this time, a reflection coefficient $\Gamma_{1B}$ at the port P1 and a reflection coefficient $\Gamma_{2B}$ at the port P2 are expressed by the following expressions by using Bloch impedance $Z_{CRLHTL}$ of the composite right/left-handed transmission line 100 that constitutes the zeroth-order resonator:

[Mathematical Number 13]

$$\Gamma_{1B}=\frac{Z_{L1}-Z_{CRLH}}{Z_{L1}+Z_{CRLH}}=\frac{jB-Z_{CRLH}}{jB+Z_{CRLH}}=-\exp\left(-j2\tan^{-1}\frac{B}{Z_{CRLHTL}}\right) \quad (7a)$$

[Mathematical Number 14]

$$\Gamma_{2B}=\frac{Z_{L2}-Z_{CRLH}}{Z_{L2}+Z_{CRLH}}=\frac{-jB-Z_{CRLH}}{-jB+Z_{CRLH}}=-\exp\left(j2\tan^{-1}\frac{B}{Z_{CRLHTL}}\right) \quad (7b)$$

In general, the Bloch impedance $Z_{CRLHTL}$ of the composite right/left-handed transmission line 100 varies depending on the unit cell structure. For example, in the case of the T type, the Bloch impedance $Z_{CRLHTL}$ is expressed by the following expression:

[Mathematical Number 15]

$$(a) \quad Z_{CRLHTL}=\sqrt{\frac{B_T}{C_T}} \quad (8a)$$

$$=\sqrt{\frac{Z_{se}\left(1+\frac{Y_{sh}Z_{se}}{4}\right)}{Y_{sh}}}$$

$$=\sqrt{\frac{L_R\left(1-\left(\frac{\omega_{se}}{\omega}\right)^2\right)\left[1-\frac{\omega^2 L_R C_R}{4}\left(1-\left(\frac{\omega_{se}}{\omega}\right)^2\right)\left(1-\left(\frac{\omega_{sh}}{\omega}\right)^2\right)\right]}{C_R\left(1-\left(\frac{\omega_{sh}}{\omega}\right)^2\right)}}$$

When the unit cell is the π type, the Bloch impedance $Z_{CRLHTL}$ is expressed by the following expression:

[Mathematical Number 16]

$$(b) \quad Z_{CRLHTL}=\sqrt{\frac{B_\pi}{C_\pi}} \quad (8b)$$

$$=\sqrt{\frac{Z_{se}}{Y_{sh}\left(1+\frac{Y_{sh}Z_{se}}{4}\right)}}$$

$$=\sqrt{\frac{L_R\left(1-\left(\frac{\omega_{se}}{\omega}\right)^2\right)}{C_R\left(1-\left(\frac{\omega_{sh}}{\omega}\right)^2\right)\left[1-\frac{\omega^2 L_R C_R}{4}\left(1-\left(\frac{\omega_{se}}{\omega}\right)^2\right)\left(1-\left(\frac{\omega_{sh}}{\omega}\right)^2\right)\right]}}$$

In particular, when the composite right/left-handed transmission line 100 is in the resonance state while keeping the balanced state, the Bloch impedance $Z_{CRLHTL}$ is simply expressed as the following expression regardless of the unit cell structure:

[Mathematical Number 17]

$$(c) \ \omega = \omega_{sh} = \omega_{se} \text{のとき} : Z_{CRLHTL} = \sqrt{\frac{L_R\left(1-\left(\frac{\omega_{se}}{\omega}\right)^2\right)}{C_R\left(1-\left(\frac{\omega_{sh}}{\omega}\right)^2\right)}} = \sqrt{\frac{L_R}{C_R}} \quad (8c)$$

The relation of the reflection coefficients $\Gamma_{1B}$ and $\Gamma_{2B}$ of the Expression (7a) and the Expression (7b) satisfy the relation of the reflection coefficients $\Gamma_1$ and $\Gamma_2$ of the Expression (6a) and the Expression (6b). Therefore, a variety of zeroth-order resonators can be actualized in accordance with the reactance B of the reflective impedance element 151R in FIG. 7.

2-1. Operation of Zeroth-Order Resonator with use of Reciprocal Balanced Composite Right/Left-Handed Transmission Line 100

Figure 8:
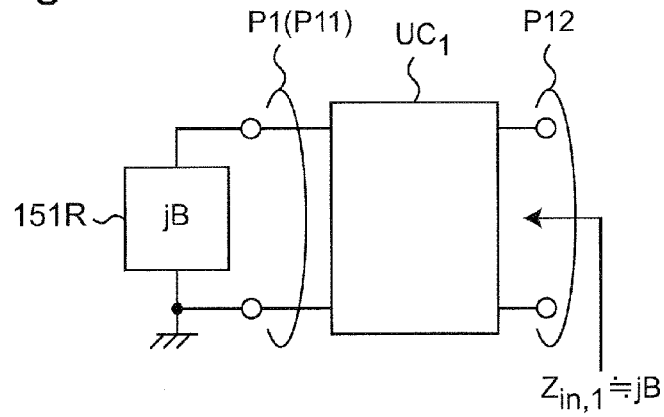
FIG. 8 is a block diagram showing an input impedance $Z_{in,1}$ seen from the port P12 of a unit cell $UC_1$ when a port P1 of the composite right/left-handed transmission line 100 of FIG. 7 is terminated by a reflective impedance element 151R having an impedance jB.
Figure 9:
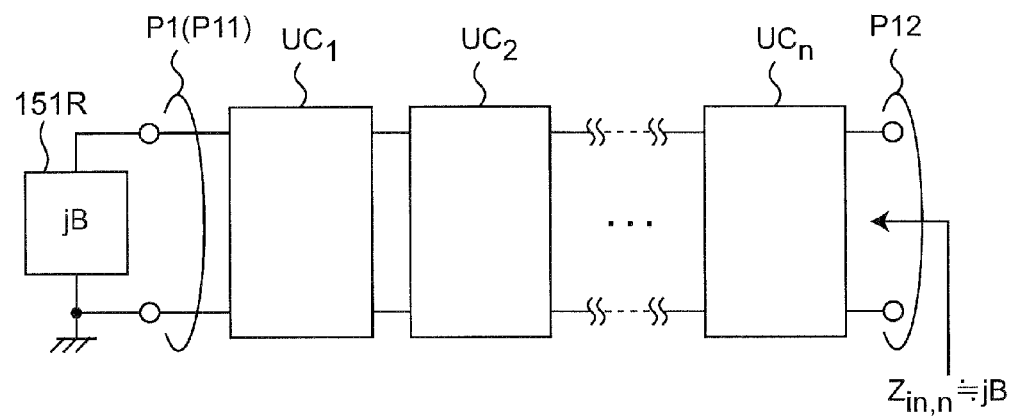
FIG. 9 is a block diagram showing an input impedance $Z_{in,n}$ seen from a port P12 of a unit cell $UC_n$ when the port P1 of the composite right/left-handed transmission line 100 of FIG. 7 is terminated by the reflective impedance element 151R having the impedance jB.

Next, the operation of the zeroth-order resonator with use of a reciprocal balanced composite right/left-handed transmission line 100 is described with reference to FIGS. 8 to 10.

The ABCD matrix $F_T$ of the unit cell $UC_n$ (See FIG. 3) having a symmetrical T-type structure and the ABCD matrix $F_\pi$ of the unit cell $UC_n$ (See FIG. 4) having a symmetrical $\pi$ structure are, expressed by the following expressions:

[Mathematical Number 18]

$$F_T = \begin{pmatrix} A_T & B_T \\ C_T & D_T \end{pmatrix} = \begin{pmatrix} 1+\frac{Y_{sh}Z_{se}}{2} & Z_{se}\left(1+\frac{Y_{sh}Z_{se}}{4}\right) \\ Y_{sh} & 1+\frac{Y_{sh}Z_{se}}{2} \end{pmatrix} \quad (9a)$$

[Mathematical Number 19]

$$F_\Pi = \begin{pmatrix} A_\Pi & B_\Pi \\ C_\Pi & D_\Pi \end{pmatrix} = \begin{pmatrix} 1+\frac{Y_{sh}Z_{se}}{2} & Z_{se} \\ Y_{sh}\left(1+\frac{Y_{sh}Z_{se}}{4}\right) & 1+\frac{Y_{sh}Z_{se}}{2} \end{pmatrix} \quad (9b)$$

The impedance $Z_{se}$ of the series branch and the admittance $Y_{sh}$ of the parallel branch become substantially zero in the vicinity of the zeroth-order resonance frequency. At this time, the Expression (9a) and the Expression (9b) can be collectively approximated by the following expression:

[Mathematical Number 20]

$$F_T \approx F_\Pi \approx \begin{pmatrix} 1 & Z_{se} \\ Y_{sh} & 1 \end{pmatrix} \approx \begin{pmatrix} 1 & 0 \\ 0 & 1 \end{pmatrix} \quad (10)$$

When each unit cell $UC_n$ has a symmetrical T-type structure, an input impedance $Z_{in,1}$ seen from the other port P12 of the unit cell $UC_1$ in the case where the port P1 (one port P11 of the unit cell $UC_1$) of the composite right/left-handed transmission line 100 of FIG. 7 is terminated by the reflective impedance element 151R having the impedance jB is approximately expressed by the following expression:

[Mathematical Number 21]

$$Z_{in,1} = \frac{V}{I} = \frac{A_T V_{L1} + B_T I_{L1}}{C_T V_{L1} + D_T I_{L1}} = \frac{A_T Z_{L1} + B_T}{C_T Z_{L1} + D_T} \approx \frac{jB+Z_{se}}{jBY_{sh}+1} \approx jB \quad (11)$$

Also when the unit cell $UC_n$ has the symmetrical $\pi$ type structure, the input impedance $Z_{in,1}$ seen from the other port P12 of the unit cell $UC_1$ is likewise expressed by the Expression (11). FIG. 8 is a block diagram showing an input impedance $Z_{in,1}$ seen from the port P12 of the unit cell $UC_1$ when the port P1 of the composite right/left-handed transmission line 100 of FIG. 7 is terminated by the reflective impedance element 151R having the impedance jB. With this arrangement, it can be understood that the input impedance $Z_{in,n}$ seen from the port P12 of each unit cell $UC_n$ consistently becomes jB even when the number N of the unit cells $UC_n$ is expanded to plural. That is, it can be easily understood that, when the reflective impedance element 151R having the impedance jB is connected to one port P1 of the balanced composite right/left-handed transmission line 100 of a finite length in the zeroth-order resonance state, an input impedance seen from the other port P2 consistently becomes identical to the impedance jB at the terminal element (i.e., reflective impedance element 151R) of the port P1 regardless of the line length l. FIG. 9 is a block diagram showing an input impedance $Z_{in,n}$ seen from the port P12 of the unit cell $UC_n$ when the port P1 of the composite right/left-handed transmission line 100 of FIG. 7 is terminated by the reflective impedance element 151R having the impedance jB.

Therefore, when the reflective impedance element 151R having the impedance jB at the operating frequency is inserted as a reflector into the one port P1 of the composite right/left-handed transmission line 100 of a finite length, it is necessary to insert the reflective impedance element 152R having the impedance −jB of a pure imaginary number conjugate with the impedance jB of the pure imaginary number at the operating frequency into the other port P2 in order to make the balanced composite right/left-handed transmission line 100 cause zeroth-order resonance.

Figure 10:
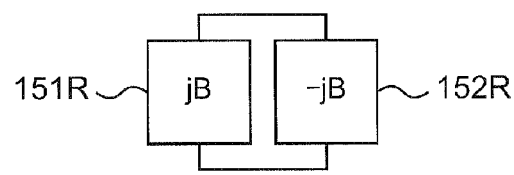
FIG. 10 is a block diagram showing a closed-loop circuit of a lumped constant circuit having the reflective impedance elements 151R and 152R of FIG. 7.

FIG. 10 is a block diagram showing a closed-loop circuit of a lumped constant circuit having the reflective impedance elements 151R and 152R of FIG. 7. As described above, it can be understood that the balanced composite right/left-handed transmission line 100 of the finite length whose both the terminals are terminated by the reflective impedance element 151R having the impedance jB and the reflective impedance element 152R having the impedance −jB automatically satisfies the resonance conditions in a manner similar to that of the closed-loop (See FIG. 10) of two elements having the lumped constants jB and −jB.

It is noted that a ratio (impedance) between voltage waves and current waves propagating along the composite right/left-handed transmission line 100 in the zeroth-order resonance state corresponds to the aforementioned input impedance jB.

In the prior art zeroth-order resonator, the ports P1 and P2 of the composite right/left-handed transmission line 100 have been short-circuited terminals or open terminals. In this case, the series resonance becomes dominant in the composite right/left-handed transmission line 100 when the ports P1 and P2 of the composite right/left-handed transmission line 100 are the short-circuited terminals, and the parallel resonance becomes dominant in the composite right/left-handed transmission line 100 when the ports P1 and P2 of the composite right/left-handed transmission line 100 are the open terminals. Therefore, when the prior art zeroth-order resonator is used as a radiator of an antenna apparatus, when the stub conductors constituting the parallel branch are formed to be perpendicular to the composite right/left-handed transmission line 100, the direction that can be established as the main polarization direction of radiation waves has been only the direction parallel (when the series resonance is dominant) or the direction perpendicular (when the parallel resonance is dominant) to the composite right/left-handed transmission line 100. In contrast to this, according to the present invention, the reactance B of the reflective impedance element 151R can assume an arbitrary value, and therefore, a zeroth-order resonator in a double resonance state, which is intermediate between the state in which the series resonance is dominant (reactance B is zero) and the state in which the parallel resonance is dominant (reactance B is infinite), can be achieved. That is, in the case where the zeroth-order resonator of the present embodiment is employed as the radiator of an antenna apparatus, when the stub conductors constituting the parallel branch are formed to be perpendicular to the composite right/left-handed transmission line 100, the main polarization direction of radiation waves can be changed from the direction parallel to the composite right/left-handed transmission line 100 to the perpendicular direction (direction parallel to the stub conductors) by changing the reactance B from zero to +∞. In this case, an energy distribution on the composite right/left-handed transmission line 100 changes from a state of concentration on the series branch to a state of concentration on the parallel branch. Further, the resonance energy in the composite right/left-handed transmission line 100 changes from a state of only the series resonance energy to a state of only the parallel resonance energy.

2-2. Operation of Zeroth-order Resonator with use of Reciprocal Unbalanced Composite Right/Left-Handed Transmission Line 100

Next, the operation of the zeroth-order resonator when a reciprocal unbalanced composite right/left-handed transmission line 100 is employed is described. Regarding a series resonance angular frequency $\omega_{se}$ and a parallel resonance angular frequency $\omega_{sh}$ when the phase constant β is zero, one is an angular frequency at which an effective permeability $\mu_{eff}$ is zero, and the other is an angular frequency at which an effective permittivity $\mu_{eff}$ is zero. Further, a region interposed between these two angular frequencies is a forbidden band in which the propagation of electromagnetic waves along the composite right/left-handed transmission line 100 is not permitted. Since only one of the effective permittivity $\in_{eff}$ and the effective permeability $\mu_{eff}$ becomes negative, the characteristic impedance (Bloch impedance $Z_{CRLHTL}$ of the periodic structure in a precise sense) $Z_0 = (\mu_{eff}/\in_{eff})^{1.2}$ of the composite right/left-handed transmission line 100 becomes a pure imaginary number. For the above reasons, a frequency at which the reflective impedance element 151R having a reactance jB inserted in the port P1 of the composite right/left-handed transmission line 100 operates as a load whose impedance matching can be taken exists. That is, an angular frequency at which the characteristic impedance $Z_0$ of the composite right/left-handed transmission line 100 becomes equal to the impedance jB surely exists in the forbidden band between the series resonance angular frequency $\omega_{se}$ and the parallel resonance angular frequency $\omega_{sh}$. In this case, an input impedance Zin when the impedance element 151R (load impedance) is seen from the other port P2 of the composite right/left-handed transmission line 100 consistently becomes jB regardless of the line length l. Therefore, the resonance conditions are automatically satisfied by connecting the reflective impedance element 152R having the impedance −jB to the port P2.

In the unbalanced composite right/left-handed transmission line 100, there exists no mode of propagation along the transmission line in the frequency band between the series resonance angular frequency $\omega_{se}$ and the parallel resonance angular frequency $\omega_{sh}$. Conventionally, there has been no report of proposal of a transmission line type resonator, which is operable in the forbidden band interposed between the series resonance angular frequency $\omega_{se}$ and the parallel resonance angular frequency $\omega_{sh}$ and in which the resonance angular frequency does not depend on the line length l. In contrast to this, according to the zeroth-order resonator with use of the unbalanced composite right/left-handed transmission line 100 of the present embodiment, the resonance angular frequency can be changed from the series resonance angular frequency $\omega_{se}$ to the parallel resonance angular frequency $\omega_{sh}$ with the zeroth-order resonance state maintained not depending on the length l of the line by changing the reactance B from zero to +∞. It is noted in this case that the main polarization direction of radiation waves changes from the direction parallel to the composite right/left-handed transmission line 100 to the perpendicular direction (direction parallel to the parallel branch) in a manner similar to that of the case with use of the balanced composite right/left-handed transmission line 100, and the energy distribution on the composite right/left-handed transmission line 100 changes from the state of concentration on the series branch to the state of concentration on the parallel branch. Therefore, with the zeroth-order resonator with use of the unbalanced composite right/left-handed transmission line 100 of the present embodiment, a tunable resonator capable of continuously changing the resonance frequency from the series resonance frequency to the parallel resonance frequency, a band-pass filter apparatus capable of continuously changing the band-pass frequency from the series resonance frequency to the parallel resonance frequency, and a band-stop filter apparatus capable of continuously changing the band-stop frequency from the series resonance frequency to the parallel resonance frequency can be actualized.

3. Resonance Conditions of Zeroth-order Resonator of Transmission Line Type Microwave Resonator according to Embodiment of Present Invention having Nonreciprocal Composite Right/Left-Handed Transmission Line In the foregoing section, the resonance conditions of the zeroth-order resonator with use of the composite right/left-handed transmission line 100 having such a reciprocal phase characteristic that the propagation constant $\beta_+$ in the forward direction and the propagation constant $\beta_-$ in the reverse direction have the identical value β have been described. In the present section, the resonance conditions of the zeroth-order resonator with use of a composite right/left-handed transmission line 100 having such an nonreciprocal phase characteristic that the phase constant $\beta_+$ in the forward direction and the phase constant $\beta_-$ in the reverse direction are mutually different are described.

As described in detail in the foregoing section, the resonance conditions with use of the reciprocal composite right/left-handed transmission line 100 are given by the Expression (2) and the Expression (3) in the zeroth-order resonator of FIG. 7. On the other hand, the resonance conditions with use of the nonreciprocal composite right/left-handed transmission line 100 are given by the following Expression (12):

[Mathematical Number 22]

$$\Delta\phi = \Delta\phi_{30} + \Delta\phi_- = (\beta_+ + \beta_-)l = 2m\pi \quad (12)$$

When m=0 in the above expression, the resonance conditions of the Expression (12) are expressed by the following expression independently of the line length l:

[Mathematical Number 23]

$$\beta_+ + \beta_- = 0 \quad (13)$$

Such a condition that the phase constants $\beta_+$ and $\beta_-$ have an equal magnitude and different signs in a manner similar to that of the Expression (13) means that, the right-handed mode in which the phase velocity and the group velocity are directed to an identical direction propagates in the forward direction of the line, and the left-handed mode in which the phase velocity and the group velocity are directed to be antiparallel propagates in the reverse direction of the line. In addition, since both the phase constants $\beta_+$ and $\beta_-$ have the equal magnitude, it is meant that the wave number vectors are substantially identical regardless of the direction of transmission power in the line. At this time, the signal amplitude becomes uniform on the line of the resonator, whereas the phase distribution linearly changes as a function of the place. As described above, by employing the composite right/left-handed transmission line 100 of the nonreciprocal phase, a traveling-wave resonator having a resonance frequency that does not depend on the size (the number N of cells) of the composite right/left-handed transmission line 100 can be configured.

In this case, in a manner similar to that of the case with use of the reciprocal composite right/left-handed transmission line 100, the series resonance of the series branch becomes dominant in the case of both the short-circuited terminals, and the parallel resonance of the shunt branch becomes dominant in the case of both open terminals. However, in order to satisfy the resonance condition of the Expression (13), it is sufficient to satisfy the Expression (5) as the phase condition of terminal reflection, in a manner similar to that of the case with use of the reciprocal composite right/left-handed transmission line 100.

As described above, by controlling the terminal condition (reactance B of the reflective impedance element 151R of FIG. 7) also in the case of the traveling-wave resonator having the nonreciprocal composite right/left-handed transmission line 100, it is possible to simultaneously excite the series resonance of the series branch and the parallel resonance of the shunt branch and to freely control weighting of the energy distribution, in a manner similar to that of the case of the zeroth-order resonator having the reciprocal composite right/left-handed transmission line 100.

The radiation beam formed by the leaky wave from the traveling-wave resonator configured to include the nonreciprocal composite right/left-handed transmission line 100 is directed to a direction that inclines from the broadside direction (direction perpendicular to the propagation direction, i.e., θ=0). The inclination of the radiation beam is determined by the magnitude of the nonreciprocity of the composite right/left-handed transmission line 100. On the other hand, the directivity of the radiation beam and the magnitude of the gain are determined by the size (the number N of cells) of the zeroth-order resonator. In this case, the magnitude of the nonreciprocity of the line can be changed by, for example, changing the magnitude of an externally applied magnetic field. For example, when an inductive stub included in the shunt branch of the nonreciprocal composite right/left-handed transmission line 100 is formed to be perpendicular to the line part at the center, then the linear polarization direction of radiation waves can be changed to be independent of the radiation beam angle by controlling the reflection conditions at both the terminals in a manner similar to that of the case of the zeroth-order resonator having the reciprocal composite right/left-handed transmission line 100. Therefore, by employing the zeroth-order resonator having the nonreciprocal composite right/left-handed transmission line 100 of the present invention, a beam scanning antenna capable of performing beam scanning and polarization control with different control parameters can be configured.

Figure 12:
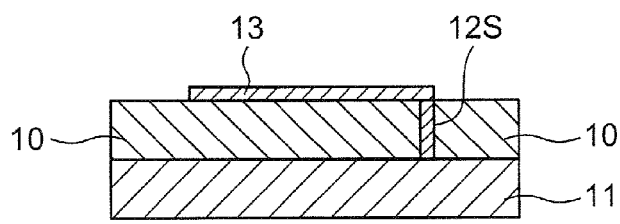
FIG. 12 is a longitudinal sectional view across a line A-A' of FIG. 11.
Figure 13:
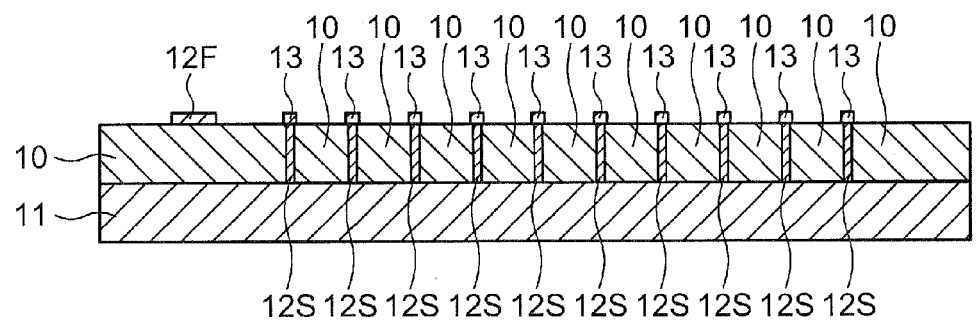
FIG. 13 is a longitudinal sectional view across a line B-B' of FIG. 11.
Figure 14:
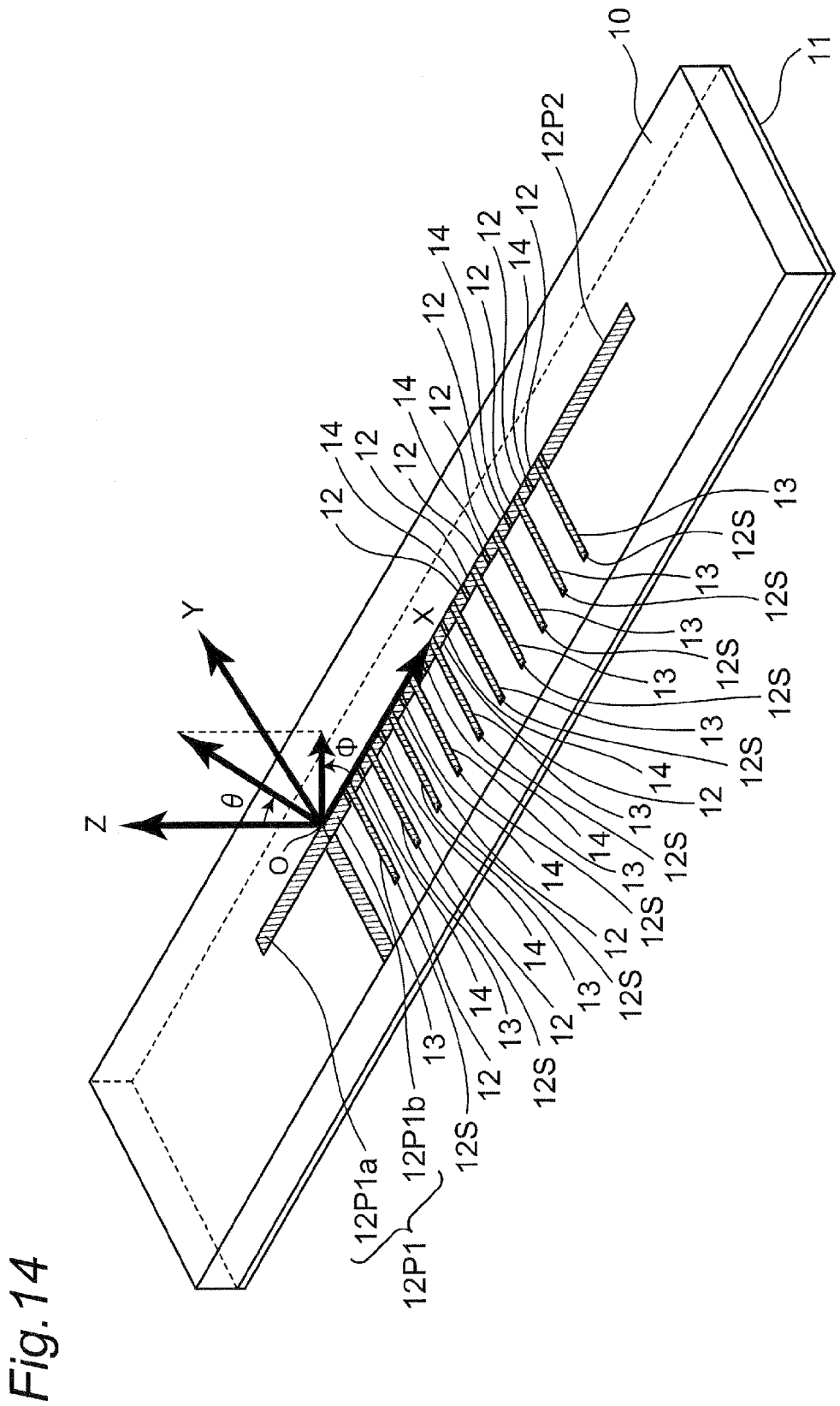
FIG. 14 is a perspective view of the zeroth-order resonator of FIG. 11 showing a definition of radiation angles θ and φ.

4. Concrete Example of Configuration of Zeroth-order Resonator according to Present Embodiment with use of Reciprocal Composite Right/Left-Handed Transmission Line Next, a concrete example of the configuration of the zeroth-order resonator of FIG. 7 with use of a reciprocal composite right/left-handed transmission line is described below with reference to FIGS. 11 to 14. FIG. 11 is a plan view showing a concrete configuration of the zeroth-order resonator of FIG. 7 when a composite right/left-handed transmission line 100 is provided in which the number N of unit cells constituting the zeroth-order resonator is ten and which is reciprocal. FIG. 12 is a longitudinal sectional view across the line A-A' of FIG. 11, and FIG. 13 is a longitudinal sectional view across the line B-B' of FIG. 11. Further, FIG. 14 is a perspective view of the zeroth-order resonator of FIG. 11 showing a definition of radiation angles θ and φ.

Referring to FIGS. 11 to 14, the zeroth-order resonator of the present embodiment is configured to include the following:

(a) a reciprocal composite right/left-handed transmission line 100;
(b) a reflective impedance element 151R configured to include an open terminal micro-strip line that is connected to one terminal of the composite right/left-handed transmission line 100 and has a length $l_{r1}$; and
(c) a reflective impedance element 152R configured to include an open terminal micro-strip line that is connected to the other terminal of the composite right/left-handed transmission line 100 and has a length $l_{r2}$.

In this case, the composite right/left-handed transmission line 100 is configured to include the following:

(a) a dielectric substrate 10 having a grounding conductor 11 on its reverse face;
(b) a plurality of strip conductors 12 configured by separating one strip conductor formed on an obverse face of the dielectric substrate 10;
(c) a plurality of capacitors 14 that connect mutually adjacent strip conductors 12 among the plurality of strip conductors 12; and
(d) a plurality of short-circuit stub conductors 13 that connect the strip to conductors 12 via respective via-conductors 12S to the grounding conductor 11.

In this case, each of the short-circuit stub conductors 13 is formed to be perpendicular to the longitudinal direction of the composite right/left-handed transmission line 100. In addition, the open terminal micro-strip line that constitutes the reflective impedance element 151R and has the length $l_{r1}$ is configured to include the dielectric substrate 10 having the grounding conductor 11 on its reverse face, and a strip conductor 12P1 having the length $l_{r1}$. Further, the open terminal micro-strip line that constitutes the reflective impedance element 152R and has the length $l_{r2}$ is configured to include the dielectric substrate 10 having the grounding conductor 11 on its reverse face, and a strip conductor 12P2 having the length $l_{r2}$. In this case, a micro-strip line 12A is configured to include strip conductors 12 that interpose the dielectric substrate 10 therebetween, the strip conductors 12P1 and 12P2 on the line ends, and the grounding conductor 11.

Further, in FIG. 11, the strip conductor 12P1 is configured to include a strip conductor 12P1b on the composite right/left-handed transmission line 100 side and a remaining strip conductor 12P1a, and a feeding line conductor 12F that constitutes a feeding line for feeding the zeroth-order resonator is inserted to be connected to a connection point of both the strip conductors 12P1a and 12P1b. In this case, the feeding line is configured to include the feeding line conductor 12F and the dielectric substrate 10 having the grounding conductor 11 on its reverse face. In addition, the length $l_{f1}$ of the strip conductor 12P1a is set so that a voltage-to-current ratio (impedance) that spatially changes due to standing waves generated on the reflection micro-strip line 12P1 is matched with the characteristic impedance (50 [Ω]) of the feeding line.

It is noted that the transmission line of FIGS. 11 to 14 are loaded with eleven capacitors 14 to form a distributed constant circuit type transmission line of ten periods, forming ten short-circuit stub conductors 13. It is noted that the capacitance of each capacitor 14 at both the terminals of the transmission line is double the capacitance of each of the other capacitors 14. The capacitors 14 may be provided by connecting a substantial capacitor between mutually adjacent strip conductors 12 depending on the frequency of a high-frequency signal to be inputted, configured to include only a stray capacitance between mutually adjacent strip conductors 12 or configured to include a series capacitance configured to include each stray capacitance and a capacitor of parallel connection as the capacitor 14. In addition, a formation interval of the short-circuit stub conductors 13 is identical to the unit cell line length (i.e., periodic length) p [mm].

Referring to FIG. 11, when the characteristic impedances and the phase constants of the open terminal micro-strip line conductors 12P1 and 12P2 are equal to the characteristic impedance $Z_0$ and the phase constant β, respectively, of the composite right/left-handed transmission line 100, the impedance $Z_{L1}$ of the reflective impedance element 151R and the impedance $Z_{L2}$ of the reflective impedance element 152R are expressed by the following expressions:

$$Z_{L1}=Z_0/j\tan(\beta l_{r1}) \qquad \text{[Mathematical Number 24]}$$

$$Z_{L2}=Z_0/j\tan(\beta l_{r2}) \qquad \text{[Mathematical Number 25]}$$

Here are described the configurations of the reflective impedance elements 151R and 152R that satisfy the Expression (6a) and the Expression (6b) when the lengths $l_{r1}$ and $l_{r2}$ of the micro-strip lines connected to both the terminals of the composite right/left-handed transmission line 100 are changed so as to satisfy $l_{r1}+l_{r2}=\lambda_g/2$.

When the lengths $l_{r1}$ and $l_{r2}$ of the micro-strip lines connected to both the terminals of the composite right/left-handed transmission line 100 are each $\lambda_g/4$ ($l_{r1}=l_{r2}=\lambda_g/4$), the impedance $Z_{L1}$ of the reflective impedance element 151R and the impedance $Z_{L2}$ of the reflective impedance element 152R are expressed by the following expressions:

$$Z_{L1}=Z_0/j\tan(\beta l_{r1})=Z_0/j\tan(\beta\lambda_g/4)=0 \qquad \text{[Mathematical Number 26]}$$

$$Z_{L1}=Z_0/j\tan(\beta l_{r1})=Z_0/j\tan(\beta\lambda_g/4)=0 \qquad \text{[Mathematical Number 27]}$$

Therefore, since the short-circuited terminal end condition in which both the terminals of the composite right/left-handed transmission line 100 are short-circuited is exhibited, the series resonance of the series branch part becomes dominant in the zeroth-order resonator of FIG. 11.

In addition, when the lengths $l_{r1}$ and $l_{r2}$ of the micro-strip lines connected to both the terminals of the composite right/left-handed transmission line 100 are $\lambda_g/2$ and zero ($l_{r1}=\lambda_g/2$ and $l_{r2}=0$), respectively, the impedance $Z_{L1}$ of the reflective impedance element 151R and the impedance $Z_{L2}$ of the reflective impedance element 152R are expressed by the following expressions:

$$Z_{L1}=Z_0/j\tan(\beta l_{r1})=Z_0/j\tan(\beta\lambda_g/2)=+\infty \qquad \text{[Mathematical Number 28]}$$

$$Z_{L2}=Z_0/j\tan(\beta l_{r2})=Z_0/j\tan(0)=+\infty \qquad \text{[Mathematical Number 29]}$$

Therefore, since the open terminal end condition in which both the terminals of the composite right/left-handed transmission line 100 are open is exhibited, the parallel resonance of the parallel branch part becomes dominant in the zeroth-order resonator of FIG. 11.

Further, when the lengths $l_{r1}$ and $l_{r2}$ of the micro-strip lines connected to both the terminals of the composite right/left-handed transmission line 100 are changed continuously from both the short-circuited terminals to both the open terminals so as to satisfy $l_{r1}+l_{r2}=\lambda_g/2$, the impedance $Z_{L1}$ of the reflective impedance element 151R and the impedance $Z_{L2}$ of the reflective impedance element 152 are expressed by the following expressions:

$$Z_{L1}=Z_0/j\tan(\beta l_{r1})=jB \qquad \text{[Mathematical Number 30]}$$

$$Z_{L2}=Z_0/j\tan(\beta l_{r2})=Z_0/j\tan(\pi-\beta l_{r1})=-Z_0/j\tan(\beta l_{r1})=-jB \qquad \text{[Mathematical Number 31]}$$

Therefore, the impedances $Z_{L1}$ and $Z_{L2}$ satisfy the relations of the Expression (7a) and the Expression (7b).

Although the case where the lengths $l_{r1}$ and $l_{r2}$ of the micro-strip lines connected to both the terminals of the composite right/left-handed transmission line 100 are changed so as to satisfy $l_{r1}+l_{r2}=\lambda_g/2$ has been described here, a case where $l_{r1}+l_{r2}$ is an integral multiple of $\lambda_g/2$ can also be explained likewise.

5. Resonance Characteristics and Electromagnetic Field Distribution of Zeroth-order Resonator with use of Reciprocal Balanced Composite Right/Left-Handed Transmission Line 100

Next, simulation calculation values and experimental measurement values of the resonance characteristics and the electromagnetic field distribution of the zeroth-order resonator of FIG. 11 with use of the reciprocal balanced composite right/left-handed transmission line 100 are described below.

Figure 15:
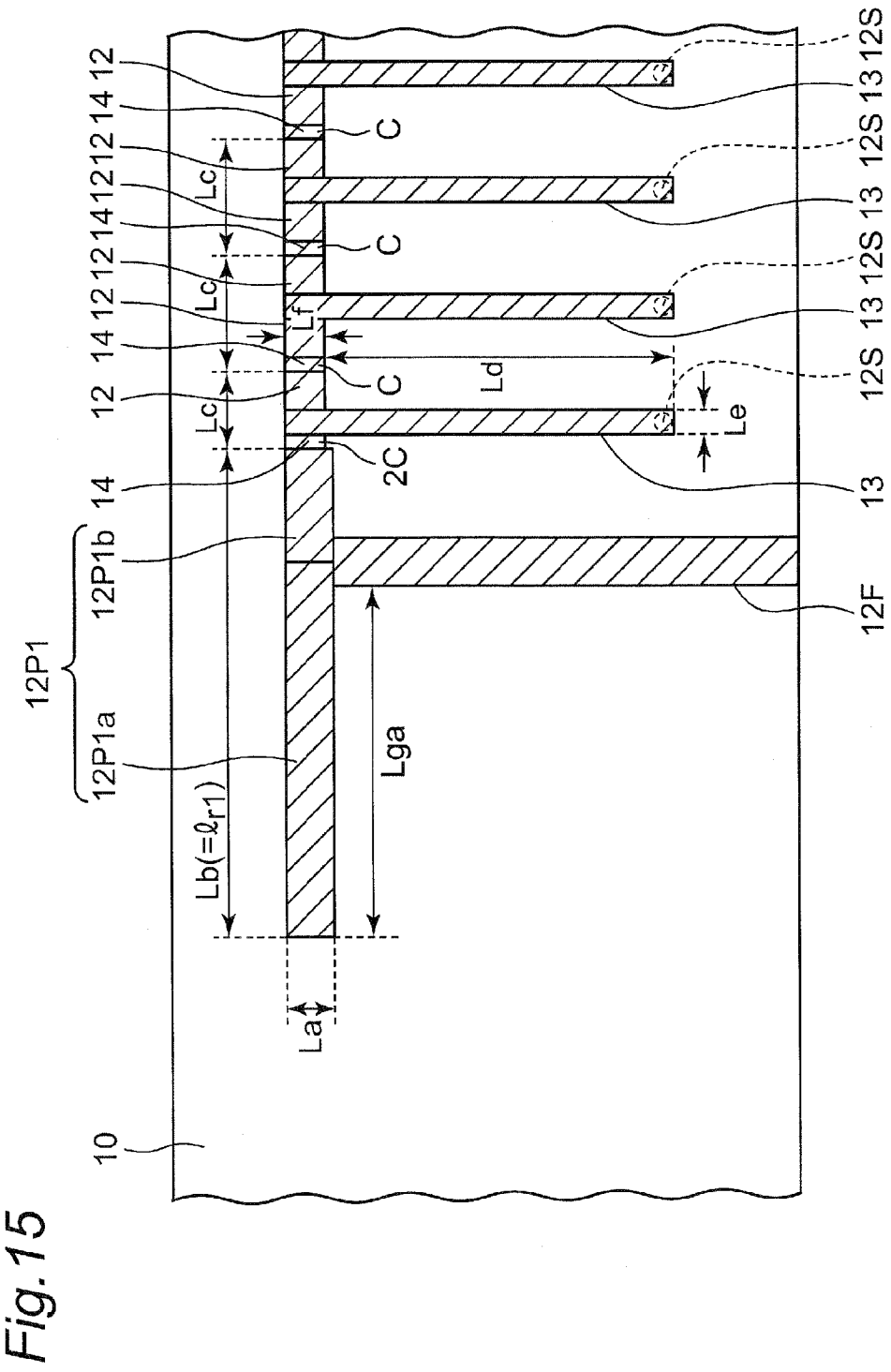
FIG. 15 is a plan view showing a structural parameters La, Lb, Lc, Ld, Le, Lf, Lga and C of the zeroth-order resonator of FIG. 11 with use of a reciprocal balanced composite right/left-handed transmission line 100.

FIG. 15 is a plan view showing a structural parameters La, Lb, Lc, Ld, Le, Lf, Lga and C of the zeroth-order resonator of FIG. 11 with use of the reciprocal balanced composite right/left-handed transmission line 100. In the following simulations and experiments, the structural parameters were set as follows.

(1) A dielectric substrate 10 having a thickness of 0.8 mm and a relative permittivity of 2.62 was used.

(2) The line width Lf of the composite right/left-handed transmission line 100 was set to 1.7 mm, a short-circuit stub conductor 13 having a width Le of 1 mm and a length Ld of 18 mm was connected as the parallel branch to the composite right/left-handed transmission line 100, and a chip capacitor 14 of a capacitance C of 4.0 pF was inserted in the series branch at a pitch period Lc of 5 MM.

(3) The line width La of the strip conductors 12P1 and 12P2 was set to 2.1 mm so that the characteristic impedance became 50 Ω.

(4) The distance Lga of the feeding line conductor 12F from the open terminal of the strip conductor 12P1 was fixed to 16.5 mm so that the impedance of the zeroth-order resonator was matched with the characteristic impedance (50 [Ω]) of the feeding line configured to include the feeding line conductor 12F and the dielectric substrate 10 having the grounding conductor 11 on its reverse face.

(5) The length of the half-wave length ($\lambda_g/2$) at the operating frequency was set to 46 mm, and the length $l_{r1}$ (length Lb of FIG. 14) and the length $l_{r2}$ were changed so that the sum total of the length $l_{r1}$ of the strip conductor 12P1 and the length $l_{r2}$ of the strip conductor 12P2 became 46 mm.

As described above, relations between the lengths $l_{r1}$ and $l_{r2}$ and the impedances $Z_{L1}$ and $Z_{L2}$ are as follows:

(1) when $l_{r1}=l_{r2}=\lambda_g/4$, then $Z_{L1}=X_{L2}=0$, i.e., B=0.
(2) when $l_{r1}=3\lambda_g/8$ and $l_{r2}=\lambda_g/8$, then $Z_{L1}=j50$ [Ω] and $Z_{L2}=-j50$ [Ω], i.e., B=50 [Ω].
(3) when $l_{r1}=\lambda_g/2$ and $l_{r2}=0$, then $Z_{L1}=Z_{L2}=+\infty$, i.e., B=+∞.

Figure 16:
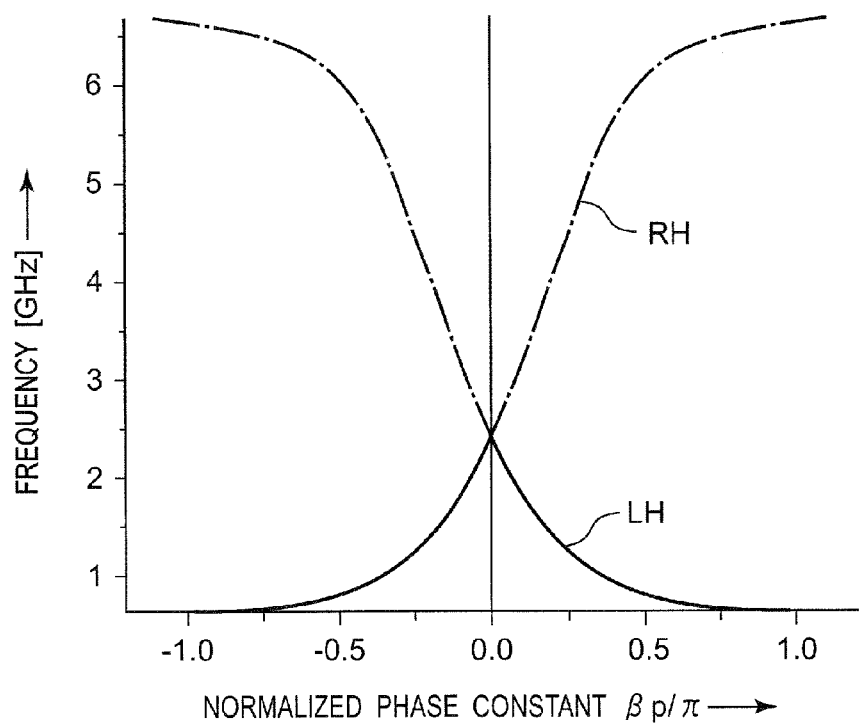
FIG. 16 is a graph showing a dispersion curve (characteristic of angular frequency ω with respect to normalized phase constant βp/π) of the balanced composite right/left-handed transmission line 100 that constitutes the zeroth-order resonator of FIG. 11 with use of the reciprocal balanced composite right/left-handed transmission line 100.

FIG. 16 is a graph showing a dispersion curve (characteristic of angular frequency ω with respect to normalized phase constant βp/π) of the balanced composite right/left-handed transmission line 100 that constitutes the zeroth-order resonator of FIG. 11 with use of the reciprocal balanced composite right/left-handed transmission line 100. As shown in FIG. 16, it can be confirmed that the left-handed (LH) mode exists between 0.5 GHz and 2.3 GHz, and the right-handed (RH) mode exists between 2.3 GHz and 7 GHz. In addition, the right-handed (RH) transmission characteristic and the left-handed (LH) transmission characteristic are continuously connected together, and the balanced state in which the forbidden band has disappeared is established.

Figure 17:
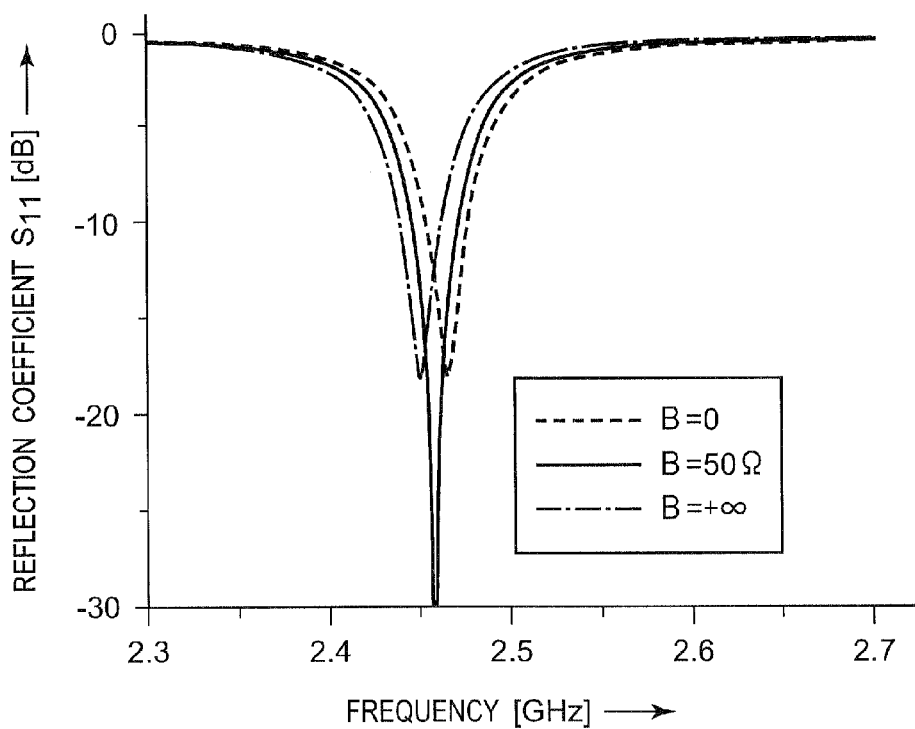
FIG. 17 is a graph showing a frequency characteristic of the reflection coefficient $S_{11}$ (simulation calculation value) of the zeroth-order resonator of FIG. 11 when the reactance B of the reflective impedance element 151R is set to zero, 50 [Ω] and +∞ with use of the reciprocal balanced composite right/left-handed transmission line 100.

FIG. 17 is a graph showing a frequency characteristic of the reflection coefficient $S_{11}$ (simulation calculation value) of the zeroth-order resonator of FIG. 11 when the reactance B of the reflective impedance element 151R is set to zero, 50 [Ω] and +∞ with use of the reciprocal balanced composite right/left-handed transmission line 100. Referring to FIG. 17, it can be confirmed that the resonance frequency has an almost constant value even when the reactance B is changed by changing each of the line lengths $l_{r1}$ and $l_{r2}$ of the reflective impedance elements 151R and 152R.

Figure 18A:
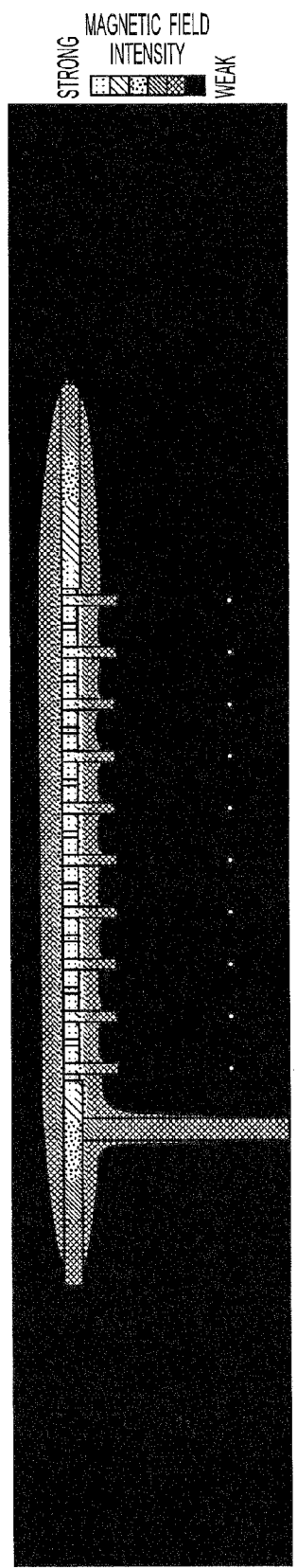
FIG. 18A is a plan view showing a magnetic field intensity distribution (simulation calculation value) of the zeroth-order resonator of FIG. 11 when the reactance B of the reflective impedance element 151R is set to zero with use of the reciprocal balanced composite right/left-handed transmission line 100.
Figure 18B:
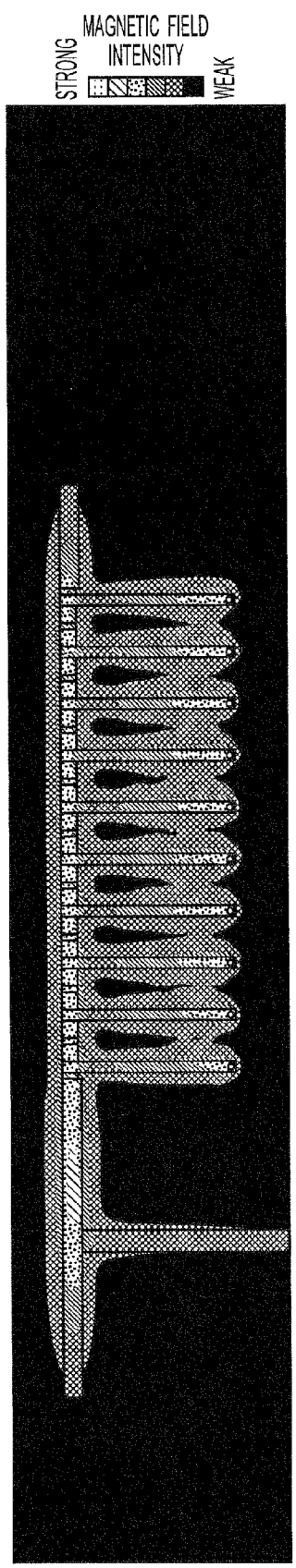
FIG. 18B is a plan view showing a magnetic field intensity distribution (simulation calculation value) of the zeroth-order resonator of FIG. 11 when the reactance B of the reflective impedance element 151R is set to 50 [Ω] with use of the reciprocal balanced composite right/left-handed transmission line 100.
Figure 18C:
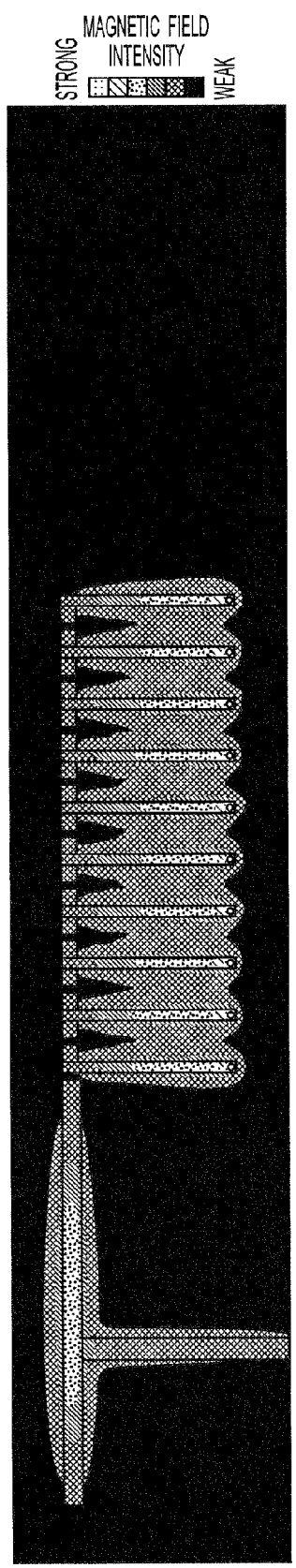
FIG. 18C is a plan view showing a magnetic field intensity distribution (simulation calculation value) of the zeroth-order resonator of FIG. 11 when the reactance B of the reflective impedance element 151R is set to +∞ with use of the reciprocal balanced composite right/left-handed transmission line 100.

FIGS. 18A, 18B and 18C are plan views showing a magnetic field intensity distributions (simulation calculation values) of the zeroth-order resonator of FIG. 11 when the reactance B of the reflective impedance element 151R is set to zero, 50 [Ω] and +∞, respectively, in the case where the reciprocal balanced composite right/left-handed transmission line 100 is employed in each case. Referring to FIGS. 18A, 18B and 18C, the white regions represent a magnetic field intensity stronger than that of the black regions. As shown in FIG. 18A, it can be confirmed that, when the reactance B is zero, the impedances $Z_{L1}$ and $Z_{L2}$ of the reflective impedance elements 151R and 152R are zero, the series resonance of the series branch is dominant, and magnetic fields are concentrated on the strip conductor 12 at the center. In addition, as shown in FIG. 18C, it can be confirmed that, when the reactance B is +∞, the impedances $Z_{L1}$ and $Z_{L2}$ of the reflective impedance elements 151R and 152R are +∞, the parallel resonance of the parallel branch is dominant, and magnetic fields are concentrated on the short-circuit stub conductor 13. Further, as shown in FIG. 18B, it can be confirmed that, when the reactance B is 50 [Ω], the magnetic field intensity of the strip conductor 12 at the center and the magnetic field intensity of the short-circuit stub conductor 13 are on almost same degree, and there is the double resonance state in which the series resonance of the series branch of the series branch and the parallel resonance of the parallel branch coexist on almost same degree. That is, it could be confirmed that the double resonance state was achieved when the reactance B was 50 [Ω]. According to the numerical simulation results, it is confirmed by further numerical simulations that the ratio between the magnitude of the magnetic field distributed in the series branch and the magnitude of the magnetic field distributed in the stub can be continuously changed by continuously changing the line lengths $l_{r1}$ and $l_{r2}$ of the reflective impedance elements 151R and 152R.

Figure 19A:
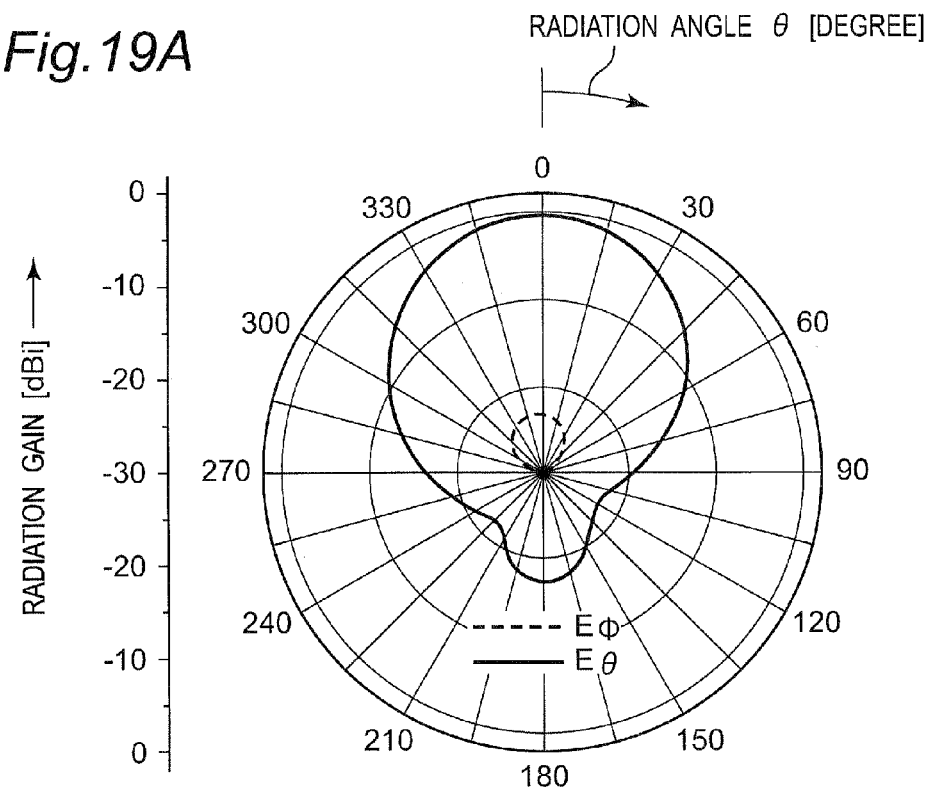
FIG. 19A is a chart showing a radiation pattern (simulation calculation value) on an x-z plane of the zeroth-order resonator of FIG. 11 when the reactance B of the reflective impedance element 151R is set to zero with use of the reciprocal balanced composite right/left-handed transmission line 100.
Figure 19B:
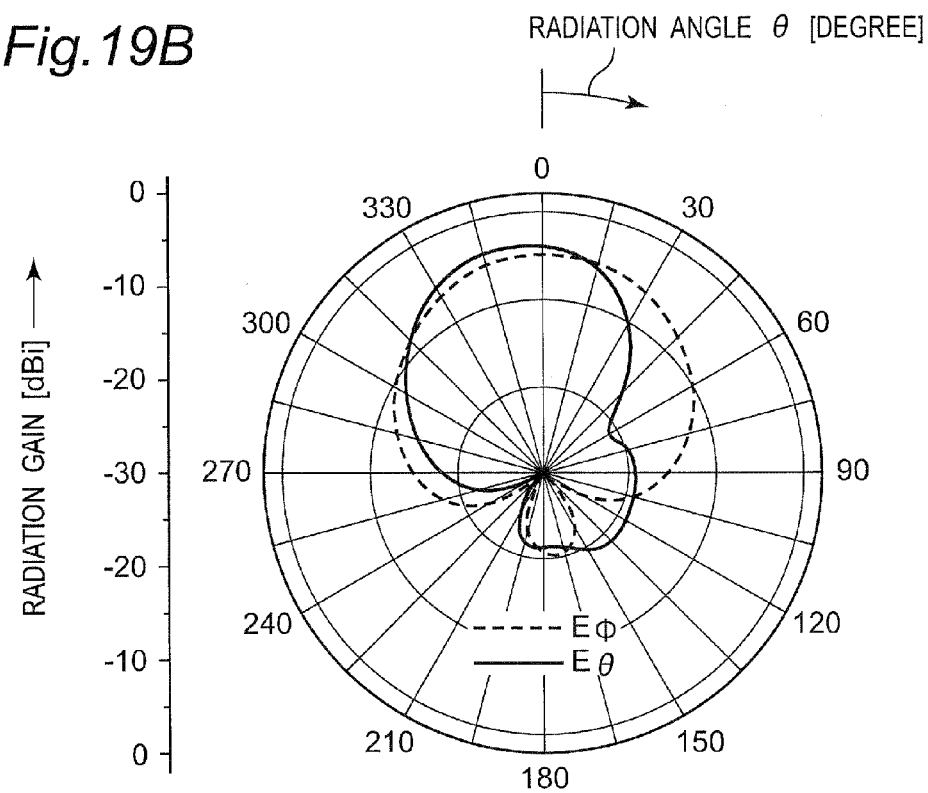
FIG. 19B is a chart showing a radiation pattern (simulation calculation value) on the x-z plane of the zeroth-order resonator of FIG. 11 when the reactance B of the reflective impedance element 151R is set to 50 [Ω] with use of the reciprocal balanced composite right/left-handed transmission line 100.
Figure 19C:
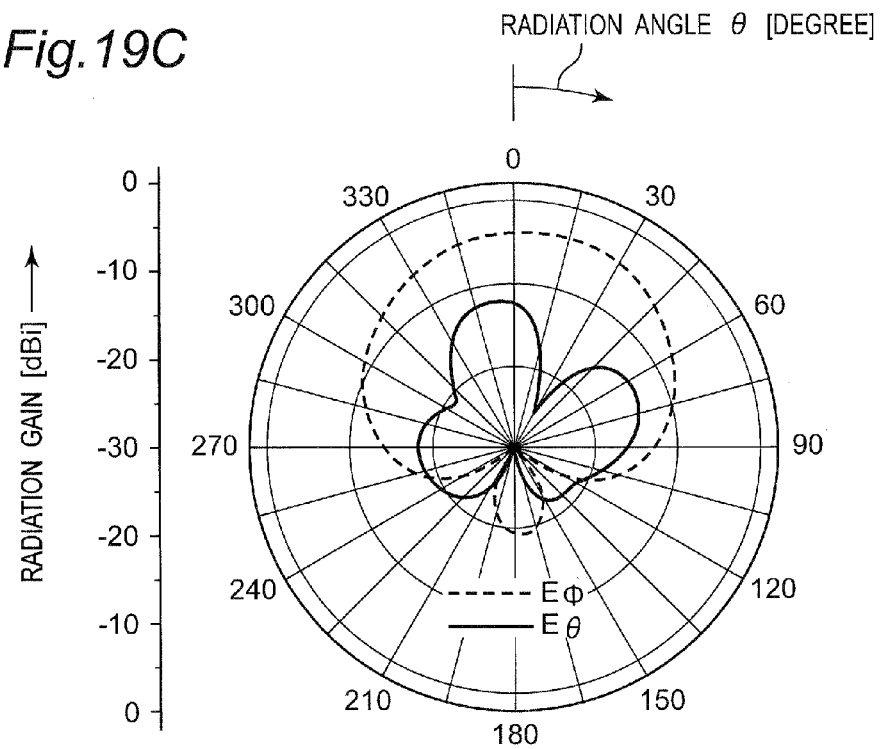
FIG. 19C is a chart showing a radiation pattern (simulation calculation value) on the x-z plane of the zeroth-order resonator of FIG. 11 when the reactance B of the reflective impedance element 151R is set to +∞ with use of the reciprocal balanced composite right/left-handed transmission line 100.

FIGS. 19A, 19B and 19C are charts showing a radiation patterns (simulation calculation values) on an x-z plane (when φ=0) of the zeroth-order resonator of FIG. 11 when the reactance B of the reflective impedance element 151R is set to zero, 50 [Ω] and +∞, respectively, in the case where the reciprocal balanced composite right/left-handed transmission line 100 is employed in each case. The way of establishing the coordinate system in FIGS. 19A, 19B and 19C are as shown in FIG. 14. Since the amplitude distribution of electromagnetic fields on the zeroth-order resonator becomes uniform on the line, it is confirmed that the radiation beam is directed toward the broadside direction (direction perpendicular to propagation direction, i.e., θ=0) not depending on the value of the reactance B as shown in FIGS. 19A, 19B and 19C. In the case of FIG. 19A, it can be confirmed that a θ-direction component $E_\theta$ of the electric field parallel to the line is the main polarization since the series resonance of the series branch is dominant and the magnetic fields are concentrated on the strip conductor 12 at the center. In addition, in the case of FIG. 19C, it can be confirmed that a φ-direction component $E_\phi$ of the electric field parallel to the short-circuit stub conductor 13 is the main polarization since the parallel resonance of the parallel branch is dominant and the magnetic fields are concentrated on the short-circuit stub conductor 13. In the case of FIG. 19B, it can be confirmed that the θ-direction component $E_\theta$ and the φ-direction component $E_\phi$ of the electric fields of the radiation waves are on almost same degree since the series resonance of the series branch and the parallel resonance of the parallel branch coexist on almost same degree and the magnetic field intensity of the strip conductor 12 at the center and the magnetic field intensity of the short-circuit stub conductor 13 are on almost same degree. In the cases of FIGS. 19A, 19B and 19C, the θ-direction component and the φ-direction component of the radiation waves are almost in phase, and therefore, the polarization direction rotates with the linear polarization state maintained. In addition, according to further numerical simulation results, it is confirmed that the main polarization direction of radiation waves can be changed continuously from the direction parallel to the composite right/left-handed transmission line 100 to the direction parallel to the short-circuit stub conductor 13 (i.e., direction perpendicular to the composite right/left-handed transmission line 100) by changing the line lengths $l_{r1}$ and $l_{r2}$ of the reflective impedance elements 151R and 152R in a manner that the reactance B can be changed continuously from zero to +∞. It is noted that the resonator is operable in a state in which the series resonance and the parallel resonance coexist even when the composite right/left-handed transmission line 100 is precisely not the balanced type but the unbalanced type line such that a small forbidden band exists between the left-handed mode transmission band and the right-handed mode transmission band, and therefore, the main polarization of radiation waves can be continuously changed. However, there is a problem that the operating frequency of the resonator fluctuates from the lower limit to the upper limit of the forbidden band in this case in order to change the main polarization direction as described later.

Figure 20A:
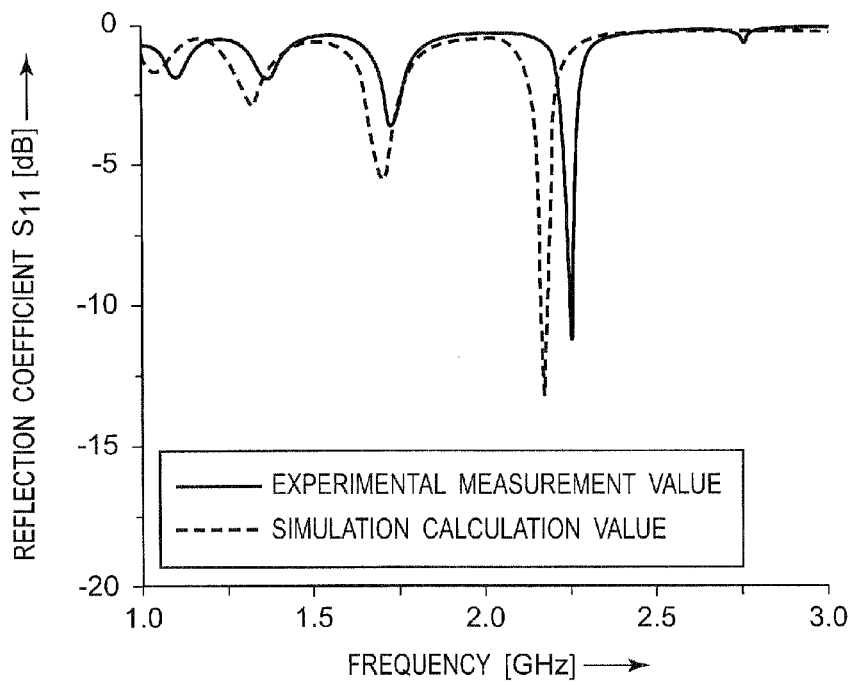
FIG. 20A is a graph showing a frequency characteristic of the reflection coefficient $S_{11}$ (experimental measurement value and simulation calculation value) of the zeroth-order resonator of FIG. 11 when the reactance B of the reflective impedance element 151R is set to zero with use of the reciprocal balanced composite right/left-handed transmission line 100.
Figure 20B:
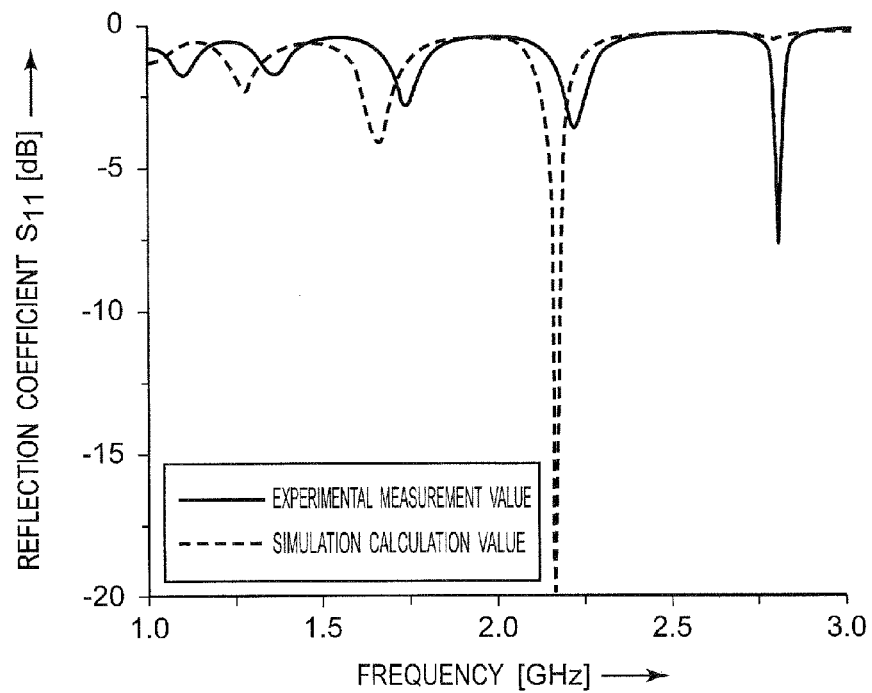
FIG. 20B is a graph showing a frequency characteristic of the reflection coefficient $S_{11}$ (experimental measurement value and simulation calculation value) of the zeroth-order resonator of FIG. 11 when the reactance B of the reflective impedance element 151R is set to 50 [Ω] with use of the reciprocal balanced composite right/left-handed transmission line 100.
Figure 20C:
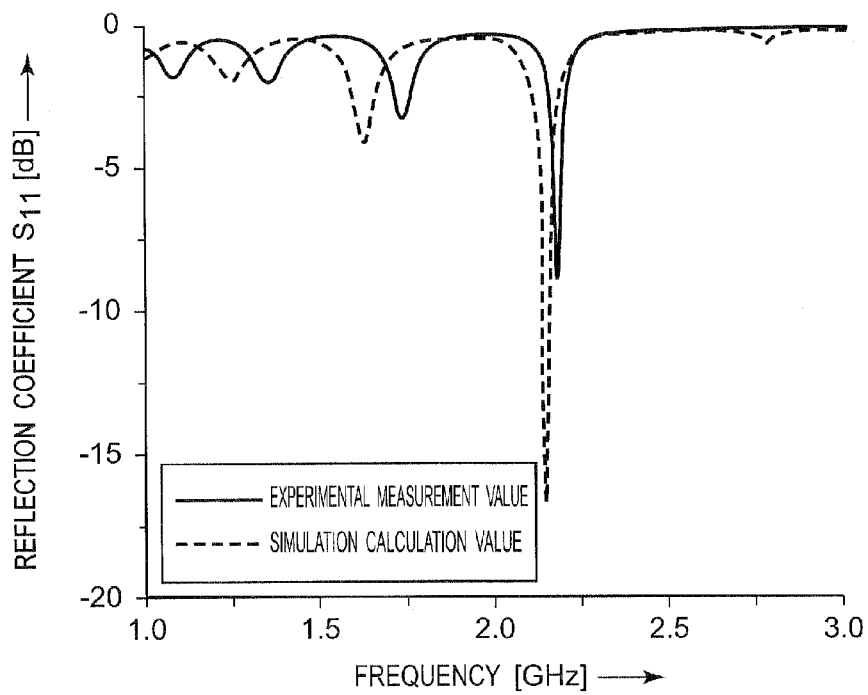
FIG. 20C is a graph showing a frequency characteristic of the reflection coefficient $S_{11}$ (experimental measurement value and simulation calculation value) of the zeroth-order resonator of FIG. 11 when the reactance B of the reflective impedance element 151R is set to +∞ with use of the reciprocal balanced composite right/left-handed transmission line 100.

FIGS. 20A, 20B and 20C are graphs showing a frequency characteristics of the reflection coefficient $S_{11}$ (experimental measurement values and simulation calculation values) of the zeroth-order resonator of FIG. 11 when the reactance B of the reflective impedance element 151R is set to zero, 50 [Ω] and +∞, respectively, with use of the reciprocal balanced composite right/left-handed transmission line 100 in each case. According to FIGS. 20A, 20B and 20C, it was confirmed that the experimental measurement values and the simulation calculation values almost coincided with each other, and the resonance frequency was almost constant even when the line lengths $l_{r1}$ and $l_{r2}$ of the reflective impedance elements 151R and 152R were continuously changed.

Figure 21B:
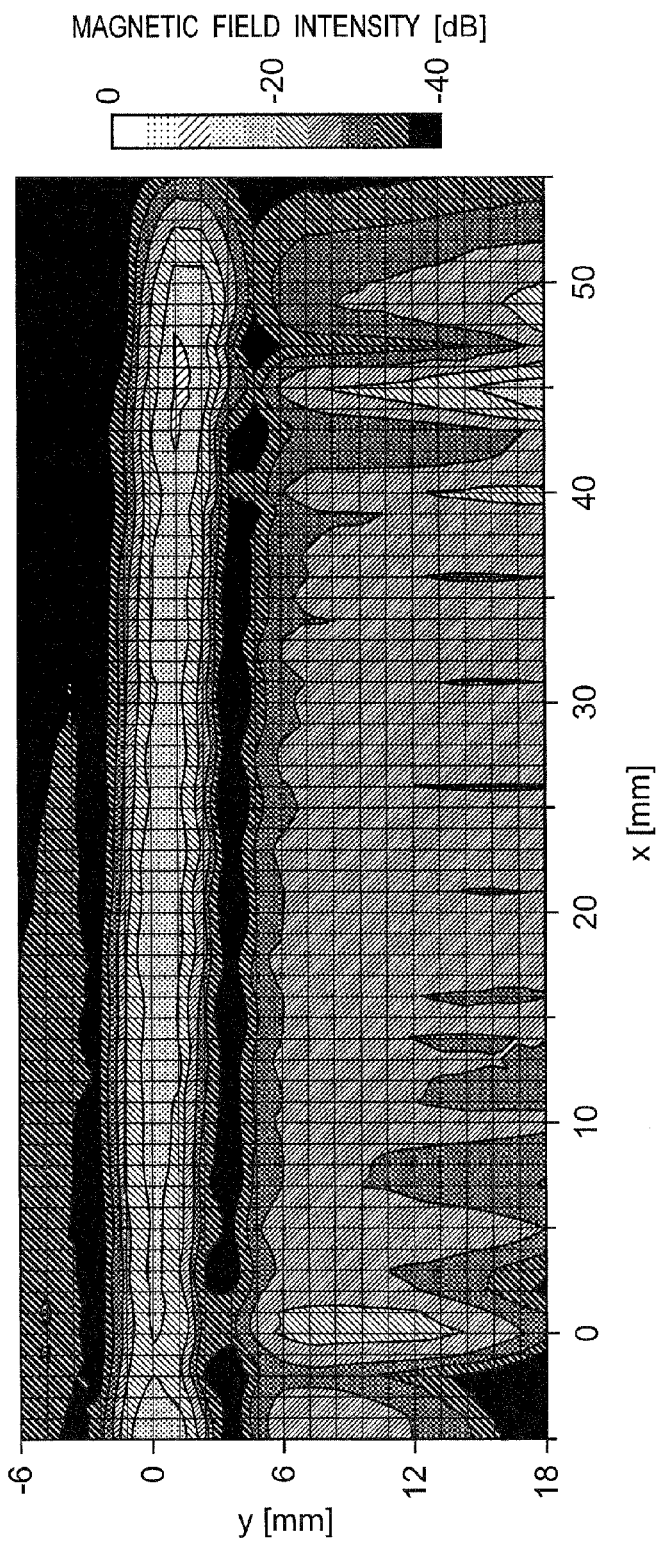
FIG. 21B is a plan view showing a near magnetic field intensity distribution (experimental measurement value) of the zeroth-order resonator of FIG. 11 when the reactance B of the reflective impedance element 151R is set to 50 [Ω] with use of the reciprocal balanced composite right/left-handed transmission line 100.

FIGS. 21A, 21B and 21C are plan views showing a near magnetic field intensity distributions (experimental measurement values) of the zeroth-order resonator of FIG. 11 when the reactance B of the reflective impedance element 151R is set to zero, 50 [Ω] and +∞, respectively, with use of the reciprocal balanced composite right/left-handed transmission line 100 in each case. The numerical simulation results corresponding to FIGS. 21A, 21B and 21C are shown in FIGS. 18A, 18B and 18C, respectively. Referring to FIGS. 21A, 21B and 21C, the white regions represent a magnetic field intensity stronger than that of the black regions.

As shown in FIG. 21A, it can be confirmed that the impedances $Z_{L1}$ and $Z_{L2}$ of the reflective impedance elements 151R and 152R are zero when the reactance B is zero, the series resonance of the series branch is dominant, and the magnetic fields are concentrated on the strip conductor 12 at the center. In addition, as shown in FIG. 21C, it can be confirmed that the impedances $Z_{L1}$ and $Z_{L2}$ of the reflective impedance elements 151R and 152R are +∞ in the case where the reactance B is +∞, the parallel resonance of the parallel branch is dominant, and the magnetic fields are concentrated on the short-circuit stub conductor 13. Further, as shown in FIG. 21B, it can be confirmed that the magnetic field intensity of the strip conductor 12 at the center and the magnetic field intensity of the short-circuit stub conductor 13 are on almost same degree, and the series resonance of the series branch and the parallel resonance of the parallel branch almost coexist on almost same degree when the reactance B is 50 [Ω]. That is, it could be confirmed that the double resonance state was established when the reactance B was 50 [Ω].

Figure 22A:
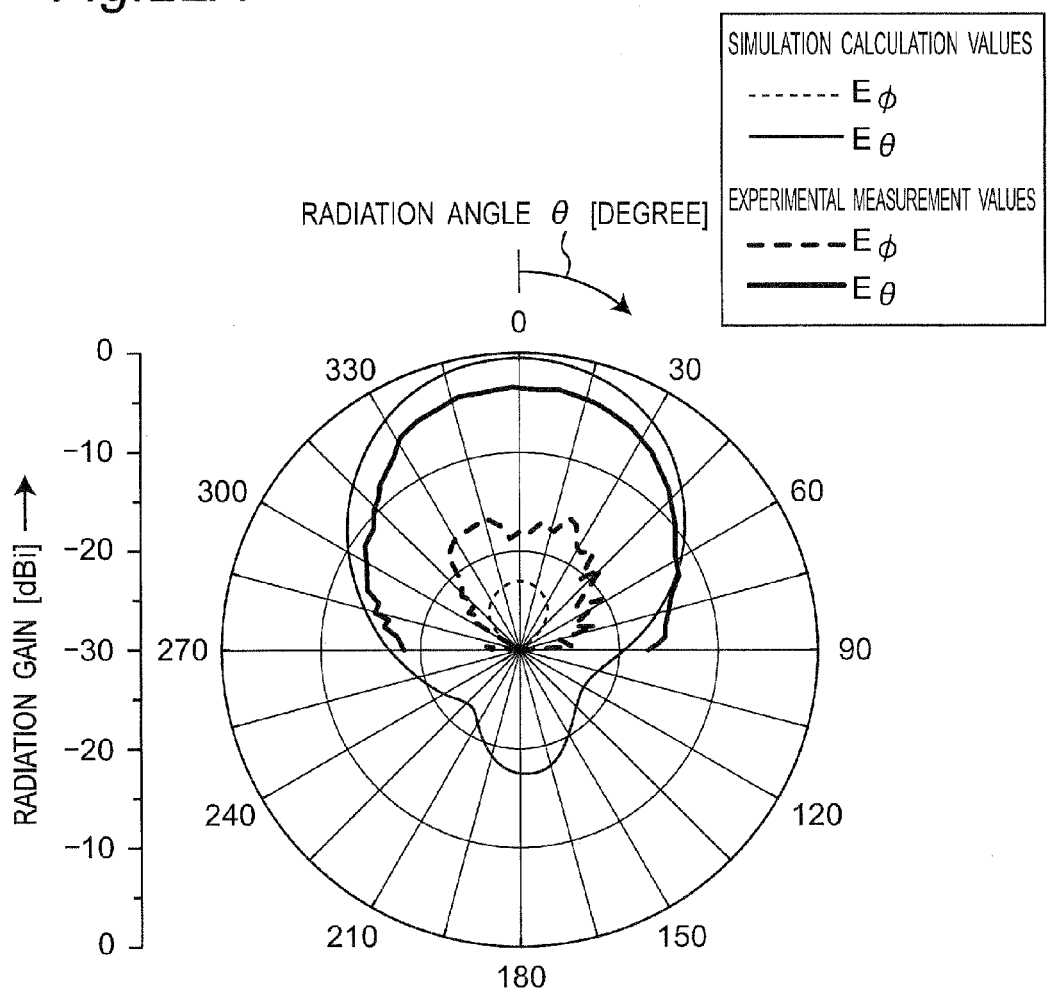
FIG. 22A is a chart showing a radiation pattern (experimental measurement value and simulation calculation value) on the x-z plane (when φ=0) of the zeroth-order resonator of FIG. 11 when the reactance B of the reflective impedance element 151R is set to zero with use of the reciprocal balanced composite right/left-handed transmission line 100.
Figure 22B:
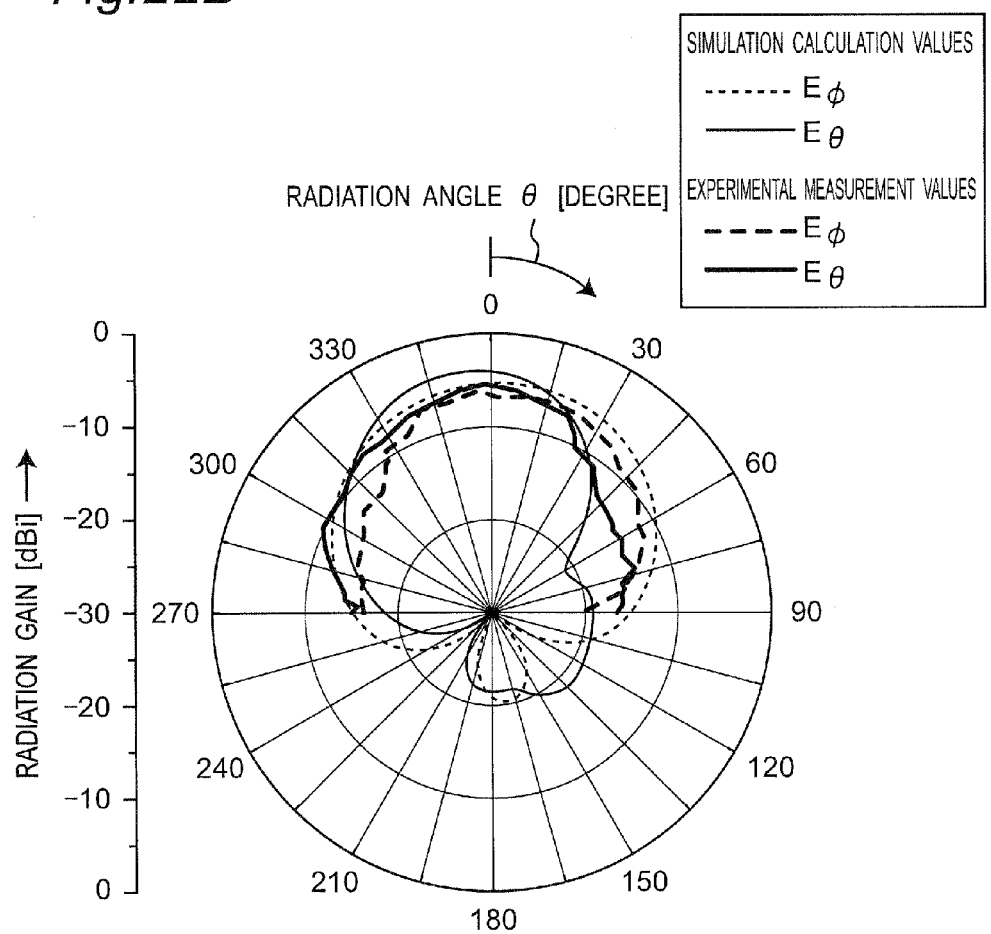
FIG. 22B is a chart showing a radiation pattern (experimental measurement value and simulation calculation value) on the x-z plane (when φ=0) of the zeroth-order resonator of FIG. 11 when the reactance B of the reflective impedance element 151R is set to 50 [Ω] with use of the reciprocal balanced composite right/left-handed transmission line 100.
Figure 22C:
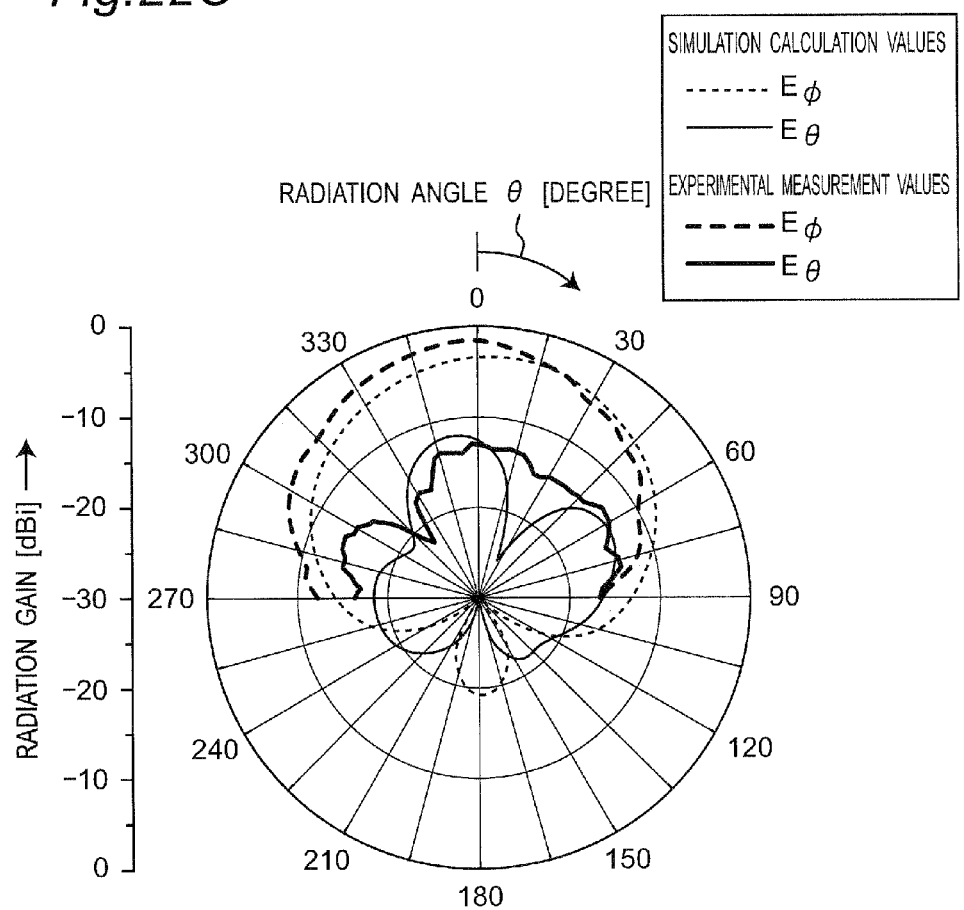
FIG. 22C is a chart showing a radiation pattern (experimental measurement value and simulation calculation value) on the x-z plane (when φ=0) of the zeroth-order resonator of FIG. 11 when the reactance B of the reflective impedance element 151R is set to +∞ with use of the reciprocal balanced composite right/left-handed transmission line 100.

FIGS. 22A, 22B and 22C are charts showing a radiation patterns (experimental measurement values and simulation calculation values) on the x-z plane (when φ=0) of the zeroth-order resonator of FIG. 11 in the case where the reactance B of the reflective impedance element 151R is set to zero, 50 [Ω] and +∞, respectively, with use of the reciprocal balanced composite right/left-handed transmission line 100 in each case. The way of establishing the coordinate system in FIGS. 22A, 22B and 22C are as shown in FIG. 14. Since the amplitude distribution of electromagnetic fields on the zeroth-order resonator becomes uniform on the line, it is confirmed that the radiation beam is directed toward the broadside direction (direction perpendicular to propagation direction, i.e., θ=0) not depending on the value of the reactance B as shown in FIGS. 22A, 22B and 22C. In the case of FIG. 22A, it can be confirmed that the θ-direction component $E_θ$ of the electric field parallel to the line is the main polarization since the series resonance of the series branch is dominant and the magnetic fields are concentrated on the strip conductor 12 at the center. In addition, in the case of FIG. 22C, it can be confirmed that the φ-direction component $E_φ$ of the electric fields parallel to the short-circuit stub conductor 13 is the main polarization since the parallel resonance of the parallel branch is dominant and the magnetic fields are concentrated on the short-circuit stub conductor 13. In the case of FIG. 22B, it can be confirmed that the θ-direction component $E_θ$ and the θ-direction component of the electric fields of the radiation waves are on almost same degree since the series resonance of the series branch and the parallel resonance of the parallel branch coexist on almost same degree and the magnetic field intensity of the strip conductor 12 at the center and the magnetic field intensity of the short-circuit stub conductor 13 are on almost same degree. In the cases of FIGS. 22A, 22B and 22C, the θ-direction component and the φ-direction component of the radiation waves are almost in phase, and therefore, the polarization direction rotates with the linear polarization state maintained.

6. Resonance Characteristic and Electromagnetic Field Distribution of Zeroth-order Resonator with use of Reciprocal Unbalanced Composite Right/Left-Handed Transmission Line 100

Next, simulation calculation values and experimental measurement values of the resonance characteristic and the electromagnetic-field distribution of the zeroth-order resonator of FIG. 11 with use of the reciprocal unbalanced composite right/left-handed transmission line 100 are described below.

Figure 23:
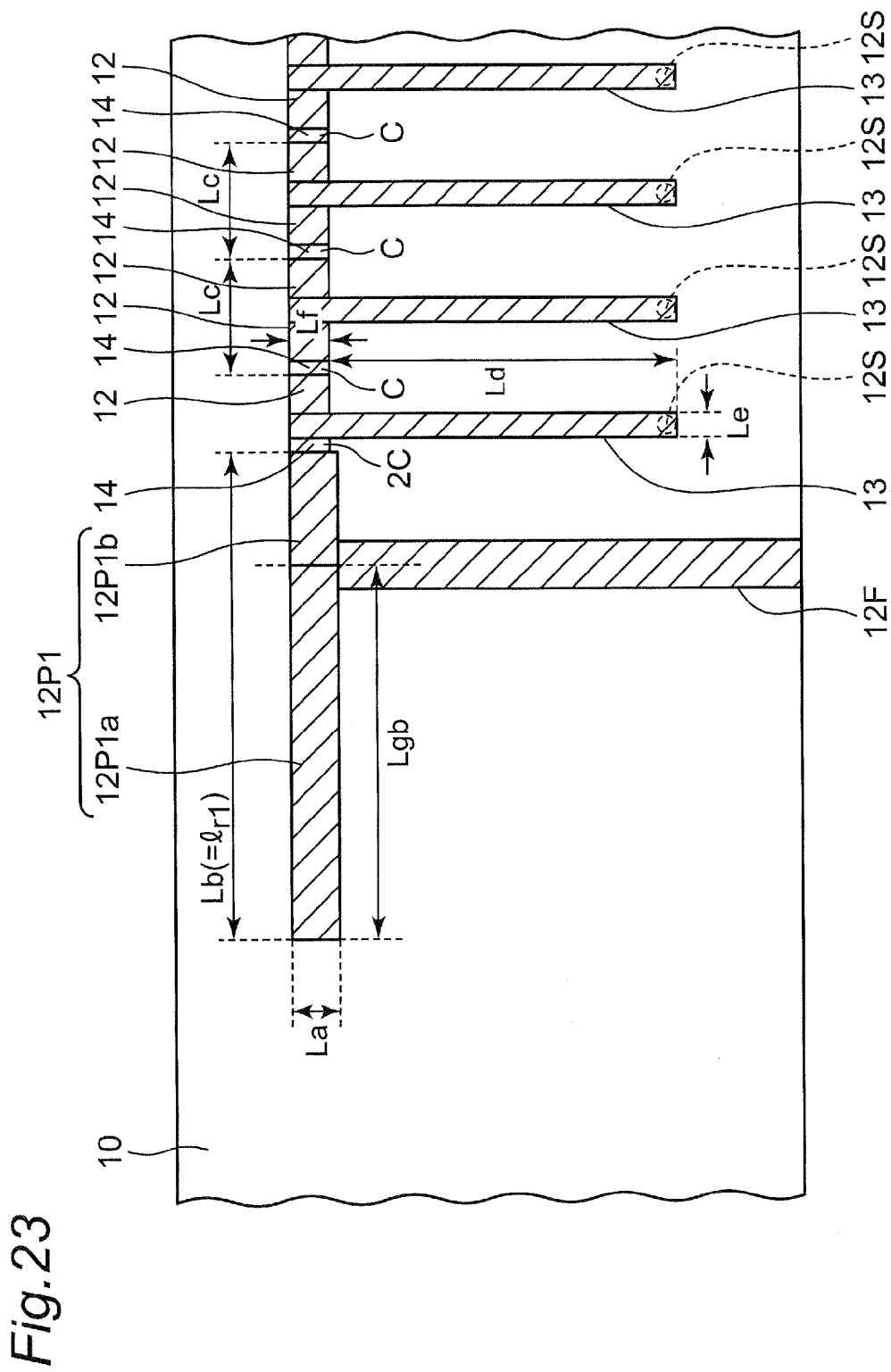
FIG. 23 is a plan view showing a structural parameters La, Lb, Lc, Ld, Le, Lf, Lgb and C of the zeroth-order resonator of FIG. 11 with use of a reciprocal unbalanced composite right/left-handed transmission line 100.

FIG. 23 is a plan view showing a structural parameters La, Lb, Lc, Ld, Le, Lf, Lgb and C of the zeroth-order resonator of FIG. 11 with use of the reciprocal unbalanced composite right/left-handed transmission line 100. In the following simulations and experiments, the structural parameters were set as follows.

(1) A dielectric substrate 10 having a thickness of 0.8 mm and a relative permittivity of 2.62 was used.

(2) The line width Lf of the composite right/left-handed transmission line 100 was set to 1.7 mm, a short-circuit stub conductor 13 having a width Le of 1 mm and a length Ld of 15 mm was connected as a parallel branch to the composite right/left-handed transmission line 100, and a chip capacitor 14 of a capacitance C of 2.4 pF was inserted in the series branch at a pitch period Lc of 5 mm.

(3) The line width La of the strip conductors 12P1 and 12P2 was set to 2.1 mm so that the characteristic impedance became 50 [Ω].

(4) The distance Lgb of the feeding line conductor 12F from the open terminal of the strip conductor 12P1 was fixed to 16 mm so that the impedance of the zeroth-order resonator was matched with the characteristic impedance (50 [Ω]) of the feeding line configured to include the feeding line conductor 12F and the dielectric substrate 10 having the grounding conductor 11 on its reverse face.

(5) The length of the half-wave length ($λ_g/2$) at the operating frequency was set to 42 mm, and the length $l_{r1}$ (length Lb of FIG. 14) and the length $l_{r2}$ were changed so that the sum total of the length $l_{r1}$ of the strip conductor 12P1 and the length $l_{r2}$ of the strip conductor 12P2 became 42 mm.

Figure 24:
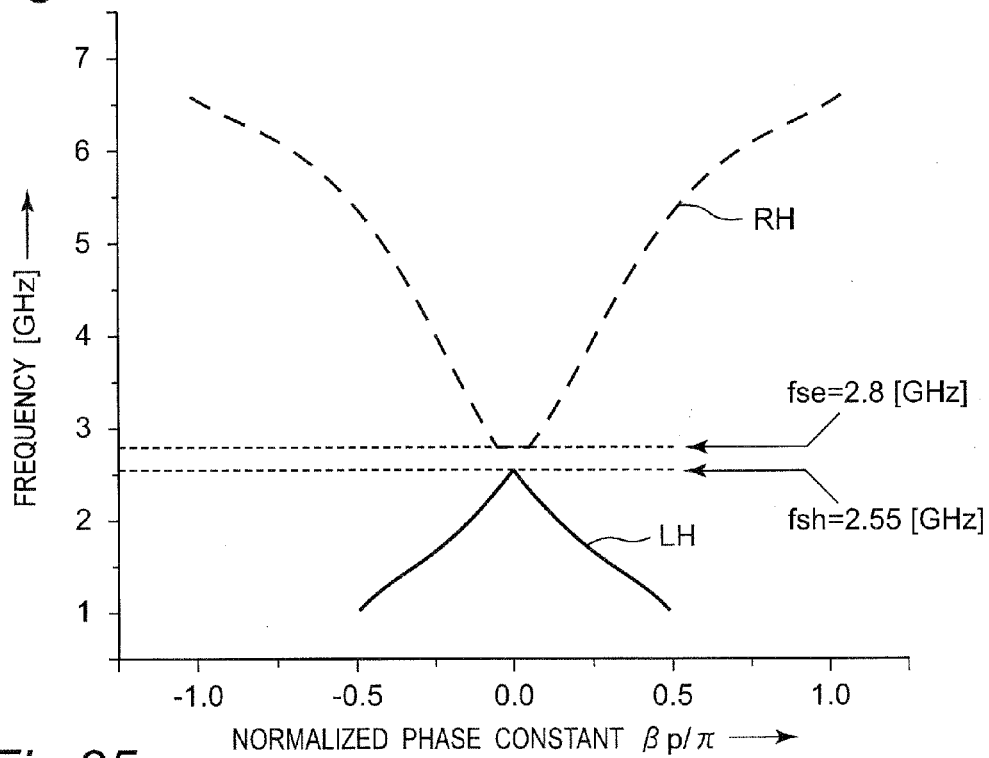
FIG. 24 is a graph showing a dispersion curve (characteristic of angular frequency ω with respect to normalized phase constant βp/π) of an unbalanced composite right-handed/transmission line 100 that constitutes the zeroth-order resonator of FIG. 11 with use of the reciprocal unbalanced composite right/left-handed transmission line 100.

FIG. 24 is a graph showing a dispersion curve (characteristic of angular frequency ω with respect to normalized phase constant βp/π) of the unbalanced composite right-handed/transmission line 100 that constitutes the zeroth-order resonator of FIG. 11 with use of the reciprocal unbalanced composite right/left-handed transmission line 100. As shown in FIG. 24, the capacitance C (2.4 pF) of the capacitor 14 inserted in the series branch is smaller than that with use of the balanced composite right/left-handed transmission line 100 (See FIG. 16), and therefore, a series resonance frequency fse rises up to 2.8 GHz.

Figure 25:
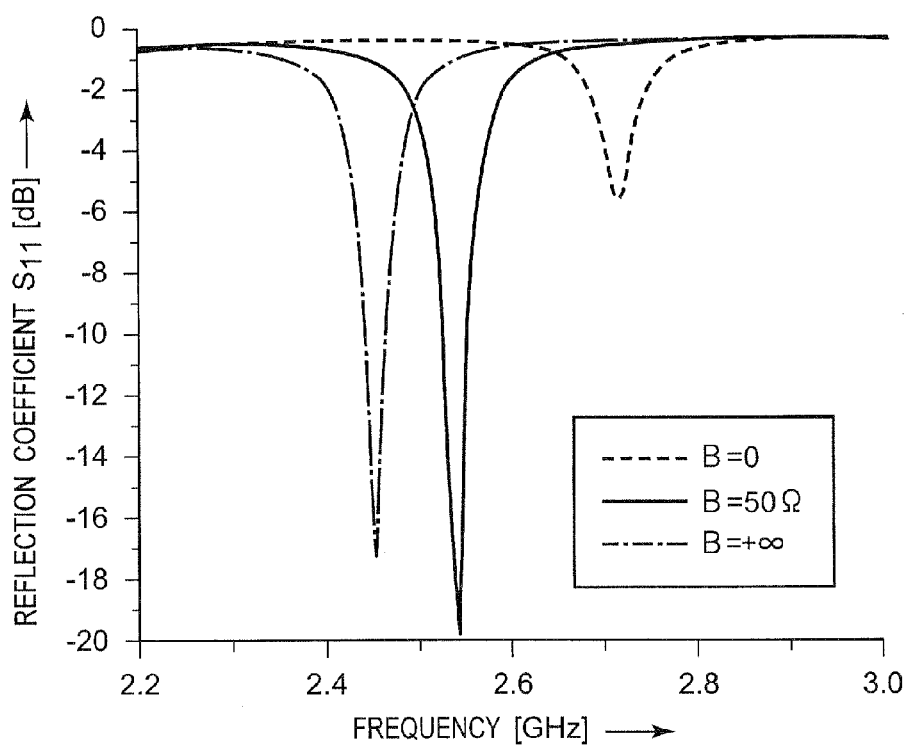
FIG. 25 is a graph showing a frequency characteristic of the reflection coefficient $S_{11}$ (simulation calculation value) of the zeroth-order resonator of FIG. 11 when the reactance B of the reflective impedance element 151R is set to zero, 50 [Ω] and +∞ with use of the reciprocal unbalanced composite right/left-handed transmission line 100.

FIG. 25 is a graph showing a frequency characteristic of the reflection coefficient $S_{11}$ (simulation calculation value) of the zeroth-order resonator of FIG. 11 when the reactance B of the reflective impedance element 151R is set to zero, 50 [Ω] and +∞ with use of the reciprocal unbalanced composite right/left-handed transmission line 100. According to the numerical simulation results of FIG. 25, it can be confirmed that the resonance frequency is continuously changed by changing the line lengths $l_{r1}$ and $l_{r2}$ of the reflective impedance elements 151R and 152R so as to continuously change the reactance B from zero to +∞.

Figure 26A:
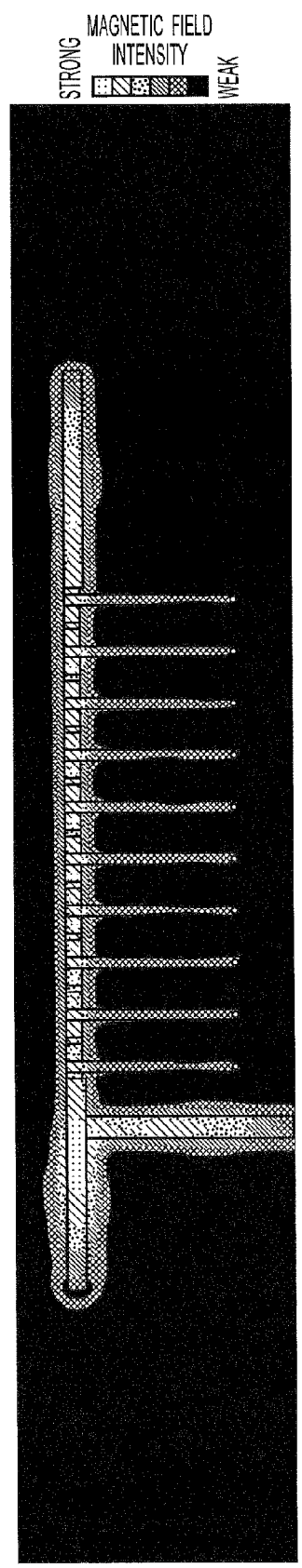
FIG. 26A is a plan view showing a magnetic field intensity distribution (simulation calculation value) of the zeroth-order resonator of FIG. 11 when the reactance B of the reflective impedance element 151R is set to zero with use of the reciprocal unbalanced composite right/left-handed transmission line 100.
Figure 26B:
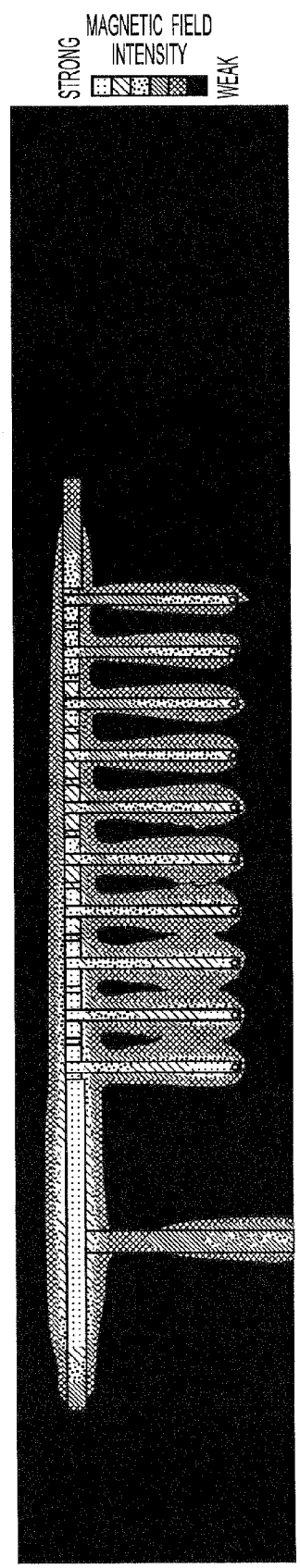
FIG. 26B is a plan view showing a magnetic field intensity distribution (simulation calculation value) of the zeroth-order resonator of FIG. 11 when the reactance B of the reflective impedance element 151R is set to 50 [Ω] with use of the reciprocal unbalanced composite right/left-handed transmission line 100.

FIGS. 26A, 26B and 26C are plan views showing a magnetic field intensity distributions (simulation calculation values) of the zeroth-order resonator of FIG. 11 when the reactance B of the reflective impedance element 151R is set to zero, 50 [Ω] and +∞, respectively, with use of the reciprocal unbalanced composite right/left-handed transmission line 100 in each case. Referring to FIGS. 26A, 26B and 26C, the white regions represent a magnetic field intensity stronger than that of the black regions. As shown in FIG. 26A, it can be confirmed that, when the reactance B is zero, the impedances $Z_{L1}$ and $Z_{L2}$ of the reflective impedance elements 151R and 152R are zero, the series resonance of the series branch is dominant, and the magnetic fields are concentrated on the strip conductor 12 at the center. In addition, as shown in FIG. 26C, it can be confirmed that, when the reactance B is +∞, the impedances $Z_{L1}$ and $Z_{L2}$ of the reflective impedance elements 151R and 152R are +∞, the parallel resonance of the parallel branch is dominant, and the magnetic fields are concentrated on the short-circuit stub conductor 13. Further, as shown in FIG. 26B, it can be confirmed that, when the reactance B is 50 [Ω], the magnetic field intensity is stronger in places closer to the input port (port P1) and the magnetic field intensity exponentially decreases away from the input port since the inside of the composite right/left-handed transmission line 100 is in the forbidden band in which the propagation of waves is not permitted.

Figure 27A:
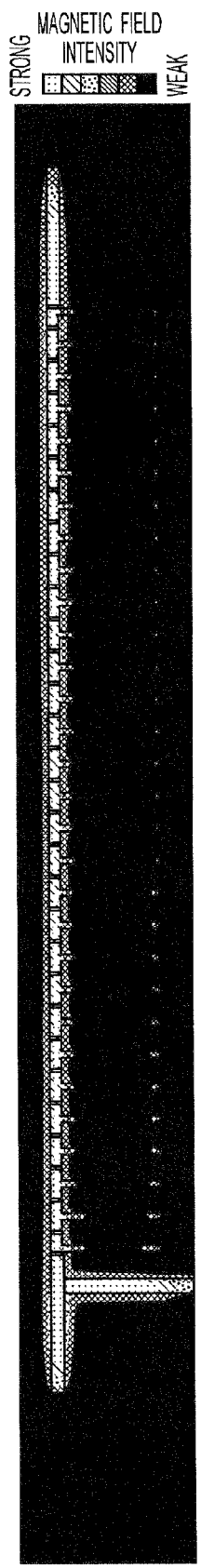
FIG. 27A is a plan view showing a magnetic field intensity distribution (simulation calculation value) of the zeroth-order resonator of FIG. 11 when the number of unit cells is changed to 30 as compared with FIG. 26A.
Figure 27B:
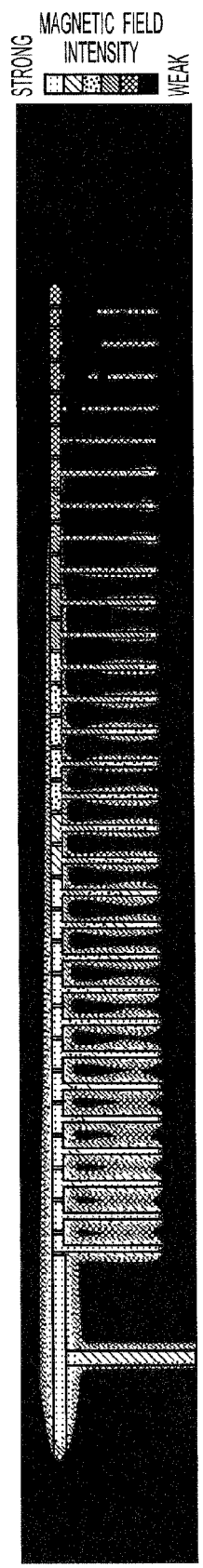
FIG. 27B is a plan view showing a magnetic field intensity distribution (simulation calculation value) of the zeroth-order resonator of FIG. 11 when the number of unit cells is changed to 30 as compared with FIG. 26B.
Figure 27C:
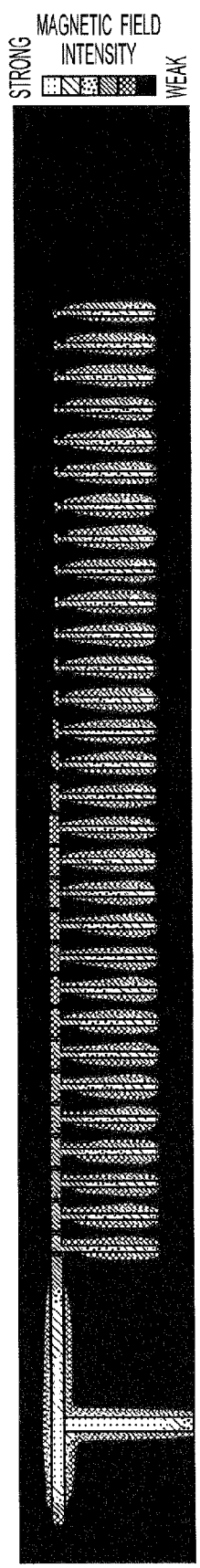
FIG. 27C is a plan view showing a magnetic field intensity distribution (simulation calculation value) of the zeroth-order resonator of FIG. 11 when the number of unit cells is changed to 30 as compared with FIG. 26C.

FIGS. 27A, 27B and 27C are plan views showing a magnetic field intensity distributions (simulation calculation values) of the zeroth-order resonator of FIG. 11 when the number of unit cells is changed from 10 to 30 as compared with FIGS. 26A, 26B and 26C. As shown in FIG. 27A, it can be confirmed that, when the reactance B is zero, the impedances $Z_{L1}$ and $Z_{L2}$ of the reflective impedance elements 151R and 152R are zero, the series resonance of the series branch is dominant, and the magnetic fields are concentrated on the strip conductor 12 at the center. In addition, as shown in FIG. 27C, it can be confirmed that, when the reactance B is the impedances $Z_{L1}$ and $Z_{L2}$ of the reflective impedance elements 151R and 152R are +∞, the parallel resonance of the parallel branch is dominant, and the magnetic fields are almost uniformly concentrated on the short-circuit stub conductor 13. Further, as shown in FIG. 27B, it can be confirmed that, when the reactance B is 50 [Ω], the magnetic field intensity is stronger on the side closer to the input port (port P1) and the magnetic field intensity exponentially decreases away from the input port since the inside of the composite right/left-handed transmission line 100 is in the forbidden band in which the propagation of waves is not permitted. Referring to FIG. 27B, since the line length of the composite right/left-handed transmission line 100 is three times that in the case of FIG. 26B, and the magnetic field intensity exponentially decreases with respect to the distance from the input port, the magnetic field intensity is almost zero at the port P2. However, even in this case, the resonance frequency coincides with the resonance frequency when the reactance B in FIG. 25 is 50 [Ω] in a manner similar to that of FIG. 26B.

7. Configuration of Antenna Apparatus with use of Zeroth-order Resonator according to Embodiment of Present Invention As described above, it is possible to make a change from the resonance state in which the series branch is dominant to the resonance state in which the parallel branch is dominant by changing the terminal condition of the zeroth-order resonator (See FIG. 7) of the embodiment of the present invention to be equivalent from both the short-circuited terminals to both the open terminals. In addition, conversely, it is possible to make a change from the resonance state in which the parallel branch is dominant to the resonance state in which the series branch is dominant by changing the terminal condition from both the open terminals to both the short-circuited terminals. By utilizing the zeroth-order resonator as an antenna apparatus and changing the terminal condition of the resonator mechanically or electrically or a method that concurrently has both of them, the polarization characteristics of radiation waves or received radio waves are changed.

Figure 28:
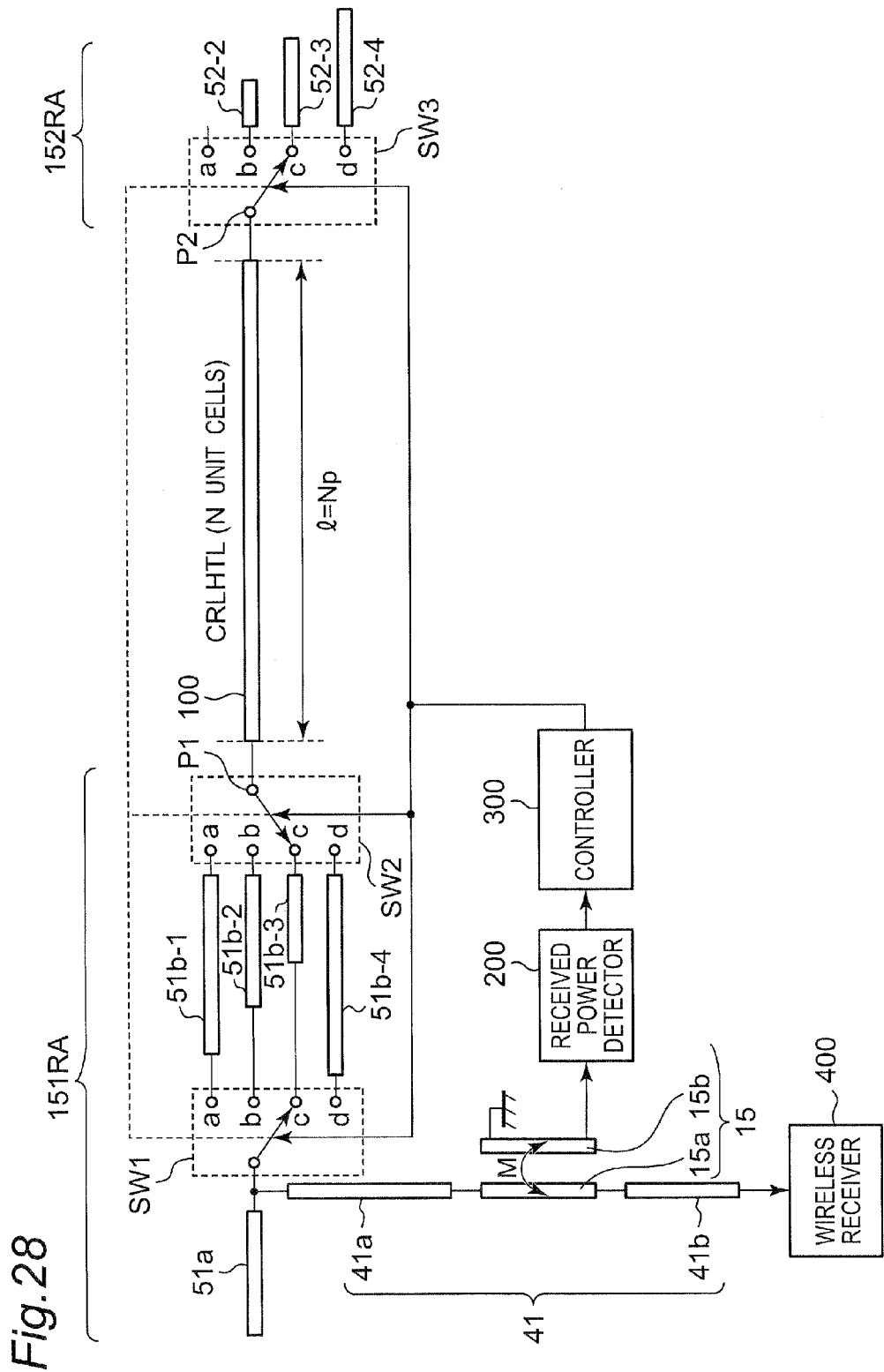
FIG. 28 is a block diagram showing a configuration of a first implemental example of an antenna apparatus with use of the zeroth-order resonator of FIG. 7.

FIG. 28 is a block diagram showing a configuration of a first implemental example of the antenna apparatus with use of the zeroth-order resonator of FIG. 7. The antenna apparatus of FIG. 28 is configured to include the following:

(a) a zeroth-order resonator configured to include a composite right/left-handed transmission line 100 having ports P1 and P2, a reflective impedance circuit 151RA connected to the port P1, and a reflective impedance circuit 152RA connected to the port P2;

(b) a feeding line 41 (feeding circuit) that has micro-strip lines 41a and 41b, and outputs a microwave signal received by the zeroth-order resonator;

(c) a directional coupler 15 configured to include a micro-strip line 15a connected between the micro-strip lines 41a and 41b, and a micro-strip line 15b placed so as to be adjacent and to be electromagnetically coupled to the micro-strip line 15a;

(d) a received power detector 200 that detects part of the power of the received microwave signal flowing in the micro-strip line 15a by using the directional coupler 15;

(e) a wireless receiver 400 that receives an input of the received microwave signal outputted from the micro-strip line 41b; and (f) a controller 300.

Referring to FIG. 28, the composite right/left-handed transmission line 100 may be reciprocal or nonreciprocal and be the balanced type or the unbalanced type. In addition, the parallel branch is formed to be perpendicular to the series branch in the composite right/left-handed transmission line 100.

In addition, referring to FIG. 28, the reflective impedance circuit 151RA is configured to include switches SW1 and SW2, and micro-strip lines 51a, 51b-1, 51b-2, 51b-3 and 51b-4. In addition, the reflective impedance circuit 152RA is configured to include a switch SW3, and micro-strip lines 52-2, 52-3 and 52-4. The length of the micro-strip line 51b-1 is set so that the sum total of the length of the micro-strip line 51a and the length of the micro-strip line 51b-1 becomes $\lambda_g/2$, the length of the micro-strip line 51b-2 is set so that the sum total of the length of the micro-strip line 51a and the length of the micro-strip line 51b-2 becomes $\lambda_g/8$, and the length of the micro-strip line 51b-3 is set so that the sum total of the length of the micro-strip line 51a and the length of the micro-strip line 51b-3 becomes $\lambda_g/4$. Further, the length of the micro-strip line 52-2 is set to $\lambda_g/8$, and the length of the micro-strip line 52-3 is set to $\lambda_g/4$. The length of the micro-strip line 51b-4 is set so that the sum total of the length of the micro-strip line 51a and the length of the micro-strip line 51b-4 becomes $5\lambda_g/8$, and the length of the micro-strip line 52-4 is set to $3\lambda_g/8$. Still further, the length of the micro-strip line 51a is set so that a voltage-to-current ratio (impedance) spatially changed by standing waves generated in the reflective impedance circuit 151RA of the micro-strip line is matched with the characteristic impedance of the feeding line 41. The switches SW1 and SW2, and the switch SW3 are impedance changing means of the reflective impedance circuits 151RA and 152RA.

Referring to FIG. 28, the switches SW1, SW2 and SW3 are switched by the controller 300 to be interlocked with each other. When the switches SW1, SW2 and SW3 are each switched to a contact point "a", the micro-strip line 51b-1 is connected between the micro-strip line 51a and the port P1, and the port P2 becomes an open terminal. By this operation, the impedances of the reflective impedance circuits 151RA and 152RA become +∞, and the polarization direction of received radio waves is directed to the direction perpendicular to the composite right/left-handed transmission line 100. When the switches SW1, SW2 and SW3 are each switched to a contact point "b", the micro-strip line 51b-2 is connected between the micro-strip line 51b-1 and the port P1, and the micro-strip line 52-2 is connected to the port P2. By this operation, the impedance of the reflective impedance circuit 151RA becomes 50 j [Ω], the impedance of the reflective impedance circuit 152RA becomes −50 j [Ω], and the polarization direction of the received radio waves is directed at an angle (45 degrees) between the direction parallel to the composite right/left-handed transmission line 100 and the direction perpendicular to the composite right/left-handed transmission line 100. Further, when the switches SW1, SW2 and SW3 are each switched to a contact point "c", the micro-strip line 51b-3 is connected between the micro-strip line 51b-1 and the port P1, and the micro-strip line 52-3 is connected to the port P2. By this operation, the impedances of the reflective impedance circuits 151RA and 152RA become zero, and the polarization direction of the received radio waves is directed to the direction parallel to the composite right/left-handed transmission line 100. In addition, when the switches SW1, SW2 and SW3 are each switched to a contact point "d", the micro-strip line 51b-4 is connected between the micro-strip line 51a and the port P1, and the micro-strip line 52-4 is connected to the port P2. By this operation, the impedance of the reflective impedance circuit 151RA becomes −50 j [Ω], and the impedance of the reflective impedance circuit 152RA becomes 50 j [Ω]. The polarization direction of the received radio waves is directed at an angle (45 degrees) between the direction parallel to the composite right/left-handed transmission line 100 and the direction perpendicular to the composite right/left-handed transmission line 100 and is directed to be perpendicular to the direction when the switches SW1, SW2 and SW3 are each switched to the contact point "b".

The controller 300 switches the switches SW1, SW2 and SW3 so that the received power detected by the received power detector 200 becomes maximized. Therefore, according to the antenna apparatus of FIG. 28, the polarization direction can be discretely switched to the optimal polarization direction in which the received power becomes maximized.

Figure 29:
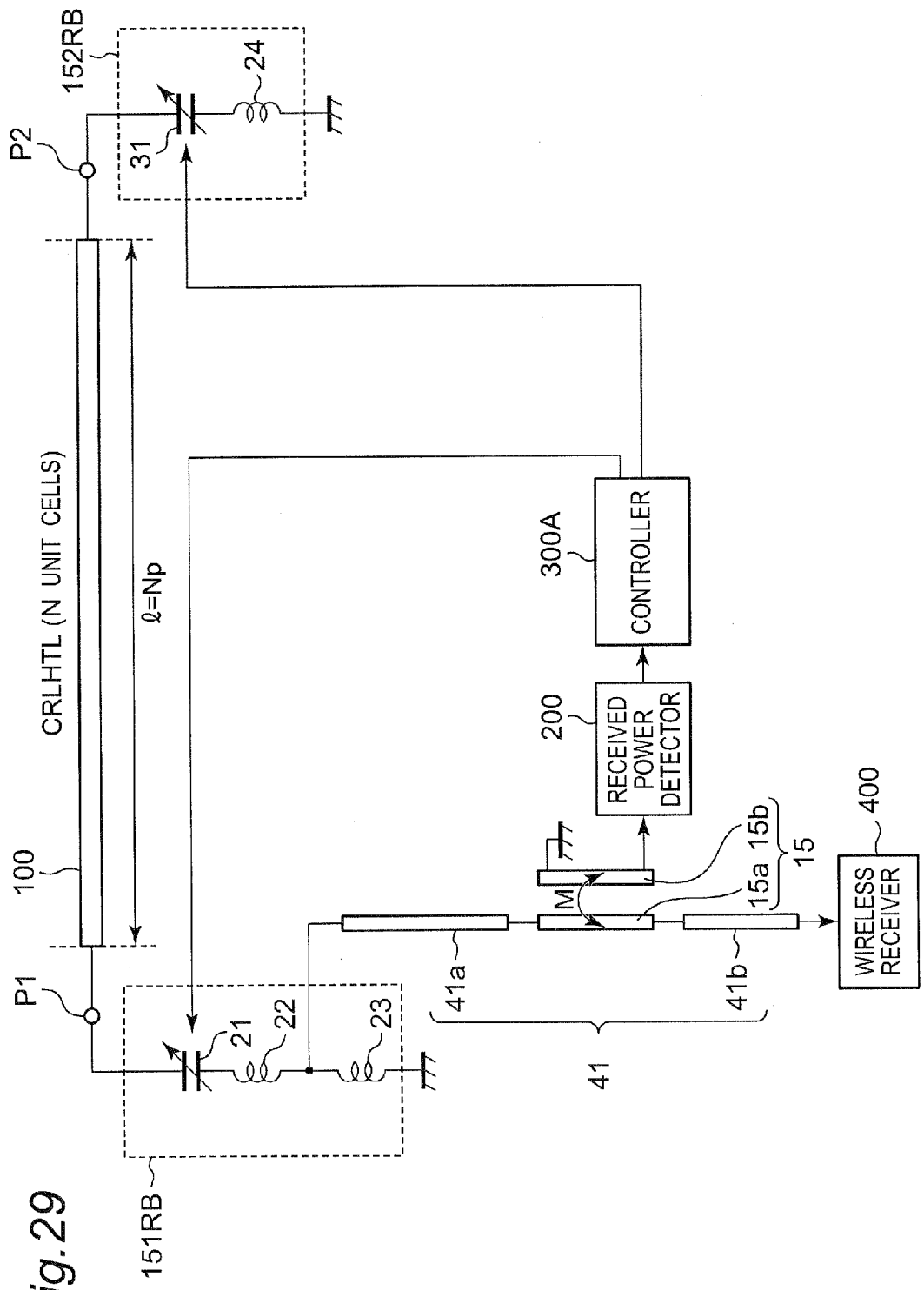
FIG. 29 is a block diagram showing a configuration of a second implemental example of an antenna apparatus with use of the zeroth-order resonator of FIG. 7.

FIG. 29 is a block diagram showing a configuration of the second implemental example of the antenna apparatus with use of the zeroth-order resonator of FIG. 7. The antenna apparatus of FIG. 29 is configured to includes the following:

(a) a zeroth-order resonator having a composite right/left-handed transmission line 100 having ports P1 and P2, a reflective impedance circuit 151RB connected to the port P1, and a reflective impedance circuit 152RB connected to the port P2;

(b) a feeding line 41 (feeding circuit) having micro-strip lines 41a and 41b, and outputs a microwave signal received by the zeroth-order resonator;

(c) a directional coupler 15 configured to include a micro-strip line 15a connected between the micro-strip lines 41a and 41b, and a micro-strip line 15b placed to be adjacent and to be electromagnetically coupled to the micro-strip line 15a;

(d) a received power detector 200 that detects part of the power of the received microwave signal flowing in the micro-strip line 15a by using the directional coupler 15;

(e) a wireless receiver 400 that receives an input of the received microwave signal outputted from the micro-strip line 41b; and (f) a controller 300A.

Referring to FIG. 29, the composite right/left-handed transmission line 100 may be reciprocal or nonreciprocal and be the balanced type or the unbalanced type. In addition, the parallel branch is formed to be perpendicular to the series branch in the composite right/left-handed transmission line 100.

In addition, referring to FIG. 29, the reflective impedance circuit 151RB is configured to include a varactor diode 21 and inductors 22 and 23, which are connected in series between the port P1 and the ground potential. In this case, one terminal of the strip conductor 41a that constitutes a feeding line is connected to a connection point of the inductors 22 and 23. In addition, the reflective impedance circuit 152RB is configured to include a varactor diode 31 and an inductor 24, which are connected in series between the port P2 and the ground potential. In addition, the element values of the inductors 22 and 23 are set so that the impedance of the zeroth-order resonator is matched with the characteristic impedance of the feeding line 41. The varactor diodes 21 and 31 are impedance changing means of the reflective impedance circuits 151RB and 152RB, respectively.

The controller 300A changes reverse bias voltages applied to the varactor diodes 21 and 31 so that the impedance of the reflective impedance circuit 151RB becomes a predetermined complex number that substantially has no real part or preferably a pure imaginary number, the impedance of the reflective impedance circuit 152RB becomes a complex number that is substantially conjugate with the impedance of the reflective impedance circuit 151RB or preferably a conjugate pure imaginary number, and the received power detected by the received power detector 200 becomes maximized. Therefore, according to the antenna apparatus of FIG. 29, the polarization direction can be switched to the optimal polarization direction in which the received power becomes maximized. In addition, although the antenna apparatus of FIG. 28 has been selected from the four directions, the polarization direction can be continuously changed in an arbitrary direction between the direction parallel to the longitudinal direction of the composite right/left-handed transmission line 100 to the direction perpendicular to the longitudinal direction of the composite right/left-handed transmission line 100 according to the present implemental example.

Referring to FIG. 29, a variable-reactance element may be used in place of the varactor diodes 21 and 31.

Figure 30:
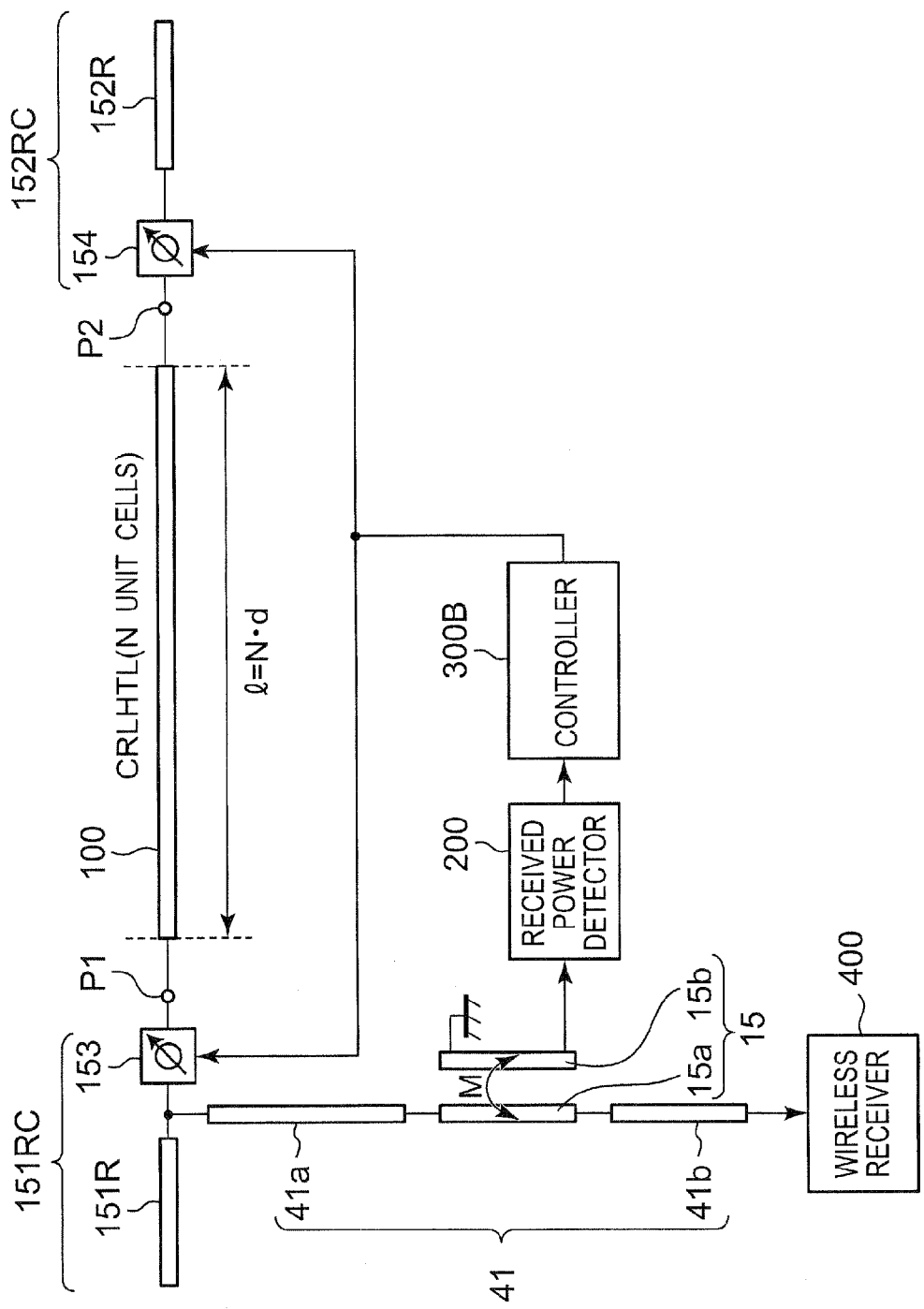
FIG. 30 is a block diagram showing a configuration of a third implemental example of an antenna apparatus with use of the zeroth-order resonator of FIG. 7.

FIG. 30 is a block diagram showing a configuration of the third implemental example of the antenna apparatus with use of the zeroth-order resonator of FIG. 7. The antenna apparatus of FIG. 30 is configured to include the following:

(a) a zeroth-order resonator having a composite right/left-handed transmission line 100 having ports P1 and P2, a reflective impedance circuit 151RC connected to the port P1, and a reflective impedance circuit 152RC connected to the port P2;

(b) a feeding line 41 (feeding circuit) having micro-strip lines 41a and 41b, and outputs a microwave signal received by the zeroth-order resonator;

(c) a directional coupler 15 configured to include a micro-strip line 15a connected between the micro-strip lines 41a and 41b, and a micro-strip line 15b placed to be adjacent and to be electromagnetically coupled to the micro-strip line 15a;

(d) a received power detector 200 that detects part of the power of the received microwave signal flowing in the micro-strip line 15a by using the directional coupler 15;

(e) a wireless receiver 400 that receives an input of the received microwave signal outputted from the micro-strip line 41b; and (f) a controller 300B.

Referring to FIG. 30, the composite right/left-handed transmission line 100 may be reciprocal or nonreciprocal and be the balanced type or the unbalanced type. In addition, the parallel branch is formed to be perpendicular to the series branch in the composite right/left-handed transmission line 100.

In addition, referring to FIG. 30, the reflective impedance circuit 151RC has a phase shifter 153 and a reflective element 151R connected to the port P1, and the reflective impedance circuit 152RC has a phase shifter 154 and a reflective element 152R connected to the port P2. The antenna apparatus of FIG. 30 is characterized by having the phase shifter 153 between the port P1 and the reflective element 151R to change the impedance (i.e., electrical length) of the reflective element 151R seen from the port P1, and the phase shifter 154 between the port P2 and the reflective element 152R to change the impedance (i.e., electrical length) of the reflective element 152R seen from the port P2.

The controller 300B changes the voltages applied to the phase shifters 153 and 154 to be interlocked with each other, so that the impedance of the reflective impedance circuit 151R becomes a predetermined complex number that substantially has no real part or preferably a pure imaginary number, the impedance of the reflective impedance circuit 152R becomes a complex number that is substantially conjugate with the impedance of the reflective impedance circuit 151R or preferably a conjugate pure imaginary number, and the received power detected by the received power detector 200 becomes maximized, and this leads to change in the amount of phase shift of them. Therefore, according to the antenna apparatus of FIG. 30, the polarization direction can be switched to the optimal polarization direction in which the received power becomes maximized. In addition, although the polarization direction has been selected from the four directions in the antenna apparatus of FIG. 28, the polarization direction can be continuously changed in an arbitrary direction between the direction parallel to the longitudinal direction of the composite right/left-handed transmission line 100 to the direction perpendicular to the longitudinal direction of the composite right/left-handed transmission line 100 according to the present implemental example.

In addition, although the feeding line has been provided on the reflective impedance circuits 151RA, 151RB and 151RC side in FIGS. 28, 29 and 30, the present invention is not limited to this, and the feeding line may be provided on the reflective impedance circuits 152RA, 152RB and 152RC side.

In addition, the example in which the zeroth-order resonator of FIG. 7 of the present invention is applied to the receiving antenna apparatus has been described with reference to FIGS. 28 to 30. However, the present invention is not limited to this, and a transmitting antenna apparatus can be provided by the zeroth-order resonator of FIG. 7, and a feeding circuit that is connected to the reflective impedance element 151R or 152R and feeds the zeroth-order resonator with the microwave signal. Further, it is acceptable to provide first impedance changing means that changes the impedance of the reflective impedance element 151R for the reflective impedance element 151R, provide second impedance changing means that changes the impedance of the reflective impedance element 152R for the reflective impedance element 152R, and control the first and second impedance changing means so as to change the polarization of radio waves radiated from the antenna apparatus.

8. Configuration of Band-stop Filter Apparatus with use of Zeroth-order Resonator according to Embodiment of Present Invention As described with reference to FIG. 25, the resonance frequency can be continuously changed by continuously changing the reactance B from zero to +∞ with use of the unbalanced composite right/left-handed transmission line 100. Taking advantage of this fact, a tunable band-stop filter apparatus capable of changing the band-stop frequency can be actualized. In this case, the band-stop frequency concretely means a band-stop width having a predetermined width centered about the center frequency of the stop-band.

Figure 31:
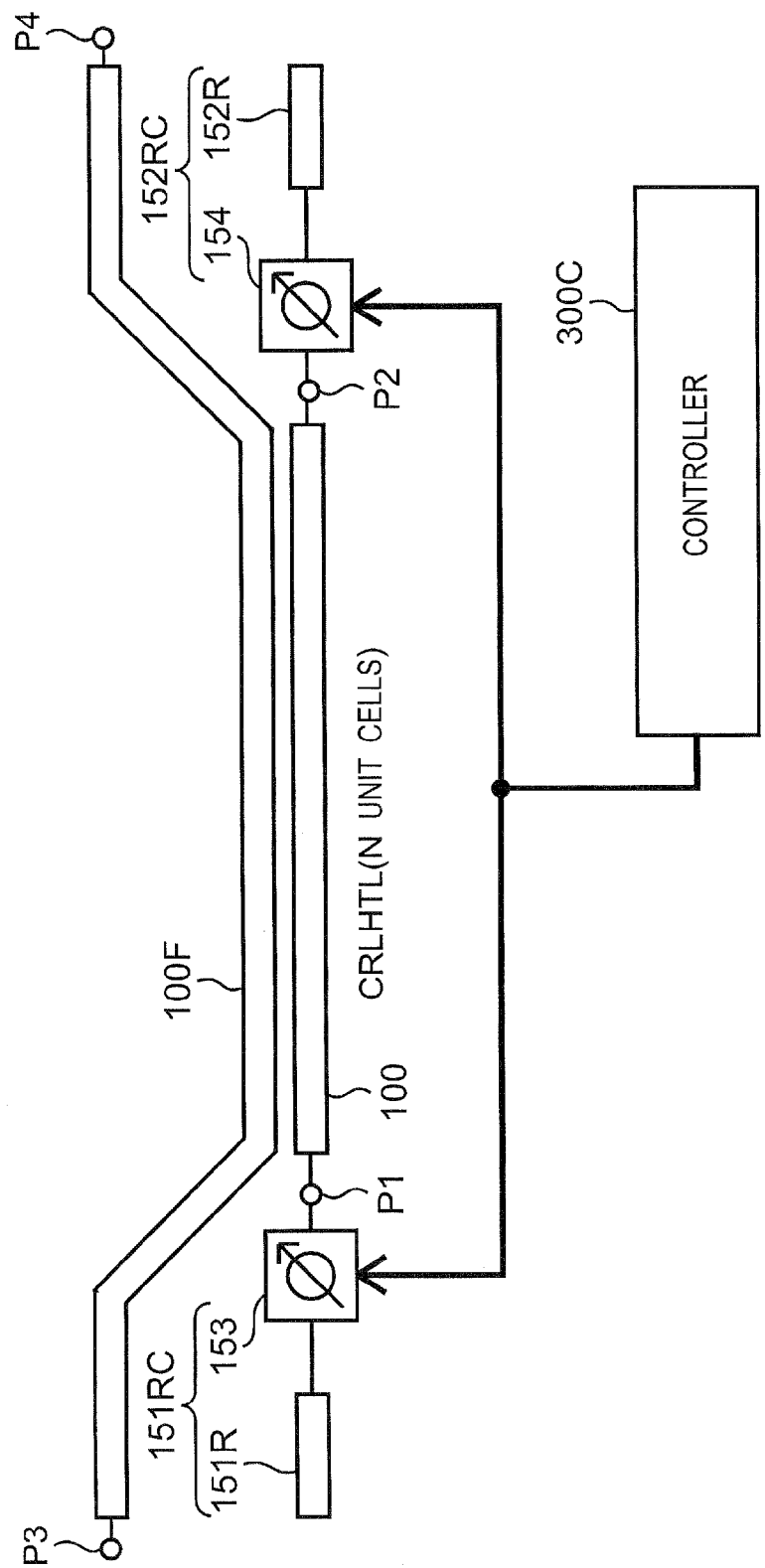
FIG. 31 is a block diagram showing a configuration of an implemental example of a band-stop filter apparatus with use of the zeroth-order resonator of FIG. 7.
Figure 32:
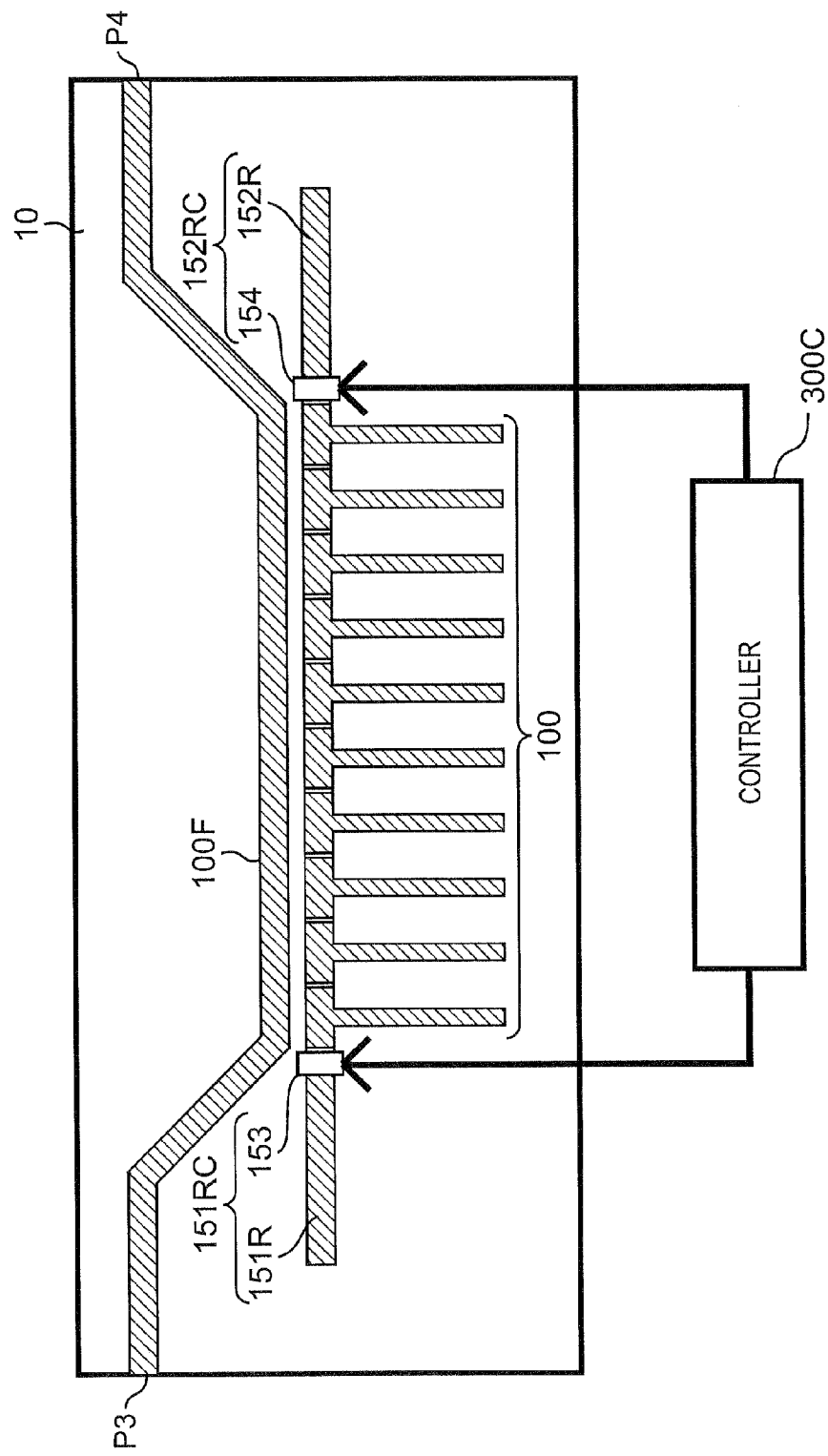
FIG. 32 is a plan view showing a configuration of the band-stop filter apparatus of FIG. 31.

FIG. 31 is a block diagram showing a configuration of an implemental example of the band-stop filter apparatus with use of the zeroth-order resonator of FIG. 7. In addition, FIG. 32 is a plan view showing a configuration of the band-stop filter apparatus of FIG. 31. The band-stop filter apparatus of FIGS. 31 and 32 is configured to include the following:

(a) a zeroth-order resonator configured to include the unbalanced composite right/left-handed transmission line 100 having ports P1 and P2, a reflective impedance circuit 151RC connected to the port P1, and a reflective impedance circuit 152RC connected to the port P2;

(b) a controller 300C; and (c) a transmission line 100F having an input port 3 and an output port 4.

In this case, referring to FIG. 32, the composite right/left-handed transmission line 100, and the reflective elements 151R and 152R are formed in a manner similar to that of FIG. 11. In addition, the transmission line 100F is formed parallel to the composite right/left-handed transmission line 100 so as to be adjacent and to be electromagnetically coupled to the composite right/left-handed transmission line 100.

In addition, referring to FIG. 31, the reflective impedance circuit 151RC has a phase shifter 153 and a reflective element 151R connected between the port P1 and the port P3, and the reflective impedance circuit 152RC has a phase shifter 154 and a reflective element 152R connected between the port P2 and the port P4. Referring to FIG. 31, the controller 300C changes the voltages applied to the phase shifters 153 and 154 to be interlocked with each other, so that the impedance of the reflective impedance circuit 151R becomes a predetermined complex number that substantially has no real part or preferably a pure imaginary number, the impedance of the reflective impedance circuit 152R becomes a complex number that is substantially conjugate with the impedance of the reflective impedance circuit 151R or preferably a conjugate pure imaginary number, and this leads to change in the amount of phase shift of them. Therefore, according to the band-stop filter apparatus of FIG. 31, the band-stop frequency can be continuously changed to an arbitrary frequency between the series resonance frequency to the parallel resonance frequency.

Figure 33:
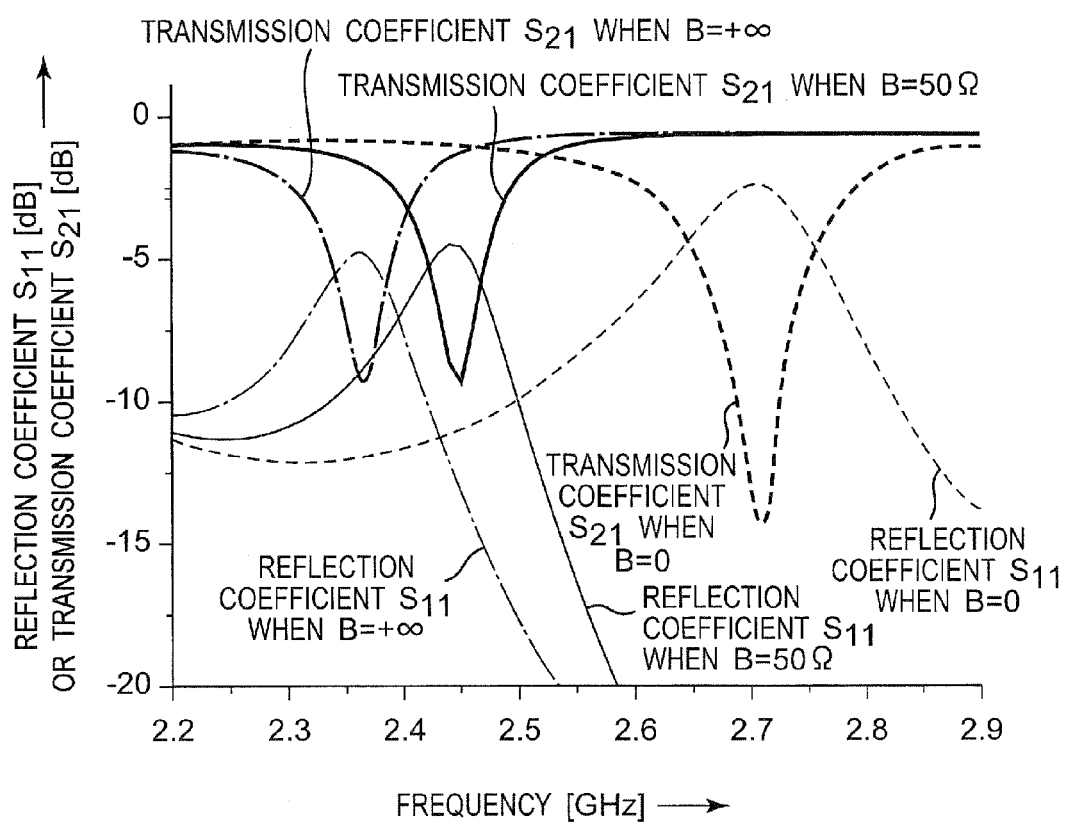
FIG. 33 is a graph showing a frequency characteristics (simulation calculation values) of a reflection coefficient $S_{11}$ and a transmission coefficient $S_{21}$ when the reactance B of the reflective impedance element 151R is set to zero, 50 [Ω] and +∞, in the band-stop filter apparatus of FIG. 31.

FIG. 33 is a graph showing a frequency characteristics (simulation calculation values) of the reflection coefficient $S_{11}$ and a transmission coefficient $S_{21}$ when the reactance B of the reflective impedance element 151R is set to zero, 50 [Ω] and +∞, in the band-stop filter apparatus of FIG. 31. Referring to FIG. 33, the structural parameters of the zeroth-order resonator are identical to the structural parameters used in the simulation of FIG. 24. As shown in FIG. 33, the band-stop frequency was 2.7 GHz when the reactance B was zero (both the short-circuited terminals), the band-stop frequency was 2.35 GHz when the reactance B was +∞ (both the open terminals), and the band-stop frequency was 2.45 GHz when the reactance B was 50 [Ω]. The tuning ranges of these band-stop frequencies correspond to the band-gap region in the dispersion curve of FIG. 24. Referring to FIG. 31, it can be considered that the feeding transmission line 100F is placed in the vicinity of the zeroth-order resonator, and therefore, both of them are coupled together, consequently shifting the stop-band to the lower frequency side in FIG. 33 as compared with the band-gap of FIG. 24.

Referring to FIG. 31, it is acceptable to use the reflective impedance circuits 151RA and 152RA of FIG. 28 or the reflective impedance circuits 151RB and 152RB of FIG. 29 in place of the reflective impedance circuits 151RC and 152RC. In addition, although the composite right/left-handed transmission line 100 is reciprocal in the present implemental example, it may be nonreciprocal.

9. Configuration of Band-pass Filter Apparatus with use of Zeroth-order Resonator according to Embodiment of Present Invention As described with reference to FIG. 25, the resonance frequency can be continuously changed by continuously changing the reactance B from zero to +∞ with use of the unbalanced composite right/left-handed transmission line 100. Taking advantage of this fact, a tunable band-pass filter apparatus capable of changing the band-pass frequency can be actualized. In this case, the band-pass frequency concretely means a band-pass width having a predetermined width centered about the center frequency of the pass-band.

Figure 34:
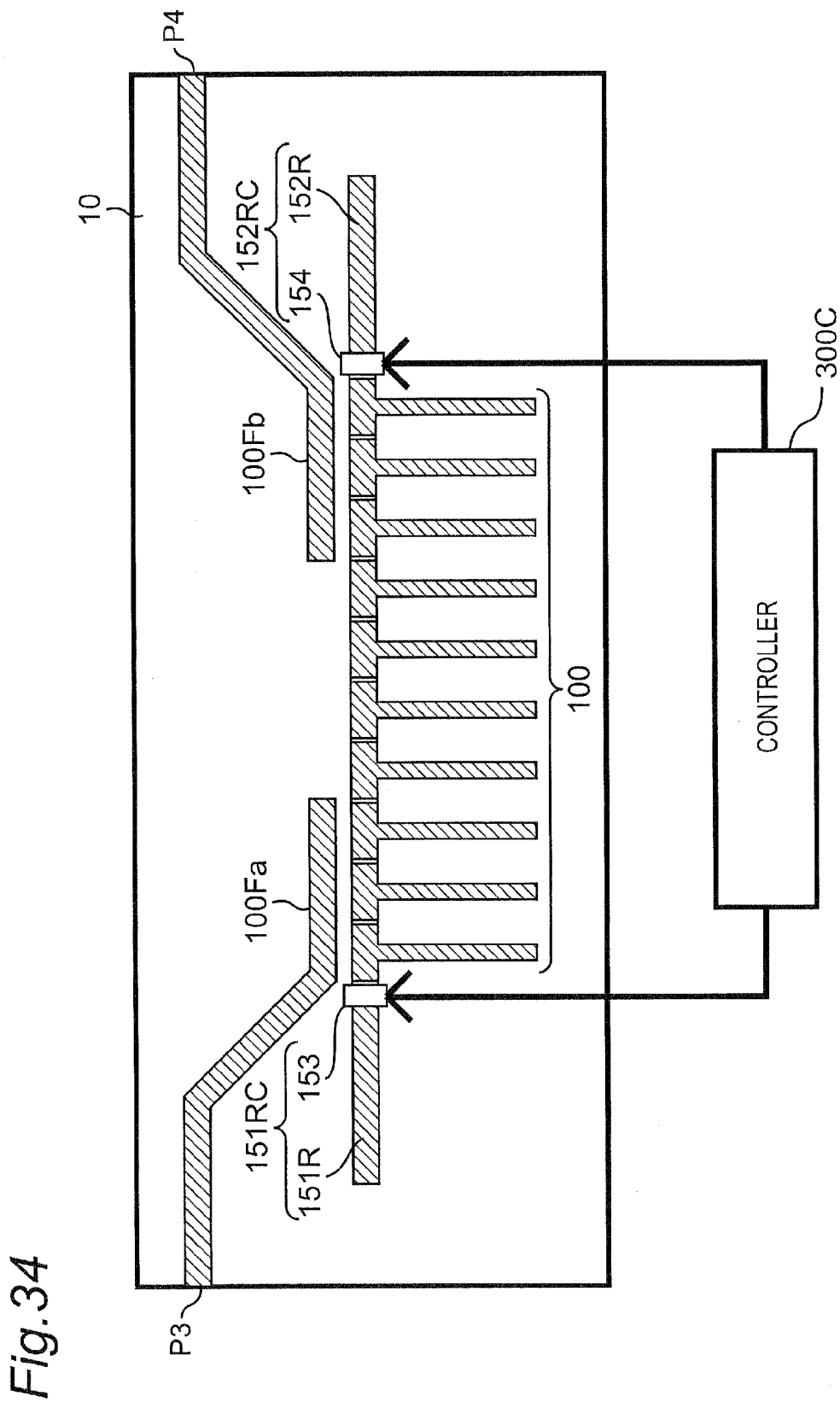
FIG. 34 is a plan view showing a configuration of an implemental example of a band-pass filter apparatus with use of the zeroth-order resonator of FIG. 7.

FIG. 34 is a plan view showing a configuration of an implemental example of the band-pass filter apparatus with use of the zeroth-order resonator of FIG. 7. The band-pass filter apparatus of FIG. 34 is configured to include the following:

(a) a zeroth-order resonator configured to include the unbalanced composite right/left-handed transmission line 100 having ports P1 and P2, a reflective impedance circuit 151RC connected to the port P1, and a reflective impedance circuit 152RC connected to the port P2;
(b) a controller 300C;
(c) a transmission line 100Fa having an input port 3; and
(d) an output transmission line 100Fb having an output port 4.

In this case, as shown in FIG. 34, the composite right/left-handed transmission line 100, and the reflective elements 151R and 152R are formed in a manner similar to that of FIG. 11. In addition, the transmission lines 100Fa and 100Fb are each formed parallel to the composite right/left-handed transmission line 100 so as to be adjacent and to be electromagnetically coupled to the composite right/left-handed transmission line 100. Further, an interval between the transmission line 100Fa and the transmission line 100 is set to become 0.1 mm.

In addition, as shown in FIG. 34, the reflective impedance circuit 151RC has a phase shifter 153 and a reflective element 151R connected to the port P1, and the reflective impedance circuit 152RC has a phase shifter 154 and a reflective element 152R connected to the port P2. Referring to FIG. 34, the controller 300C changes the voltages applied to the phase shifters 153 and 154 to be interlocked with each other, so that the impedance of the reflective impedance circuit 151RC becomes a predetermined complex number that substantially has no real part or preferably a pure imaginary number, and the impedance of the reflective impedance circuit 152RC becomes a complex number that is substantially conjugate with the impedance of the reflective impedance circuit 151RC or preferably a conjugate pure imaginary number, and this leads to shifting of the amount of phase shift of them. Therefore, according to the band-pass filter apparatus of FIG. 34, the band-pass frequency can be continuously changed to an arbitrary frequency between the series resonance frequency to the parallel resonance frequency.

Figure 35:
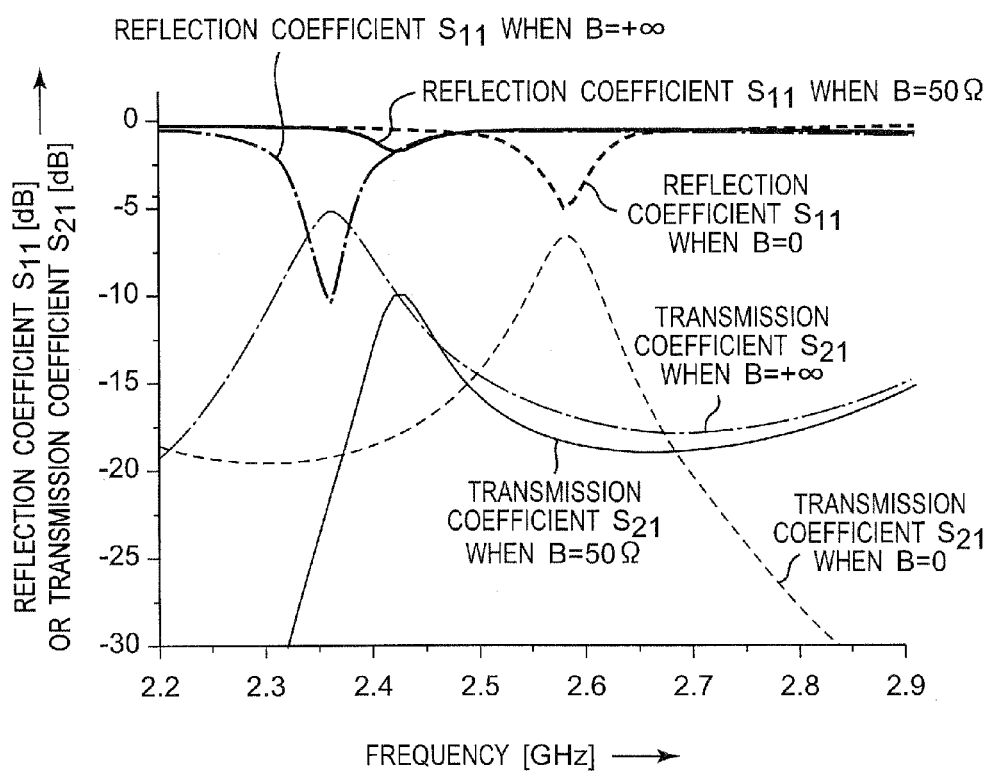
FIG. 35 is a graph showing a frequency characteristics (simulation calculation values) of the reflection coefficient $S_{11}$ and the transmission coefficient $S_{21}$ when the reactance B of the reflective impedance element 151R is set to zero, 50 [Ω] and +∞, in the band-pass filter apparatus of FIG. 34.

FIG. 35 is a graph showing a frequency characteristics (simulation calculation values) of the reflection coefficient $S_{11}$ and the transmission coefficient S21 when the reactance B of the reflective impedance element 151R is set to zero, 50 [Ω] and +∞, in the band-pass filter apparatus of FIG. 34. Referring to FIG. 35, the structural parameters of the zeroth-order resonator are identical to the structural parameters used in the simulation of FIG. 24. As shown in FIG. 35, the band-pass frequency was 2.6 GHz when the reactance B was zero (both the short-circuited terminals), the band-pass frequency was 2.3 GHz when the reactance B was +∞ (both the open terminals), and the band-pass frequency was 2.4 GHz when the reactance B was 50 [Ω]. The tuning ranges of these band-pass frequencies correspond to the band-gap region in the dispersion curve of FIG. 24. Referring to FIG. 34, it can be considered that the feeding transmission lines 100Fa and 100Fb are placed in the vicinity of the zeroth-order resonator, and therefore, both of them are coupled together, consequently shifting the pass-band to the lower frequency side in FIG. 35 as compared with the band-gap region of FIG. 24.

Figure 36:
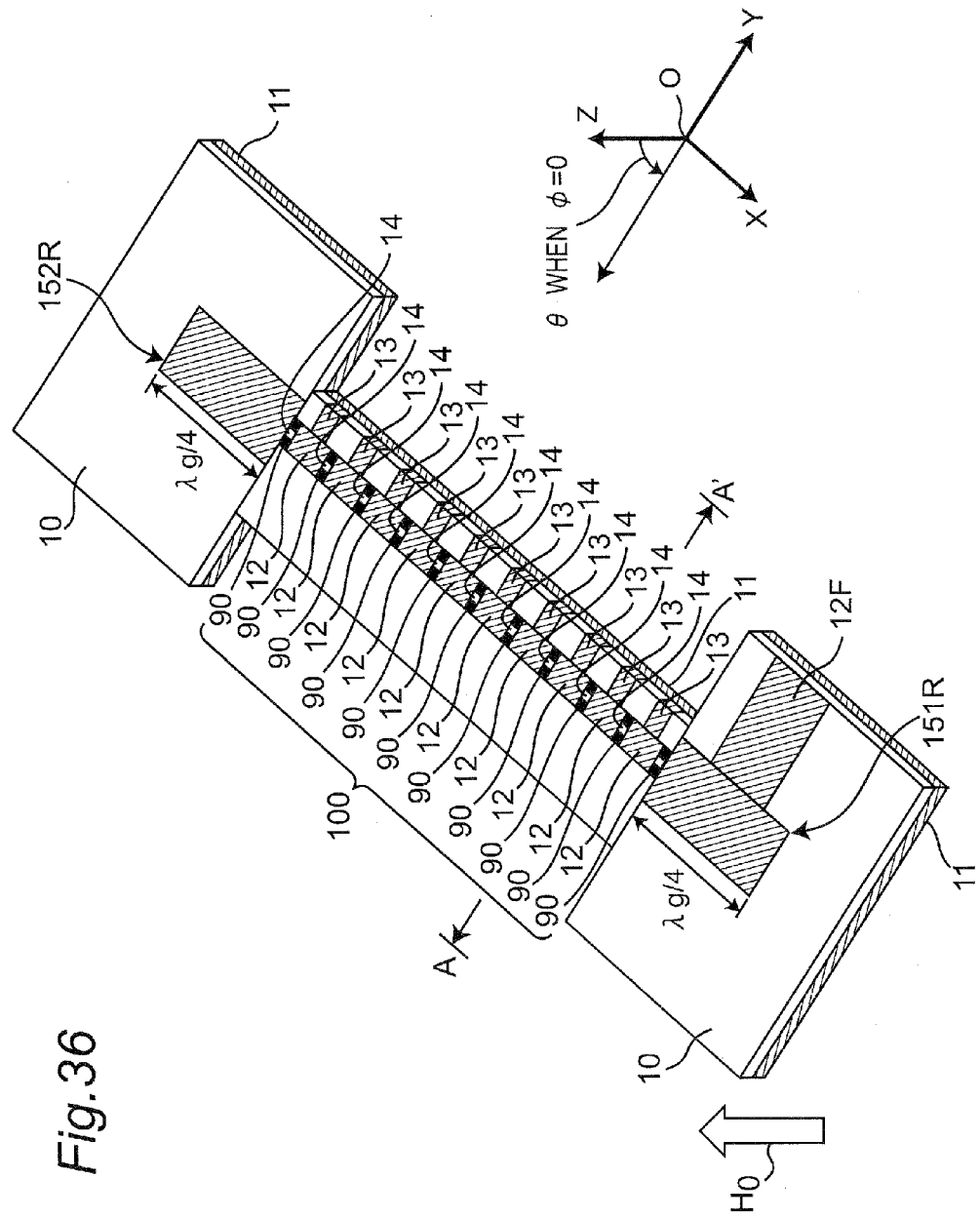
FIG. 36 is a perspective view showing a concrete configuration of the zeroth-order resonator of FIG. 7 when a composite right/left-handed transmission line 100 is provided in which the number N of the unit cells constituting the zeroth-order resonator is ten and which is nonreciprocal.
Figure 37:
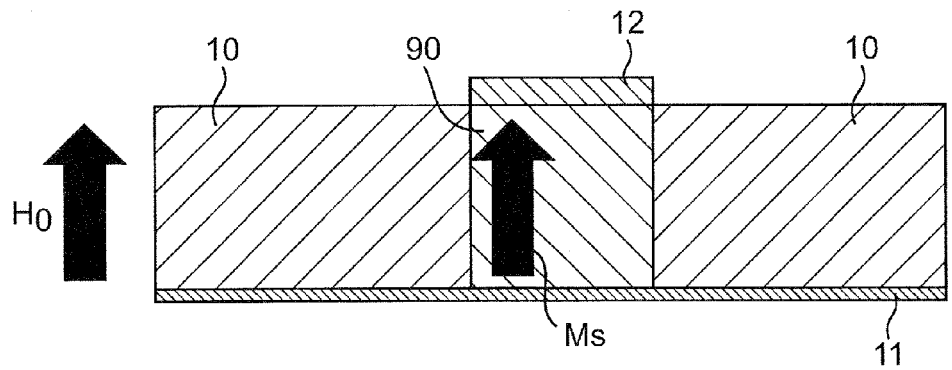
FIG. 37 is a longitudinal sectional view across the line A-A' of FIG. 36.

10. Concrete Configuration Example of Zeroth-order Resonator according to Present Embodiment with use of Nonreciprocal Composite Right/Left-Handed Transmission Line Next, a concrete configuration example of the zeroth-order resonator of FIG. 7 with use of the nonreciprocal composite right/left-handed transmission line is described. FIG. 36 is a perspective view showing a concrete configuration of the zeroth-order resonator of FIG. 7 when a composite right/left-handed transmission line 100 is provided in which the number N of the unit cells constituting the zeroth-order resonator is ten and which is nonreciprocal. FIG. 37 is a longitudinal sectional view across the line A-A' of FIG. 36. In the example shown in FIG. 36, the lengths of the reflective impedance elements 151R and 152R are each set to $\lambda_g/4$.

The zeroth-order resonator of FIGS. 36 and 37 has such a structure that ferrite square rods 90 having a vertical magnetization $M_s$ induced by spontaneous magnetization or an external magnetic field $H_0$ are inserted just under the microstrip line of the composite right/left-handed transmission line 100, as compared with the zeroth-order resonator with use of the reciprocal composite right/left-handed transmission line 100 of FIG. 11. When the ferrite square rods 90 are soft magnetic material or the external magnetic field $H_0$ is zero, the zeroth-order resonator (traveling-wave resonator) of FIGS. 36 and 37 operate similarly to the zeroth-order resonator with use of the reciprocal composite right/left-handed transmission line 100 of FIG. 11, and the radiation direction is directed toward the broadside direction. In addition, when the reactance of the reflective impedance elements 151R and 152R are continuously changed from zero to +∞ so as to satisfy the aforementioned Expression (5), the linear polarization direction rotates regardless of the radiation direction. Further, the phase distribution on the zeroth-order resonator has an inclination determined by the magnitude of the nonreciprocity of the line along the composite right/left-handed transmission line 100. In this case, the magnitude of the nonreciprocity of the composite right/left-handed transmission line 100 can be changed by changing the direction and the magnitude of the externally applied magnetic field $H_0$.

Figure 38A:
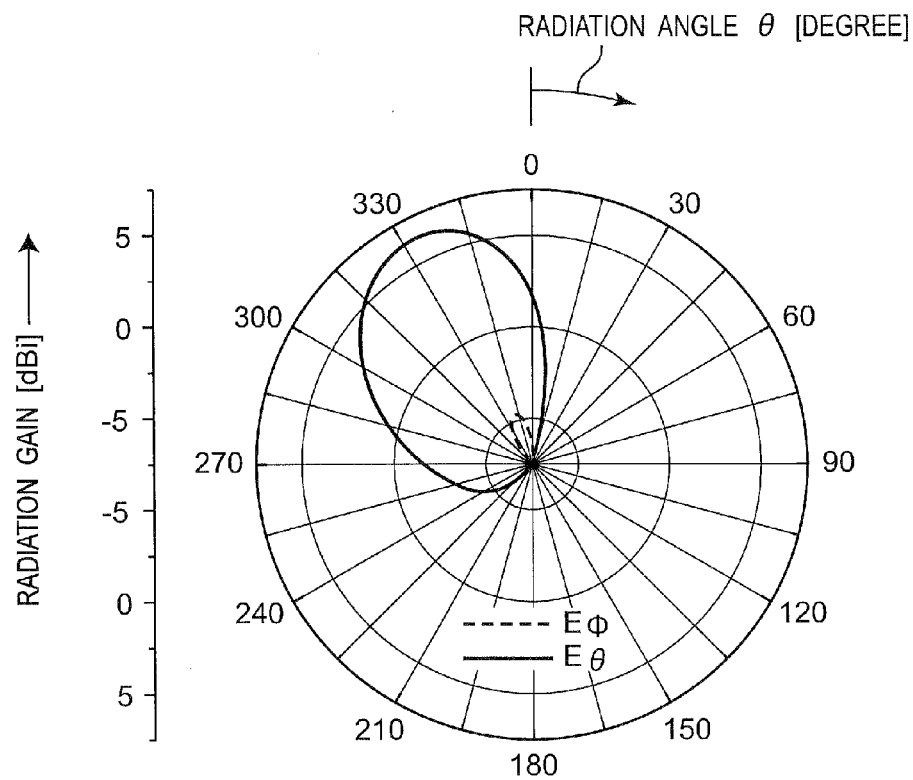
FIG. 38A is a chart showing a radiation pattern (simulation calculation value) on the x-z plane of the zeroth-order resonator of FIG. 36 when the reactance B of the reflective impedance element 151R is set to zero, and external magnetization $H_0$ is applied with use of an nonreciprocal balanced composite right/left-handed transmission line 100.
Figure 38B:
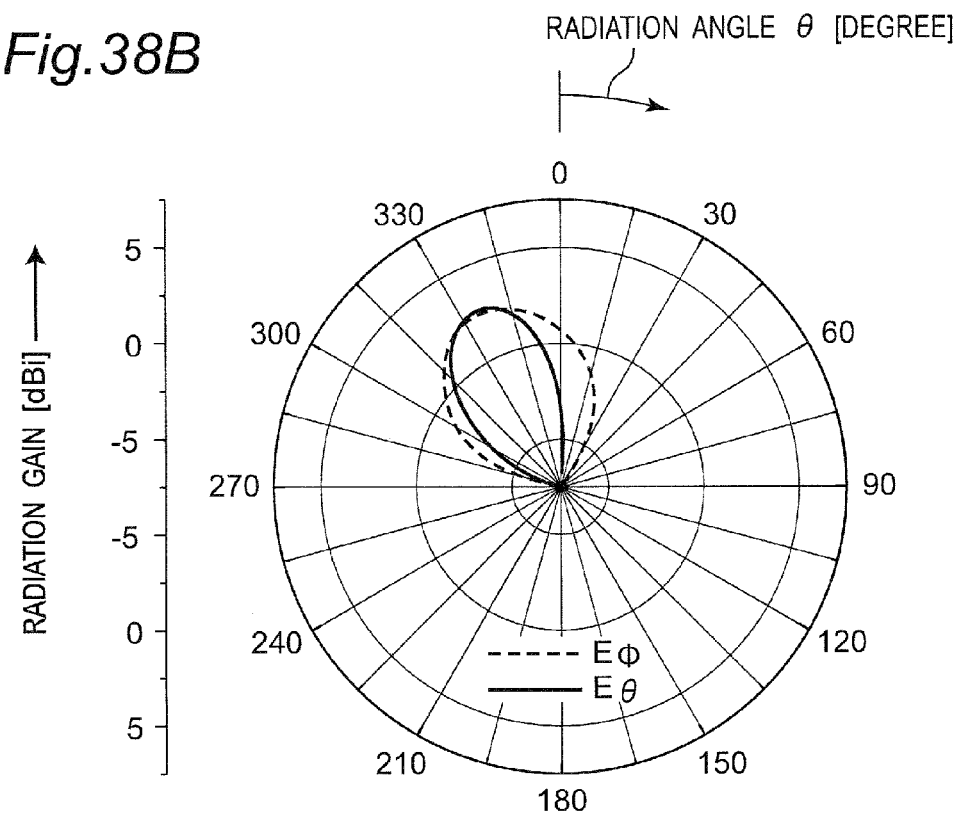
FIG. 38B is a chart showing a radiation pattern (simulation calculation value) on the x-z plane of the zeroth-order resonator of FIG. 36 when the reactance B of the reflective impedance element 151R is set to 50 [Ω], and the external magnetization $H_0$ is applied with use of the nonreciprocal balanced composite right/left-handed transmission line 100.
Figure 38C:
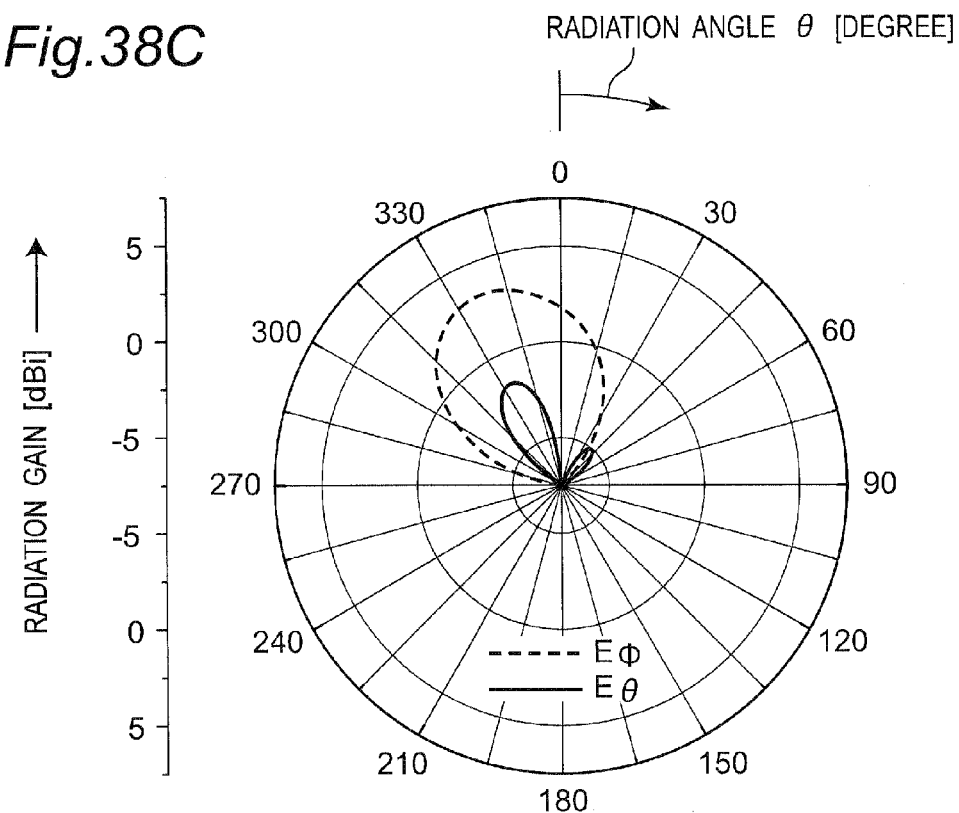
FIG. 38C is a chart showing a radiation pattern (simulation calculation value) on the x-z plane of the zeroth-order resonator of FIG. 36 when the reactance B of the reflective impedance element 151R is set to +∞, and the external magnetization $H_0$ is applied with use of the nonreciprocal balanced composite right/left-handed transmission line 100.

In addition, FIGS. 38A, 38B and 38C are charts showing a radiation patterns (simulation calculation values) on the x-z plane of the zeroth-order resonator of FIG. 36 when the reactance B of the reflective impedance element 151R is set to zero, 50 [Ω] and +∞, respectively, and the external magnetization $H_0$ is applied with use of the nonreciprocal balanced composite right/left-handed transmission line 100. Concretely speaking, in FIG. 38A, the line length $l_{r1}$ of a finite length open terminal line that constitutes the reflective impedance element 151R is set to $\lambda_g/4$, and the line length $l_{r2}$ of a finite length open terminal line that constitutes the reflective impedance element 152R is set to $\lambda_g/4$. In addition, in FIG. 38B, the line length $l_{r1}$ is set to $\lambda_g/20$, and the line length $l_{r2}$ is set to $\lambda_g/20$. Further, in FIG. 38C, the line length $l_{r1}$ is set to $\lambda_g/2$, and the line length $l_{r2}$ is set to zero.

Referring to FIGS. 38A, 38B and 38C, it can be understood that, since the radiation beam from the zeroth-order resonator of the present implemental example of the traveling-wave resonator is directed substantially in a direction of −30 degrees, the beam radiation direction is substantially not influenced by the terminal condition. On the other hand, since the series resonance of the series branch of the composite right/left-handed transmission line 100 is dominant in FIG. 38A in the case of both the short-circuited terminals, the θ-direction component $E_\theta$ of the electric field is dominant as main polarization. In addition, since the parallel resonance of the shunt branch is dominant in FIG. 38C in the case of both the open terminals, the φ-direction component $E_\phi$ of the electric field is dominant as main polarization. Referring to FIG. 38B, the θ-direction component $E_\theta$ and the φ-direction component $E_\phi$ of the electric field are almost equivalent, and the main polarization direction is directed obliquely to a direction of 45 degrees with respect to the main polarization direction in the cases of FIGS. 38A and 38C. By thus controlling the reflection conditions at both the terminals of the traveling-wave resonator including the nonreciprocal composite right/left-handed transmission line 100, the linear polarization direction can be continuously controlled to be independent of the scanning of the radiation beam.

Figure 39:
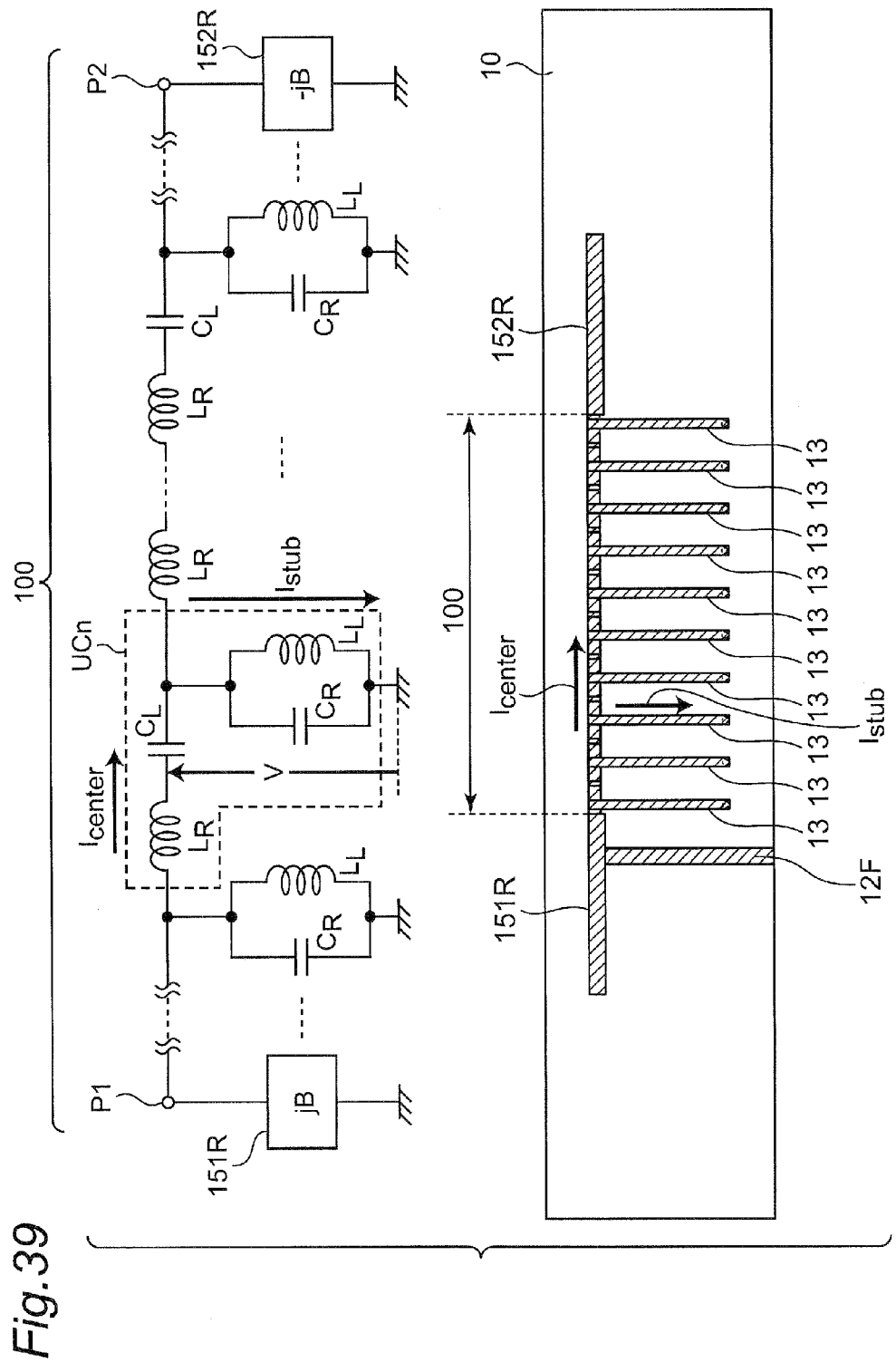
FIG. 39 is a circuit diagram and a plan view (note that the number N of the unit cells constituting the zeroth-order resonator is ten) showing a current $I_{center}$ that flows in the series branch of the zeroth-order resonator and a current $I_{stub}$ that flows in the parallel branch.

11. Principle and Measurement Results of Rotation of Linear Polarization Direction of Main Polarization Next, the principle and the measurement results of the rotation in the main polarization direction of the microwave signal that is transmitted and received by the zeroth-order resonator of FIG. 7 are described. FIG. 39 is a circuit diagram and a plan view (note that the number N of the unit cells constituting the zeroth-order resonator is ten) showing a current $I_{center}$ that flows in the series branch of the zeroth-order resonator of FIG. 7 and a current $I_{stub}$ that flows in the parallel branch. Referring to FIG. 39, the following expressions hold:

$$\frac{V}{I_{center}} = -jB \quad \text{[Mathematical Number 32]}$$

$$\frac{V}{I_{stub}} = jZ_{stub}\tan(\beta l_{stub}) \quad \text{[Mathematical Number 33]}$$

where V is the cross-terminal voltage of the parallel branch, $Z_{stub}$ is the impedance of the stub conductor 13, and β is the phase constant of the transmission line in the stub conductor 13. Therefore, when the reactance B has a positive value, then the current $I_{center}$ and a current $-I_{stub}$ are in phase with each other. Further, when the reactance B changes, a current distribution on the composite right/left-handed transmission line 100 changes, and a ratio between the θ-direction component $E_\theta$ and the φ-direction component $E_\phi$ of the electric field of radiation waves changes with the in-phase state maintained (i.e., with the linear polarization state maintained). Therefore, the main polarization direction of radiation waves rotates around the normal line (Z axis of FIG. 14) of the substrate 10.

Figure 40:
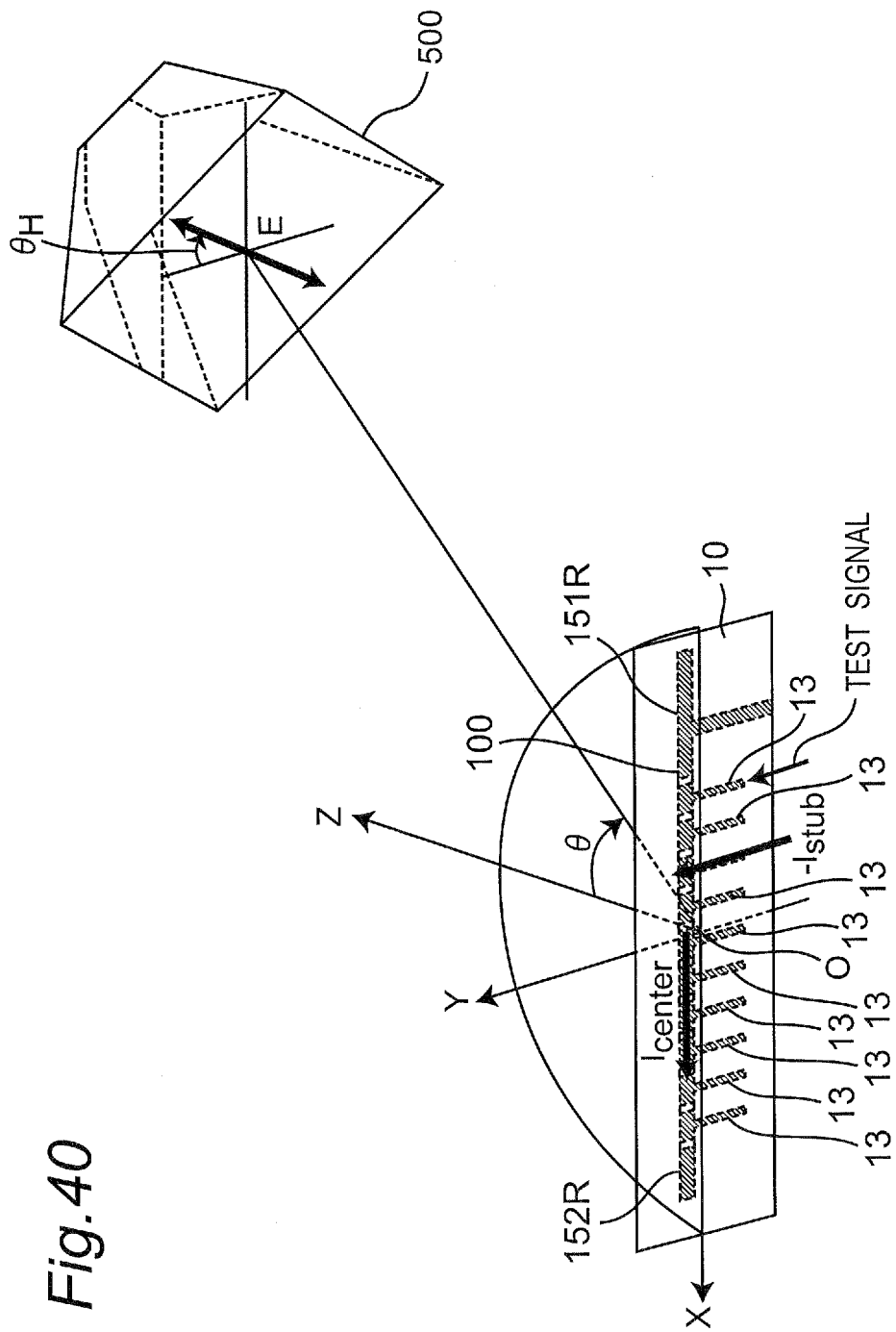
FIG. 40 is a perspective view showing a configuration of an experimental apparatus for receiving radio waves radiated from the zeroth-order resonator of FIG. 11 by using a horn antenna 500.

In order to confirm the aforementioned rotation of the main polarization direction, the radiation pattern of the zeroth-order resonator of FIG. 11 was measured. FIG. 40 is a perspective view showing a configuration of an experimental apparatus for receiving radio waves radiated from the zeroth-order resonator of FIG. 11 by using a horn antenna 500. An XYZ coordinate system is defined as shown in FIG. 40. In the experimental apparatus of FIG. 40, the zeroth-order resonator was placed on a turntable so that the zeroth-order resonator rotates around the Y axis. In this case, the rotation angle of the turntable corresponds to the radiation angle θ. Further, the reactance B was set to 50 [Ω], a predetermined test signal was outputted to the zeroth-order resonator, and the signal was radiated from the zeroth-order resonator. In addition, in FIG. 40, the horn antenna 500 was installed in a predetermined position at a distance of 3 m from the origin O of the XY plane, and radio waves were received from the zeroth-order resonator. In this case, the main polarization direction $\theta_H$ (angle from the short-circuit stub, i.e., direction parallel to Y axis) of the horn antenna 500 was set to 45 degrees or −45 degrees.

As described with reference to FIG. 22B, when the reactance B is set to 50 [Ω], the series resonance of the series branch and the parallel resonance of the parallel branch coexist on almost same degree, and the magnetic field intensity of the strip conductor 12 at the center and the magnetic field intensity of the short-circuit stub conductor 13 are on almost same degree. Therefore, the θ-direction component $E_\theta$ and the φ-direction component $E_\phi$ of the electric field of radiation waves are on almost same degree. Therefore, the main polarization direction is expected to be angled at −45 degrees.

Figure 41:
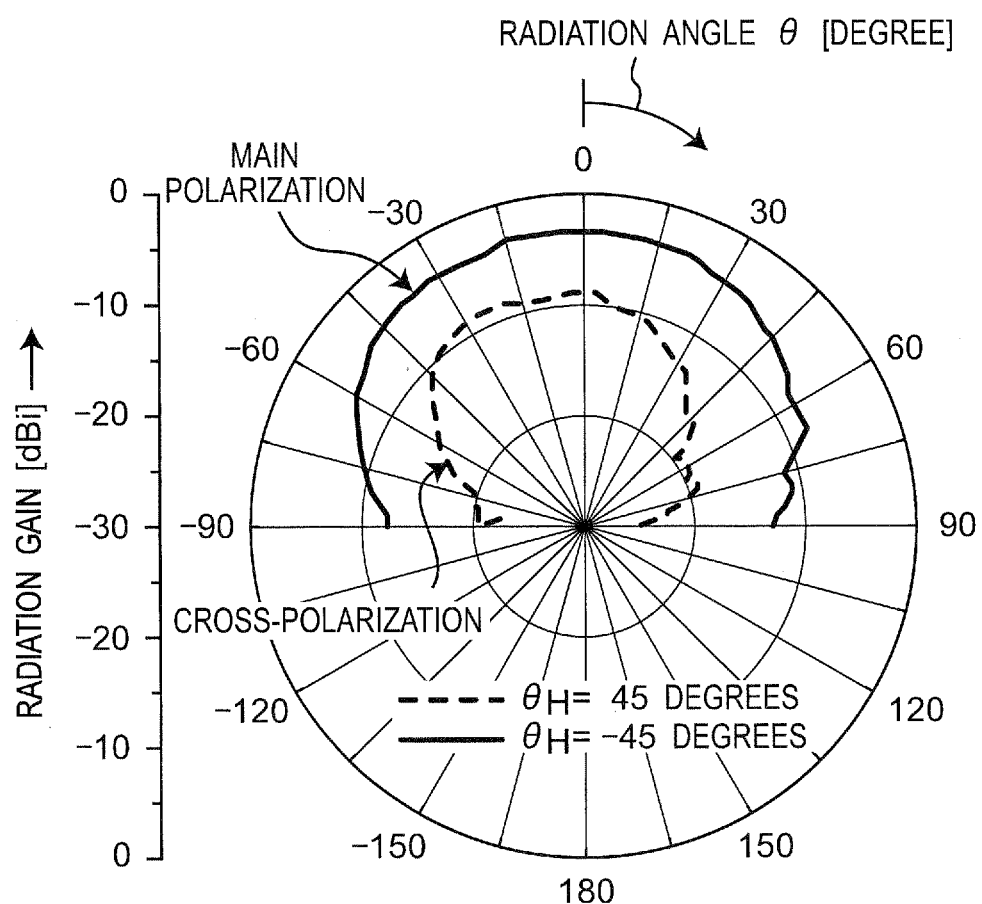
FIG. 41 is a chart showing an experimental measurement value of a radiation pattern when the main polarization direction $\theta_H$ of the horn antenna 500 of FIG. 40 is set to 45 degrees and the experimental measurement value of a radiation pattern in the case where the main polarization direction $\theta_H$ is set to −45 degrees.

FIG. 41 is a chart showing an experimental measurement value of the radiation pattern when the main polarization direction $\theta_H$ of the horn antenna 500 of FIG. 40 is set to 45 degrees and the experimental measurement value of the radiation pattern in the case where the main polarization direction $\theta_H$ is set to −45 degrees. As shown in FIG. 41, the received power when the main polarization direction $\theta_H$ of the horn antenna 500 is angled at −45 degrees is about 5 dB greater than the received power in the case where the main polarization direction $\theta_H$ is angled at 45 degrees. This means that the main polarization direction of the zeroth-order resonator on the transmitting side is almost parallel to the main polarization direction $\theta_H$=−45 degrees of the horn antenna 500. That is, it could be confirmed by experiments that the main polarization direction could be rotated merely by changing the cross-terminal condition (reactance B in concrete) of the composite right/left-handed transmission line 100.

Figure 42:
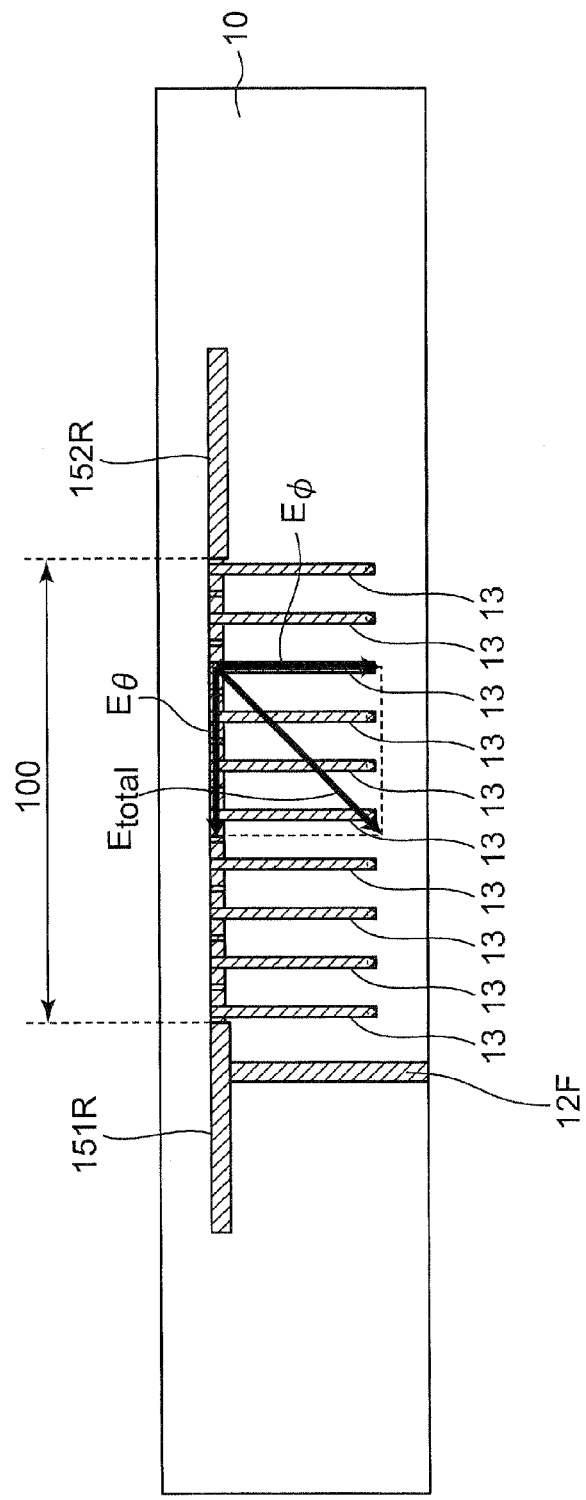
FIG. 42 is a plan view showing an electric field $E_{total}$ when the reactance B of the reflective impedance element 151R is set to a value between zero and +∞ in the zeroth-order resonator of FIG. 11.

FIG. 42 is a plan view showing an electric field $E_{total}$ when the reactance B of the reflective impedance element 151R is set to a value between zero and +∞ in the zeroth-order resonator of FIG. 11. As shown in FIG. 42, when the reactance B is set to a value between zero and +∞, the direction of the electric field $E_{total}$ is directed between the direction parallel to the series branch and the direction parallel to the parallel branch in accordance with the ratio between the θ-direction component $E_\theta$ and the φ-direction component $E_\phi$ of the electric field of the radiation waves. Therefore, when the zeroth-order resonator of the present invention is used for the antenna apparatus as shown in, for example, FIGS. 28 to 30, it is proper to monitor the received power while changing the cross-terminal condition (reactance B) of the zeroth-order resonator, and to select the cross-terminal condition when the received power is maximized. When the received power is maximized, the main polarization direction of the antenna apparatus substantially coincides with the polarization direction of the incoming waves.

12. Conclusion

As described above, according to a microwave resonator of the present invention, the reflective impedance element 151R connected to the port P1 of the composite right/left-handed transmission line 100, and the reflective impedance element 152R connected to the port P2 are provided. The imaginary part of a first impedance when the reflective impedance element 151R is seen from the port P1 and the imaginary part of a second impedance in the case where the reflective impedance element 152R is seen from the port P2 have signs different from each other. Further, the magnitude of the imaginary part of the first impedance and the magnitude of the imaginary part of the second impedance are substantially equal to each other. Preferably, the first impedance should be a pure imaginary number (jB), and the second impedance should be a pure imaginary number (−jB) conjugate with the first impedance. Therefore, according to the microwave resonator of the present invention, a novel zeroth-order resonator that can achieve the double resonance state in which both the states coexist can be provided in addition to the series resonance state and the parallel resonance state.

In particular, by continuously changing the reactance B of the reflective impedance element 151R, the ratio between the series resonance energy and the parallel resonance energy can be continuously changed from the state in which the series resonance of the series branch is dominant to the state in which the parallel resonance of the parallel branch is dominant without changing the resonance frequency.

In addition, when the unbalanced composite right/left-handed transmission line 100 is employed in which the series resonance frequency of the series branch and the parallel resonance frequency of the parallel branch are mutually different, there is the forbidden band in which the mode of propagation along the line does not exist in the band interposed between the two different frequencies. In this case, a zeroth-order resonator in which the resonance frequency does not depend on the line length can continuously be achieved although the electromagnetic field distribution on the line exhibits an exponential shape along the line. In this case, by continuously changing the reactance B of the reflective impedance element 151R, the resonance frequency can be continuously changed between the series resonance frequency and the parallel resonance frequency.

Further, according to the antenna apparatus with use of the microwave resonator of the present invention, by changing the reactance B of the reflective impedance element 151R, the polarization direction of the microwave signal radiated from or the microwave signal received by the antenna apparatus can be changed. According to the antenna apparatus of the present invention, a planar antenna apparatus that is compacter than the prior art can be actualized. Therefore, the antenna apparatus of the present invention is useful for portable equipment such as portable telephones.

Still further, according to the band-pass filter apparatus with use of the microwave resonator of the present invention, the unbalanced composite right/left-handed transmission line 100 is employed in which the series resonance frequency of the series branch and the parallel resonance frequency of the parallel branch are mutually different, and therefore, an arbitrary band-pass frequency between the series resonance frequency and the parallel resonance frequency can be achieved.

In addition, according to the band-stop filter apparatus with use of the microwave resonator of the present invention, the unbalanced composite right/left-handed transmission line 100 is employed in which the series resonance frequency of the series branch and the parallel resonance frequency of the parallel branch are mutually different, and therefore, an arbitrary band-stop frequency between the series resonance frequency and the parallel resonance frequency can be achieved.

Further, the double resonance in the zeroth-order resonator of the present invention does not depend on the number N of unit cells $UC_1, UC_2, \ldots, UC_N$. Therefore, the main polarization direction can be easily changed merely by adjusting the reactance B even in a larger-scale antenna apparatus for achieving a greater gain.

INDUSTRIAL APPLICABILITY

As mentioned above, according to the microwave resonator of the present invention, the first reflective impedance circuit that is connected to the first port of the microwave transmission line and operates in a manner that the impedance when the first reflective impedance circuit is seen from the first port becomes the first impedance at the predetermined operating frequency, and the second reflective impedance circuit that is connected to the second port of the microwave transmission line and operates in a manner that the impedance when the second reflective impedance circuit is seen from the second port becomes the second impedance at the operating frequency are provided. The imaginary part of the first impedance and imaginary part of the second impedance have signs different from each other, and the magnitude of the imaginary part of the first impedance and the magnitude of the imaginary part of the second impedance are substantially equal to each other. Therefore, the zeroth-order resonator in the double resonance state in which the series resonance and the parallel resonance coexist between the state in which only the series resonance of the series branch of the unit cells that constitute the microwave transmission line is dominant and the state in which only the parallel resonance of the parallel branch is dominant can be actualized.

In addition, according to the antenna apparatus of the present invention, the microwave resonator of the present invention and the feeding circuit that is connected to the first reflective impedance circuit or the second reflective impedance circuit, and outputs the microwave signal received by the microwave resonator are provided. Therefore, the polarization direction of the microwave signal to be received can be set in an arbitrary direction between the direction parallel to the series branch and the direction parallel to the parallel branch of the unit cells that constitute the microwave transmission line.

Further, according to an antenna apparatus of the present invention, the first reflective impedance circuit has the first impedance changing means that changes the first impedance, and the second reflective impedance circuit has the second impedance changing means that changes the second impedance. The antenna apparatus further includes the control means for controlling the first and second impedance changing means to change the polarization direction of the microwave signal received by the microwave resonator. Therefore, the polarization direction can be changed so that, for example, the received power of the received microwave signal becomes maximized.

Still further, the band-pass filter apparatus of the present invention includes the microwave resonator of the present invention. The first reflective impedance circuit has the first impedance changing means that changes the first impedance, and the second reflective impedance circuit has the second impedance changing means that changes the second impedance. The band-pass filter apparatus further includes the control means for controlling the first and second impedance changing means to change the band-pass frequency of the band-pass filter apparatus. Therefore, the band-pass filter apparatus including an arbitrary band-pass filter frequency between the series resonance frequency and the parallel resonance frequency can be actualized.

In addition, the band-stop filter apparatus of the present invention has the microwave resonator of the present invention. The first reflective impedance circuit has the first impedance changing means that changes the first impedance, and the second reflective impedance circuit has the second impedance changing means that changes the second impedance. The band-stop filter apparatus further includes the control means for controlling the first and second impedance changing means to change the band-stop frequency of the band-stop filter apparatus. Therefore, the band-stop filter apparatus including an arbitrary band-stop filter frequency between the series resonance frequency and the parallel resonance frequency can be actualized.

The present invention is not limited to the transmitting and receiving (transceiving) antenna for information communications in the microwave range but allowed to be used as, for example, a wireless power transmission antenna.

REFERENCE SIGNS LIST

10: dielectric substrate
11: grounding conductor
12, 12P1, 12P1a, 12P1b, 12P2: strip conductor
12A: micro-strip line
12F: feeding line conductor
12S: via-conductor
13: short-circuit stub conductor
14: capacitor
15: directional coupler
15a, 15b: micro-strip line
21: varactor diode
22, 23, 24: inductor
31: varactor diode
41: feeding line
41a, 41b, 51a, 51b-1, 51b-3, 51b-4, 52-2, 52-3, 52-4: micro-strip line
61: transmission line part
90: ferrite square rod
100: composite right/left-handed transmission line (CRLHTL)
100F, 100Fa, 100Fb: transmission line
200: received power detector
300, 300A, 300B, 300C: controller
151, 152: terminal load
151R, 152R: reflective impedance element
151RA, 151RB, 151RC, 152RA, 152RB, 152RC: reflective impedance circuit
153, 154: phase shifter
200: received power detector
300, 300A: controller
400: wireless receiver
P1, P2, P11, P12: port
SW1, SW2, SW3: switch
$UC_1, UC_2, \ldots, UC_N$: unit cell

The invention claimed is:

1. A microwave resonator including a microwave transmission line configured by cascade-connecting at least one unit cell between a first port and a second port, wherein the unit cell includes a series branch circuit equivalently including a capacitive element, a parallel branch circuit equivalently including an inductive element, and at least one transmission line part,
wherein each unit cell of the microwave transmission line has such a circuit configuration that the microwave transmission line has a predetermined phase constant in a dispersion curve that indicates a relation between an operating frequency of a microwave signal inputted to the microwave transmission line and a phase constant of the microwave transmission line,
wherein the microwave transmission line comprises the first port and the second port,
wherein the microwave resonator comprises:
a first reflective impedance circuit connected to the first port of the microwave transmission line, the first reflective impedance circuit configured to operate so that an impedance when the first reflective impedance circuit is seen from the first port becomes a first impedance at a predetermined operating frequency,
a second reflective impedance circuit connected to the second port of the microwave transmission line, the second reflective impedance circuit configured to operate so that an impedance when the second reflective impedance circuit is seen from the second port becomes a second impedance at the predetermined operating frequency, and
wherein an imaginary part of the first impedance and an imaginary part of the second impedance have signs different from each other, and a magnitude of the imaginary part of the first impedance and a magnitude of the imaginary part of the second impedance are substantially equal to each other.

2. The microwave resonator as claimed in claim 1, wherein the first impedance is a predetermined pure imaginary number, and
wherein the second impedance is a pure imaginary number conjugate with the first impedance.

3. The microwave resonator as claimed in claim 1, wherein in the microwave transmission line, the capacitive element is a microwave element whose effective permeability in an electromagnetic wave mode of propagation in the transmission line is negative, and the inductive element is a microwave element whose effective permittivity in the electromagnetic wave mode of propagation in the transmission line is negative.

4. The microwave resonator as claimed in claim 1, wherein the microwave transmission line comprises:
a dielectric substrate having a grounding conductor on its reverse face;
a micro-strip line formed on the dielectric substrate;
a plurality of capacitors configured to connect mutually adjacent line parts obtained by separating the micro-strip line into a plurality of the line parts; and
a plurality of inductive stub conductors configured to connect the line parts to the grounding conductor.

5. An antenna apparatus comprising a microwave resonator,
wherein the microwave resonator includes a microwave transmission line configured by cascade-connecting at least one unit cell between a first port and a second port,
wherein the unit cell includes a series branch circuit equivalently including a capacitive element, a parallel branch circuit equivalently including an inductive element, and at least one transmission line part,
wherein each unit cell of the microwave transmission line has such a circuit configuration that the microwave transmission line has a predetermined phase constant in a dispersion curve that indicates a relation between an operating frequency of a microwave signal inputted to the microwave transmission line and a phase constant of the microwave transmission line, wherein the microwave transmission line comprises the first port and the second port, wherein the microwave resonator comprises:

a first reflective impedance circuit connected to the first port of the microwave transmission line, the first reflective impedance circuit configured to operate so that an impedance when the first reflective impedance circuit is seen from the first port becomes a first impedance at a predetermined operating frequency, a second reflective impedance circuit connected to the second port of the microwave transmission line, the second reflective impedance circuit configured to operate so that an impedance when the second reflective impedance circuit is seen from the second port becomes a second impedance at the predetermined operating frequency, wherein an imaginary part of the first impedance and an imaginary part of the second impedance have signs different from each other, and a magnitude of the imaginary part of the first impedance and a magnitude of the imaginary part of the second impedance are substantially equal to each other, and wherein the antenna apparatus further comprises a feeding circuit connected to one of the first reflective impedance circuit and the second reflective impedance circuit, the feeding circuit configured to output a microwave signal received by the microwave resonator.

6. The antenna apparatus as claimed in claim 5, wherein the first reflective impedance circuit comprises a first impedance changing circuit that changes the first impedance, wherein the second reflective impedance circuit comprises a second impedance changing circuit that changes the second impedance, and wherein the antenna apparatus further comprises a controller configured to control each of the first and second impedance changing circuits to change a polarization direction of the microwave signal received by the microwave resonator.

7. The antenna apparatus as claimed in claim 6, wherein the antenna apparatus further comprises a received power detector configured to detect a received power of the microwave signal outputted from the feeding circuit, and wherein the controller changes the polarization direction of the microwave signal received by the microwave resonator so that the received power is maximized on the basis of the detected received power.

8. The antenna apparatus as claimed in claim 5, wherein the first and second impedances discretely change.

9. The antenna apparatus as claimed in claim 5, wherein the first and second impedances continuously change.

10. The antenna apparatus as claimed in claim 9, wherein each of the first and second reflective impedance circuits comprises a varactor diode and an inductor.

11. The antenna apparatus as claimed in claim 9, wherein each of the first and second reflective impedance circuits comprises a phase shifter and a transmission line.

12. A band-pass filter apparatus comprising a microwave resonator, wherein the microwave resonator includes a microwave transmission line configured by cascade-connecting at least one unit cell between a first port and a second port, wherein the unit cell includes a series branch circuit equivalently including a capacitive element, a parallel branch circuit equivalently including an inductive element, and at least one transmission line part, wherein each unit cell of the microwave transmission line has such a circuit configuration that the microwave transmission line has a predetermined phase constant in a dispersion curve that indicates a relation between an operating frequency of a microwave signal inputted to the microwave transmission line and a phase constant of the microwave transmission line, wherein the microwave transmission line comprises the first port and the second port, wherein the microwave resonator comprises:

a first reflective impedance circuit connected to the first port of the microwave transmission line, the first reflective impedance circuit configured to operate so that an impedance when the first reflective impedance circuit is seen from the first port becomes a first impedance at a predetermined operating frequency, a second reflective impedance circuit connected to the second port of the microwave transmission line, the second reflective impedance circuit configured to operate so that an impedance when the second reflective impedance circuit is seen from the second port becomes a second impedance at the predetermined operating frequency, wherein an imaginary part of the first impedance and an imaginary part of the second impedance have signs different from each other, and a magnitude of the imaginary part of the first impedance and a magnitude of the imaginary part of the second impedance are substantially equal to each other, wherein the microwave transmission line is an unbalanced microwave transmission line, wherein the first reflective impedance circuit comprises a first impedance changing circuit that changes the first impedance, wherein the second reflective impedance circuit comprises a second impedance changing circuit that changes the second impedance, and wherein the band-pass filter apparatus further comprises a controller configured to control each of the first and second impedance changing circuits to change a band-pass frequency of the band-pass filter apparatus.

13. A band-stop filter apparatus comprising a microwave resonator, wherein the microwave resonator includes a microwave transmission line configured by cascade-connecting at least one unit cell between a first port and a second port, wherein the unit cell includes a series branch circuit equivalently including a capacitive element, a parallel branch circuit equivalently including an inductive element, and at least one transmission line part, wherein each unit cell of the microwave transmission line has such a circuit configuration that the microwave transmission line has a predetermined phase constant in a dispersion curve that indicates a relation between an operating frequency of a microwave signal inputted to the microwave transmission line and a phase constant of the microwave transmission line, wherein the microwave transmission line comprises the first port and the second port, wherein the microwave resonator comprises:
a first reflective impedance circuit connected to the first port of the microwave transmission line, the first reflective impedance circuit configured to operate so that an impedance when the first reflective impedance circuit is seen from the first port becomes a first impedance at a predetermined operating frequency,
a second reflective impedance circuit connected to the second port of the microwave transmission line, the second reflective impedance circuit configured to operate so that an impedance when the second reflective impedance circuit is seen from the second port becomes a second impedance at the predetermined operating frequency,
wherein an imaginary part of the first impedance and an imaginary part of the second impedance have signs different from each other, and a magnitude of the imaginary part of the first impedance and a magnitude of the imaginary part of the second impedance are substantially equal to each other,
wherein the microwave transmission line is an unbalanced microwave transmission line,
wherein the first reflective impedance circuit comprises a first impedance changing circuit that changes the first impedance,
wherein the second reflective impedance circuit comprises a second impedance changing circuit that changes the second impedance, and
wherein the band-stop filter apparatus further comprises a controller configured to control each of the first and second impedance changing circuits to change a band-stop frequency of the band-stop filter apparatus.

* * * * *